(12) United States Patent
Hsu

(10) Patent No.: US 11,232,835 B2
(45) Date of Patent: Jan. 25, 2022

(54) METHODS AND APPARATUS FOR READING NAND FLASH MEMORY

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 8 days.

(21) Appl. No.: 16/928,996

(22) Filed: Jul. 14, 2020

(65) Prior Publication Data

US 2021/0012834 A1    Jan. 14, 2021

Related U.S. Application Data

(60) Provisional application No. 62/873,975, filed on Jul. 14, 2019, provisional application No. 62/874,476, filed on Jul. 15, 2019, provisional application No. 62/875,302, filed on Jul. 17, 2019, provisional application No. 62/878,333, filed on Jul. 24, 2019, (Continued)

(51) Int. Cl.
| | |
|---|---|
| *G11C 11/34* | (2006.01) |
| *G11C 11/56* | (2006.01) |
| *G11C 16/04* | (2006.01) |
| *G11C 16/34* | (2006.01) |
| *G11C 16/24* | (2006.01) |

(Continued)

(52) U.S. Cl.
CPC ...... *G11C 11/5642* (2013.01); *G11C 11/5671* (2013.01); *G11C 16/0483* (2013.01); *G11C 16/08* (2013.01); *G11C 16/24* (2013.01); *G11C 16/26* (2013.01); *G11C 16/3459* (2013.01)

(58) Field of Classification Search
CPC ..... G11C 16/08; G11C 11/5642; G11C 16/24; G11C 16/26; G11C 11/5671; G11C 16/0483; G11C 2211/5642
See application file for complete search history.

(56) References Cited

U.S. PATENT DOCUMENTS

| | | |
|---|---|---|
| 6,307,783 B1 | 10/2001 | Parker |
| 8,120,953 B2 | 2/2012 | Tanka |

(Continued)

OTHER PUBLICATIONS

International Search Report, dated Oct. 6, 2020, for corresponding International Application No. PCT/US2020/042019 (2 pages).

(Continued)

*Primary Examiner* — Uyen Smet
(74) *Attorney, Agent, or Firm* — Intellectual Property Law Group LLP

(57) ABSTRACT

Methods and apparatus for reading NAND flash memory are disclosed. In an embodiment, a method is provided for reading a NAND flash memory that includes strings of memory cells that are coupled to bit lines and word lines. The method includes precharging a plurality of bit lines to a precharge voltage level, and applying a sequence of word line voltages to a selected word line. The method also includes initiating discharge of one or more bit lines associated with one or more cells, respectively. The method also includes controlling discharging current of discharging bit lines to achieve identical discharge rates, waiting for a discharging time period for each bit line that is discharging, and latching bit line data at an end of each discharge time period.

20 Claims, 44 Drawing Sheets

Related U.S. Application Data provisional application No. 62/884,657, filed on Aug. 8, 2019, provisional application No. 62/885,238, filed on Aug. 10, 2019, provisional application No. 63/015,539, filed on Apr. 25, 2020, provisional application No. 63/026,047, filed on May 16, 2020.

(51) Int. Cl.
    *G11C 16/26*     (2006.01)
    *G11C 16/08*     (2006.01)

(56) References Cited

U.S. PATENT DOCUMENTS

| | | | |
|---|---|---|---|
| 8,792,281 B2 | 7/2014 | Baum et al. | |
| 9,875,804 B2 | 1/2018 | Tokiwa | |
| 2018/0277218 A1* | 9/2018 | Shimizu | G11C 16/24 |
| 2019/0080747 A1* | 3/2019 | Sakurada | G11C 11/5642 |
| 2019/0392905 A1* | 12/2019 | Hioka | H01L 27/11582 |

OTHER PUBLICATIONS

Written Opinion of the International Searching Authority, dated Oct. 6, 2020, for corresponding International Application No. PCT/US2020/042019 (5 pages).

\* cited by examiner

N bits/cell

|  | Conventional | Novel Embodiments |
|---|---|---|
| Read Latency | 1 | $1/N$ |
| Read Throughput | 1 | $N$ |
| Program-verify Latency | 1 | $1/(2^N-1)$ |
| Program-verify Throughput | 1 | $2^N-1$ |

FIG. 3C

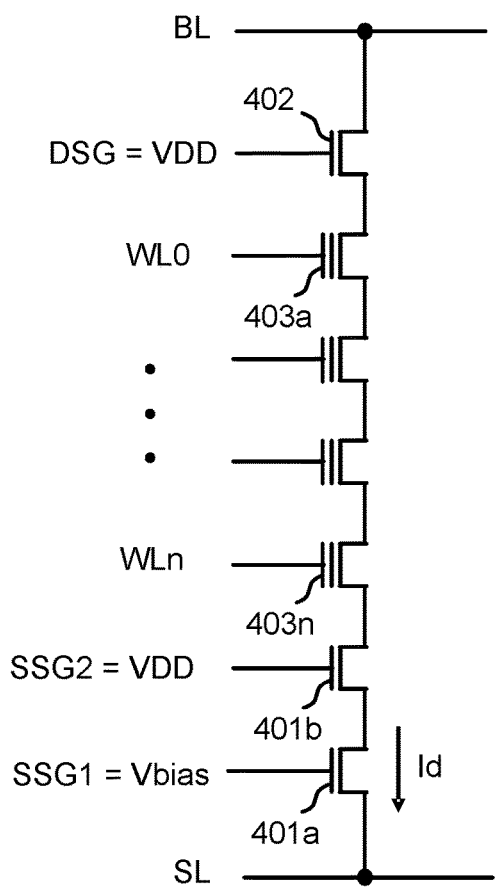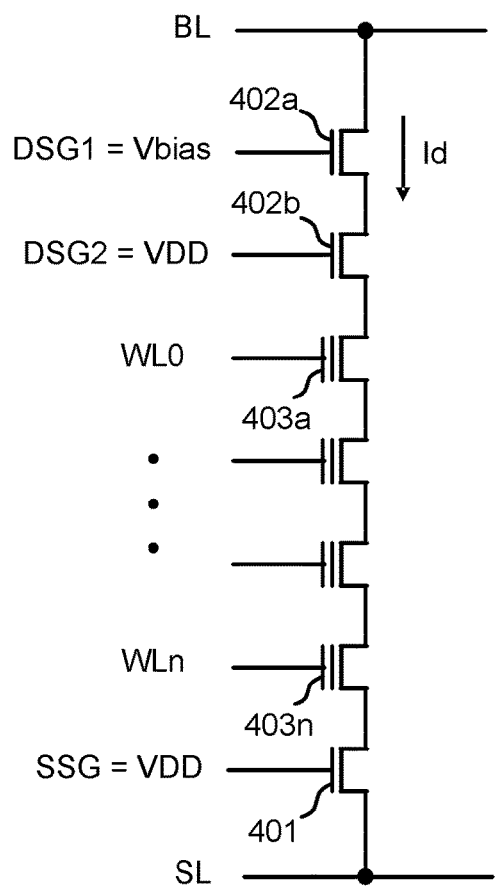
FIG. 4C                    FIG. 4D

METHODS AND APPARATUS FOR READING NAND FLASH MEMORY

CROSS-REFERENCE TO RELATED APPLICATIONS

This application claims the benefit under 35 U.S.C. § 119 of U.S. Provisional Patent Application No. 62/873,975, filed on Jul. 14, 2019, and entitled "MLC/TLC READ OPERATION FOR NAND FLASH MEMORY," and U.S. Provisional Patent Application No. 62/874,476, filed on Jul. 15, 2019, and entitled "MLC/TLC/QLC READ OPERATION FOR NAND FLASH MEMORY," and U.S. Provisional Patent Application No. 62/875,302, filed on Jul. 17, 2019, and entitled "MLC/TLC/QLC READ OPERATION FOR NAND FLASH MEMORY," and U.S. Provisional Patent Application No. 62/878,333, filed on Jul. 24, 2019, and entitled "MLC/TLC/QLC READ OPERATION FOR NAND FLASH MEMORY," and U.S. Provisional Patent Application No. 62/884,657, filed on Aug. 8, 2019, and entitled "MLC/TLC/QLC READ OPERATION FOR NAND FLASH MEMORY," and U.S. Provisional Patent Application No. 62/885,238, filed on Aug. 10, 2019, and entitled "MLC/TLC/QLC READ OPERATION FOR NAND FLASH MEMORY," and U.S. Provisional Patent Application No. 63/015,539, filed on Apr. 25, 2020, and entitled "MLC/TLC/QLC/PLC READ OPERATION FOR NAND FLASH MEMORY," and U.S. Provisional Patent Application No. 63/026,047, filed on May 16, 2020, and entitled "MLC/TLC/QLC/PLC READ OPERATION FOR NAND FLASH MEMORY," which are all incorporated by reference herein in their entireties.

FIELD OF THE INVENTION

The exemplary embodiments of the present invention relate generally to the field of semiconductors and integrated circuits, and more specifically to the design and operation of NAND flash memory.

BACKGROUND OF THE INVENTION

Memory devices are extensively used in industrial and consumer electronics. In many cases, the limitations of the memory affect the size, performance, or cost of an industrial or consumer device, such as a mobile phone.

One type of memory that is used in many devices is called a NAND flash memory. This type of memory is organized as one or more blocks and each block includes strings of memory cells that are accessed by word lines and bit lines. Data is programmed into the memory cells or read from the memory cells using page buffers that are coupled to the bit lines. In a typical NAND flash memory, the number of bit lines that can be program or read at one time is equal to the number of page buffers. This is referred to as 'page-programming' or 'page-reading'.

A NAND flash memory cell's data is determined by its threshold voltage (Vt). The cell's Vt is changed by using erase and program operations. When a cell is programmed to two Vt levels, it can store one bit of data per cell and is called a SLC (single-level cell). When a cell is programmed to four Vt levels, it can store two bits of data per cell and is called a MLC (multi-level cell). When a cell is programmed to eight Vt levels, it can store three bits of data per cell and is called a TLC (triple-level cell). When a cell is programmed to sixteen Vt levels, it can store four bits of data per cell and is called a QLC (quad-level cell).

When more Vt levels are used, more bits of data can be stored in one cell, thus the memory capacity is increased. However, the disadvantage is that the read time and program time are significantly increased in order to read and program the multiple Vt levels. For example, the typical read time for MLC is twice that of SLC, and the read time for TLC is three times that of SLC. Therefore, it would be desirable to reduce the read time for multiple level cells.

SUMMARY

In various exemplary embodiments, NAND flash memory architectures and methods are provided for use with two-dimensional (2D) or three-dimensional (3D) NAND memory arrays. Embodiments can also be applied to single-level cell (SLC), multi-level cell (MLC), triple-level cell (TLC), quad-level cell (QLC), or any number of bits per cell technology.

In an embodiment, a method is provided for reading a NAND flash memory that comprises strings of memory cells that are coupled to bit lines and word lines. The method comprises precharging a plurality of bit lines to a precharge voltage level, and applying a sequence of word line voltages to a selected word line. The method also includes initiating discharge of one or more bit lines associated with one or more cells, respectively. The method also includes controlling discharging current of discharging bit lines to achieve identical discharge rates, waiting for a discharging time period for each bit line that is discharging, and latching bit line data at an end of each discharge time period.

In an embodiment, a NAND flash memory is provided. The NAND flash memory comprises strings of memory cells that are coupled to bit lines and word lines. The memory also comprises a controller configured to perform operations of: precharging a plurality of the bit lines to a precharge voltage level; applying a sequence of word line voltages to a selected word line; initiating discharge of one or more bit lines associated with one or more cells, respectively, wherein discharge of a selected bit line is initiated when a cell associated with the bit line is turned on when a selected word line voltage is higher than a threshold voltage (Vt) of the associated cell; controlling discharging current of discharging bit lines to achieve identical discharge rates; waiting for a discharging time period for each bit line that is discharging; and latching bit line data at an end of each discharge time period.

In an embodiment, a method for reading a NAND flash memory is provided. The NAND flash memory comprises strings of memory cells that are coupled to bit lines and word lines. The method comprises precharging a plurality of bit lines to a precharge voltage level, applying a sequence of voltages on a selected word line to initiate discharging of one or more bit lines, controlling discharging current of discharging bit lines to achieve identical discharge rates, and latching bit line data of each discharging bit line at an end of a discharge time period.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIG. 3C shows a table that illustrates a comparison of read and program-verify performance for N bits per cell between the invention and the conventional art.

FIGS. 4A-F show exemplary embodiments to control a constant bit line discharging current in accordance with the invention.

DETAILED DESCRIPTION

In various exemplary embodiment, methods and apparatus for the design and operation of NAND flash memory architectures are provided that can be used with two-dimensional (2D) or three-dimensional (3D) NAND arrays. Embodiments can also be applied to single-level cell (SLC), multi-level cell (MLC), triple-level cell (TLC), quad-level cell (QLC), or any number of bits per cell technology.

Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1A:
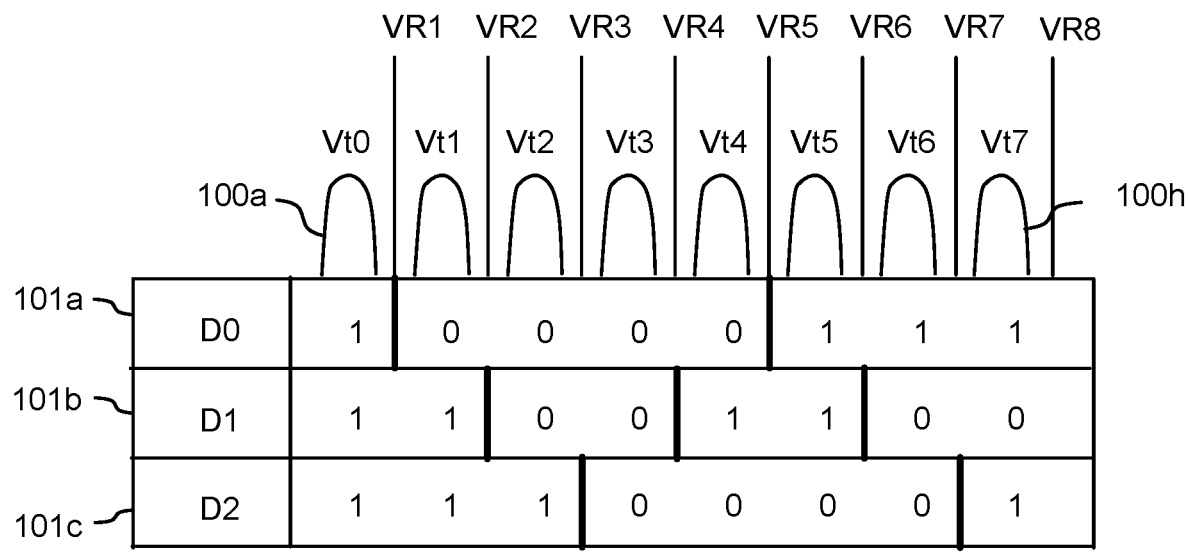
FIG. 1A shows an exemplary voltage threshold (Vt) distribution of a triple-level memory cell (TLC)

FIG. 1A shows an exemplary voltage threshold (Vt) distribution of a triple-level memory cell (TLC). The cell has eight Vt levels, Vt0 to Vt7, as shown at (100a-h) to represent three bits of data, (D0, D2, D3), as shown at (101a-c). During a program operation, the cell is programmed to one of the Vt levels according to the three-bit data to be programmed. During a read operation, the cells' Vt level is checked and then converted to the three-bit data.

The three-bit data can be read independently. The thick bars in FIG. 1A indicate the read voltages used to read each bit. For example, to read the D0 bit, as shown in (101a), the word line is sequentially supplied with read voltages VR1 and VR5. To read the D1 bit, as shown in (101b), the word line is sequentially supplied with read voltages VR2, VR4, and VR6. To read the D2 bit, as shown in (101c), the word line is sequentially supplied with read voltages VR3 and VR7.

For each word line voltage, the cell's data is read by a sense amplifier circuit located in a page buffer. The sense amplifier circuit is designed to generate an output of (data 1) for on-cells and (data 0) for off-cells. The data read by each word line voltage will be stored in a data latch inside the page buffer. Then, the control logic of the chip will generate the D0, D1, or D2 bit data according to the data stored in the data latches.

Figure 1B:
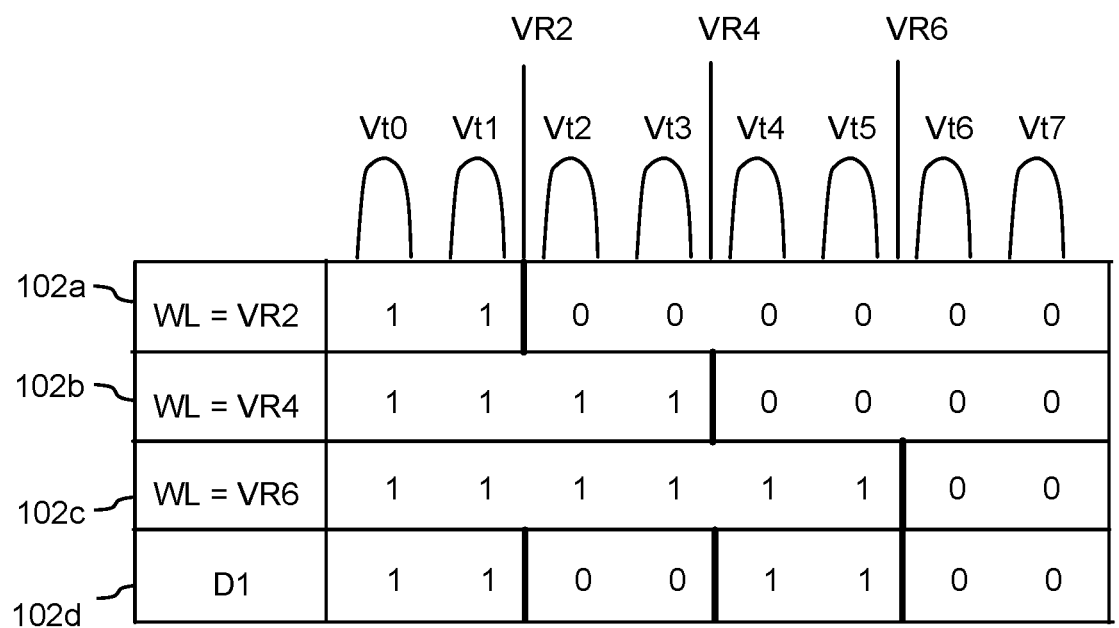
FIG. 1B shows the sequence of word line voltages used to read the D1 bit.

FIG. 1B shows the sequence of word line voltages used to read the D1 bit. In step (102a), the word line is supplied with the first read voltage VR2, which will read Vt0 and Vt1 cells as data 1 (on-cell) and Vt2 to Vt7 cells as data 0 (off-cell). In step (102b), the word line is supplied with the second read voltage VR4, which will read Vt0 to Vt3 cells as data 1 (on-cell) and Vt4 to Vt7 cells as data 0 (off-cell). In step (102c), the word line is supplied with the third voltage VR6, which will read Vt0 to Vt5 cells as data 1 (on-cell) and Vt6 and Vt7 cells as data 0 (off-cell). Finally, in step (102d), the control logic will compare the three data of the steps (102a-c) using an exclusive OR (XOR) function to generate the D1 bit data as shown.

It should be noted that the data assignment shown in FIG. 1A are for example only. There are many other ways to assign the D0, D1, D2 bits and various embodiments of the invention can be applied to any of the other data assignments.

Figure 1C:
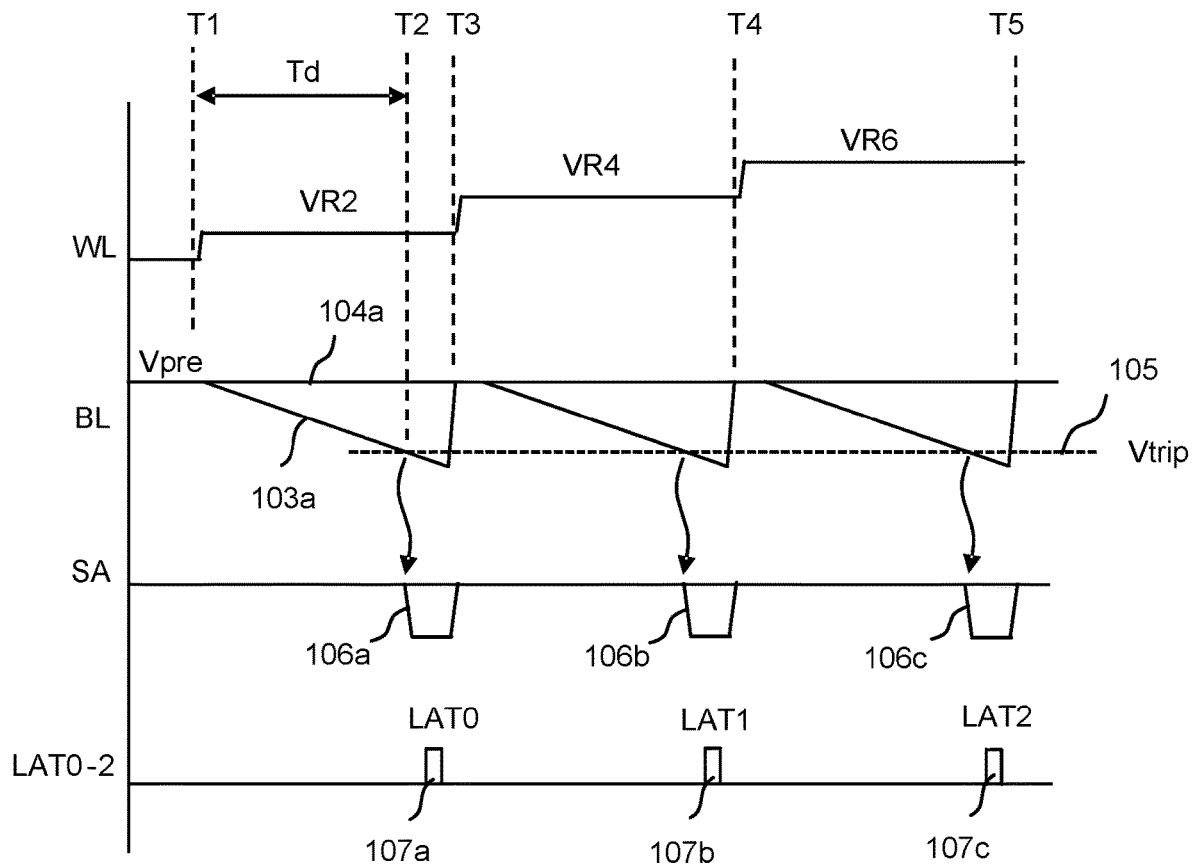
FIG. 1C shows waveforms for conventional read operations to read the D1 bit.

FIG. 1C shows waveforms for conventional read operations to read the D1 bit. The selected word line (WL) is sequentially supplied with three voltages, VR2, VR4, and VR6, as shown at times T1, T3, and T4, respectively. At time T1, the bit line (BL) is pre-charged to a predetermined voltage, Vpre. The word line is supplied with VR2, which turns on the Vt0 and Vt1 cells. The on-cells will start to discharge their bit lines as shown (103a). The Vt2 to Vt7 cells will be turned off, thus their bit lines will not be discharged, as shown (104a).

The bit lines are connected to sense amplifiers. From time T1 to T2, when the bit line (103a) is above the trip point of the sense amplifier, Vtrip (105), the output of the sense amplifier (SA) stays at 1. At T2 time, when the bit line (103a) is discharged to below the trip point of the sense amplifier, Vtrip, the SA output will be flipped from 1 to 0, as shown in (106a). After that, a latch signal, LAT0 (107a), is applied to latch the data of SA to a data latch.

The cycle from times T1 to T3 is defined as a 'discharge cycle'. The time from T1 to T2 is defined as 'bit line discharging time (Td)'. At time T3, the bit line (103a) is pre-charged back to Vpre. The word line is supplied with VR4. The discharge cycle from T1 to T3 is repeated between times T3 to T4 to read the cell using VR4. This will generate the second SA data (106b) and the data is latched using LAT1 (107b).

At T4 time, the bit line is precharged back to Vpre. The word line is supplied with VR6. The discharge cycle is repeated between times T4 to T5 to read the cell using VR6. This will generate the third SA data (106c) and the data is latched using LAT2 (107c). After that, the control logic will compare the three SA data stored in the data latches to generate the final D1 bit data.

Because the on-cell current for TLC is very low, typically below 1 uA, plus the bit line capacitance is very large due to long bit line length, it will take a long time for the on-cell to discharge the bit line to the trip point 105. Therefore, the discharge cycle is the slowest part of the read operation and dominates the total read time. For typical 512 GB 3D NAND flash memory products, the typical discharge cycle (Td) is about 25-30 us, so the read latency for the three discharge cycles is about 75-90 us. For QLC and PLC, it requires four and five discharge cycles, respectively. Therefore, their read latencies are even longer.

Figure 1D:
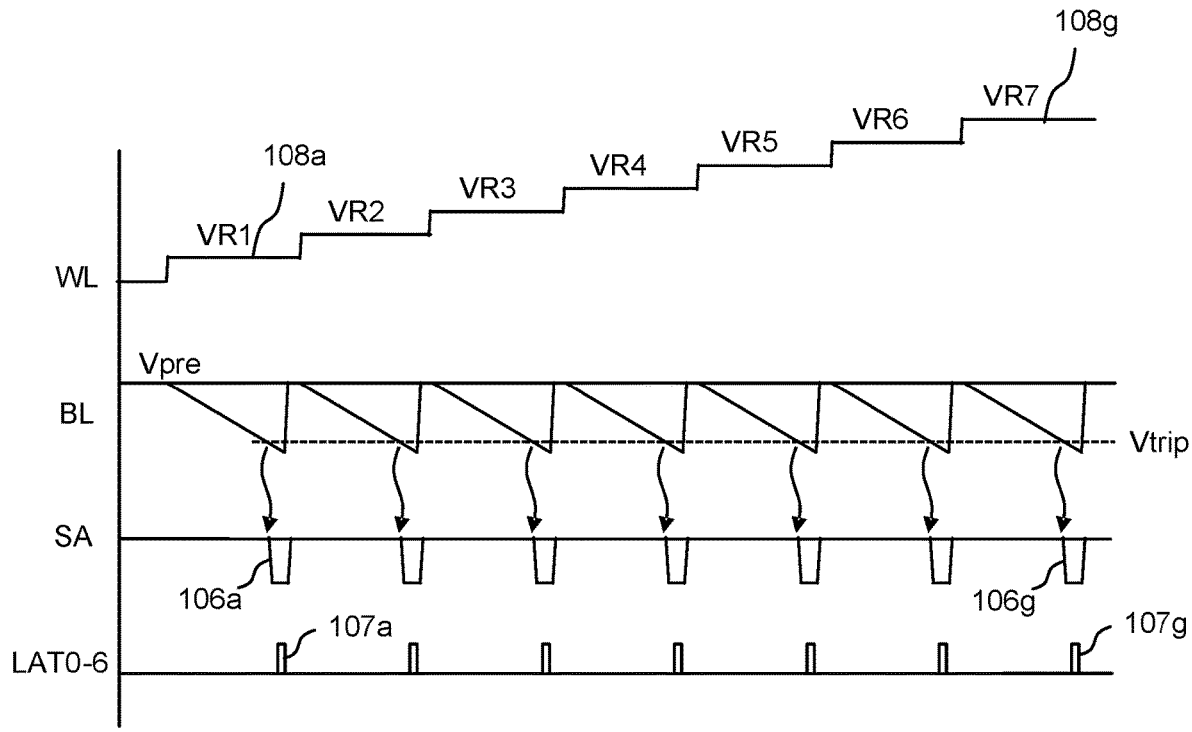
FIG. 1D shows a conventional program-verify waveform for TLC cells.

FIG. 1D shows a conventional program-verify waveform for TLC cells. During program-verification, the programmed cells' Vt need to be checked and compared with the target three-bit data D0, D1, and D2. Due to the fact that there are eight Vt levels, Vt0 to Vt7, the word line needs to be sequentially supplied with seven read voltages, VR1 to VR7, as shown (108a-g) to perform the seven discharge cycles as shown. This will generate seven SA data (106a-g). The data are latched the by latch pulses (107a-g) and compared with the target data to generate the program data for the next program pulse.

As a result, the time spent in program-verification is much longer than the program pulse. For TLC programming, the verification time may take 80-90% of total program time. This slow program-verification problem becomes worse when more Vt levels are used. For example, QLC cells have 16 Vt levels, thus it requires 15 discharge cycles to verify the cell's Vt after each program pulse. For PLC, the cells have 32 levels, thus it requires 31 discharge cycles to verify the cell's Vt after each program pulse.

Figure 2:
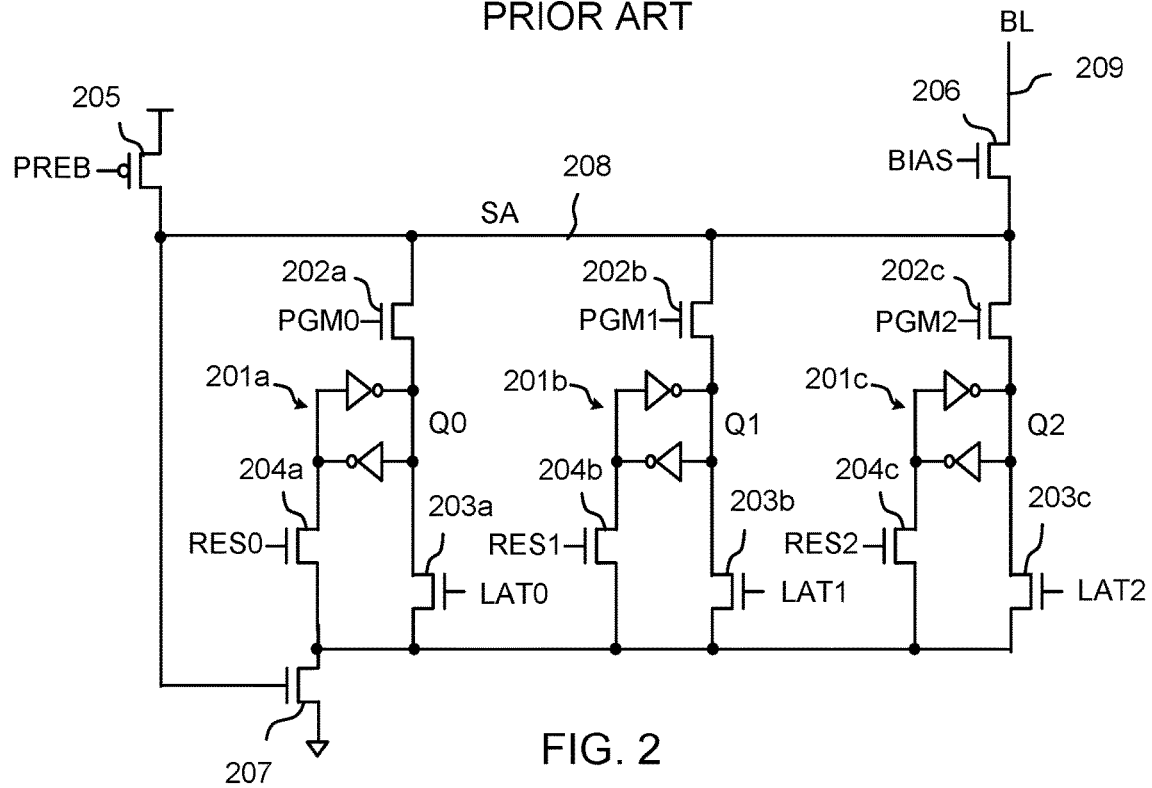
FIG. 2 shows an exemplary circuit of a TLC page buffer to perform the read operations shown in FIG. 1C.

FIG. 2 shows an exemplary circuit of a TLC page buffer to perform the read operations shown in FIG. 1C. The page buffer contains three data latches (201a-c) to store the SA data. The devices (202a-c) are used to apply data from the latches (201a-c) to the bit line (209) during program operation. The devices (205), (206) and (207) form a sense amplifier. During pre-charging, the pre-charge device (205) is turned on to precharge the SA node (208) to VDD. The gate of the bias device (206) is supplied with a bias voltage (BIAS=Vpre+Vt), to limit the precharge voltage of the bit line (209) to Vpre. After pre-charging, the bias device (206) is supplied with a bias voltage, (BIAS=Vbias). When the bit line (209) is discharged by an on-cell to below (Vbias−Vt), this will turn on the bias device (206) and pull low the SA node (205) to turn off the sensing device (207). For an off-cell, the bit line (209) will remain at Vpre, thus the bias device (206) is turned off, which causes the SA node (208) to remain at VDD to turn on the sensing device (207). Therefore, the trip point of the sense amplifier, Vtrip, is (Vbias−Vt). The data latches (201a-c) are reset by the signals RES0 to RES2. After the on-cell's bit line is discharged, the latch signals LAT0 to LAT2 will turn on the devices (203a-c) to set the data of the latches (201a-c) based on the voltage of SA node (208).

Various exemplary embodiments are now disclosed to solve the slow read and program-verification problems of the conventional memory. In an embodiment, a novel read method and apparatus are disclosed that use a 'constant bit line discharging speed'. The novel read method and apparatus read multiple Vt levels in just one discharge cycle.

Figure 3A:
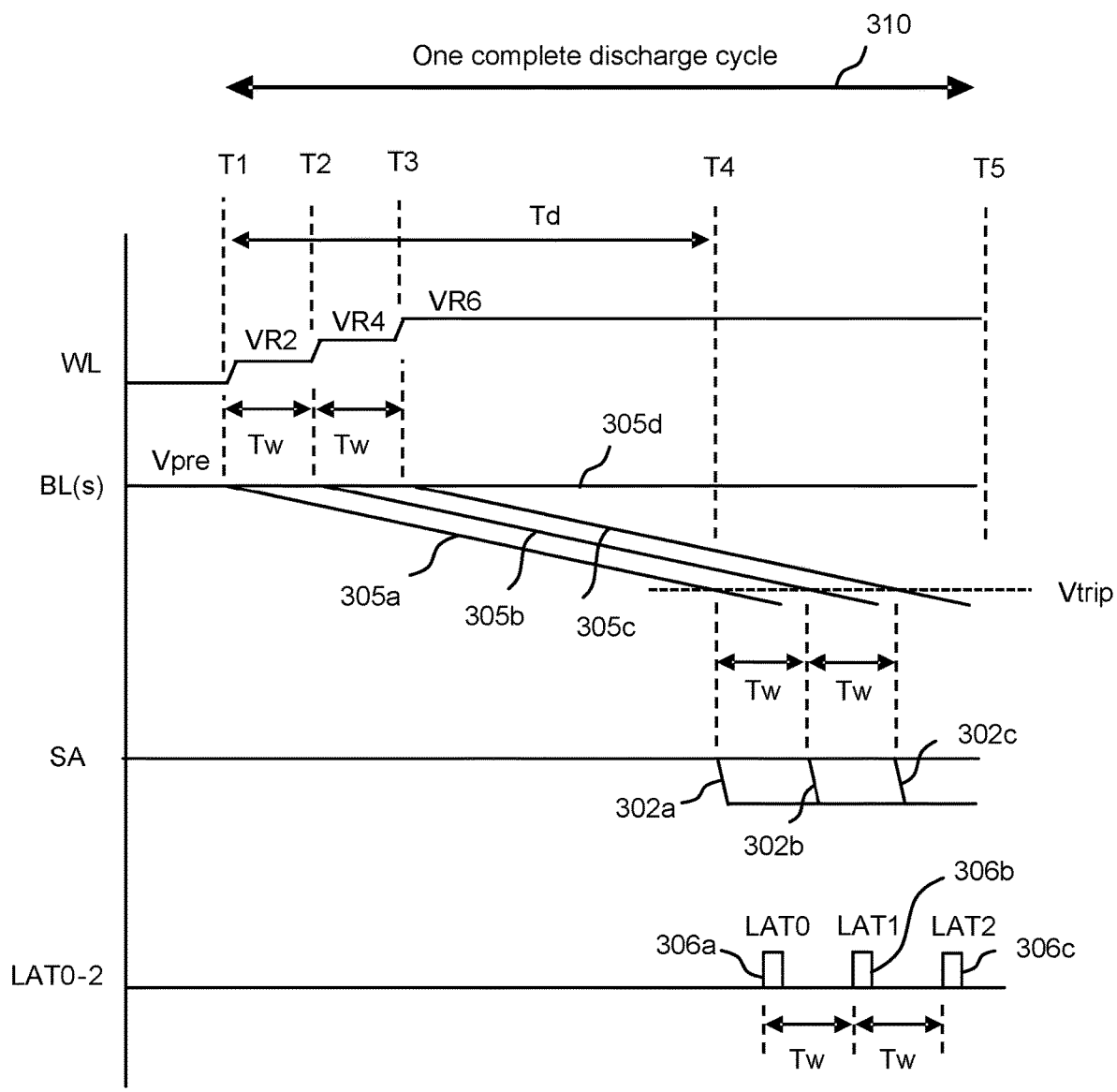
FIG. 3A shows exemplary circuit waveforms to perform a read operation for reading a D1 bit in accordance with the invention

FIG. 3A shows exemplary circuit waveforms to perform a read operation for reading a D1 bit from multiple cells on multiple bit lines in accordance with the invention. Assume the multiple cells are programmed to different Vt from Vt0 to Vt7. For ease of understanding, the drawing scale of the bit line (BL) voltage is enlarged. To read the D1 bit, a selected word line (WL) is sequentially supplied with increasing voltage levels VR2, VR4, and VR6, which are also illustrated in FIG. 1B. Each word line voltage level is supplied for a constant period (or time interval), Tw. Tw is a relatively short time compared with the discharging time, Td. For example, Tw may be 20 nanoseconds (ns) to 100 ns, while (Td) is approximately 25-30 microseconds (us).

The bit lines are initially charged to a precharge voltage level (Vpre). At time T1, the word line is supplied with the voltage level VR2. This will turn on cells programmed to voltage thresholds levels Vt0 and Vt1 to start discharging their associated bit lines, as shown at (305a). At time T2, the word line is supplied with the voltage level VR4. This will turn on cells programmed to voltage threshold levels Vt2 and Vt3 to start discharging their associated bit lines as shown at (305b). It should be noted that the bit line discharging shown at 305a continues when the bit line discharging shown at 305b begins. At time T3, the word line is supplied with the voltage level VR6. This will turns on cells programmed to voltage threshold levels Vt4 and Vt5 to start discharging their bit lines as shown at (305c). It should be noted that the bit line discharging shown at 305a and 305b continues when the bit line discharging shown at 305c begins. The cells programmed to voltage threshold levels Vt6 and Vt7 will remain off, and thus their bit lines will not be discharged and remain at the precharge voltage level, as shown at (305d). Thus, the time interval 310 represents one complete discharge cycle wherein multiple bit lines discharge at the same time and at the same rate.

In various embodiments of the invention, the bit lines are discharged by a constant bit line discharging current. Because each bit line's capacitance is similar, this will result in a constant bit line discharging speed (rate), as shown at (305a-c). By sequentially supplying the word line voltages as described, the discharging bit lines (305a-c) will sequentially reach the trip point of the sense amplifier, Vtrip, with the same sequential order and with the same Tw delay as at the beginning of discharging cycles when the word line voltages are supplied.

At time T4, the first bit lines (305a) are discharged to the trip point, Vtrip. This causes the output of the sense amplifier, SA, to be flipped from 1 to 0, as shown at (302a). Due to the constant bit line discharging speed, after the Tw delay, the second bit lines (305b) are discharged to the trip point, Vtrip, and flip the SA output to 0, as show at (302b). Similarly, after another Tw delay, the third bit lines (305c) are discharged to the trip point, Vtrip, and flip the SA output to 0, as shown at (302c).

From time T4 to T5, sequential latch pulses LAT0 (306a) to LAT2 (306c) are applied to latch the data output from the SA. The latch pulses LAT0 to LAT2 have Tw delay between each to match the timing of the bit line discharging. As a result, the latch pulses LAT0 (306a) to LAT2 (306c) will latch the SA data of the discharging bit lines (305a) to (305c), respectively. After that, control logic determines the D1 data based on the data latched by LAT1 to LAT2. From time T4 to T5, the bit lines (305a) and (305c) may be continuously discharged by the on-cells. After time T5, the bit lines (305a) to (305c) are precharged to Vpre again for the next read cycle. For simplicity, the bit line waveforms after time T4 time are not shown. Using the above described operations, the D1 bit is read from multiple memory cells by using only one complete discharge cycle 310. Compared with the conventional read operation shown in FIG. 1C, which requires three discharge cycles, the embodiments of the invention reduce the read latency time to ⅓ of the latency time of the conventional read operation.

Based on the above description, a method for reading a NAND flash memory is provided, wherein the NAND flash memory comprises strings of memory cells that are coupled to bit lines and word lines. The method comprises precharging a plurality of bit lines to a precharge voltage level, applying a sequence of word line voltages to a selected word line, initiating discharge of one or more bit lines associated with one or more cells, respectively. The discharge of a selected bit line is initiated when its associated cell is turned on when a selected word line voltage is higher than a threshold voltage (Vt) of the associated cell. The method also comprises controlling discharging current of discharging bit lines to achieve identical discharge rates. For example, embodiments to control discharging current are shown and described with reference to FIG. 4A to FIG. 5G. The method also includes waiting for a discharging time period for each bit line that is discharging, and latching bit line data at an end of each discharge time period. It should also be noted that apparatus for generating control and memory signals described herein are shown and described with reference to FIG. 20.

Reading the D0 bit and D2 bit is similar to the operations illustrated in FIG. 3A except that the word line voltages used are VR1 and VR5 for the D0 bit, and VR3 and VR7 for the D2 bit. For simplicity, the operations for reading the D0 and D2 bits are similar to the above operations and will not be repeated here.

Moreover, the embodiments shown in FIG. 3A can be applied to other multiple-level cells, such as MLC, TLC, QLC, PLC, etc. The operation is similar to FIG. 3A except that the number of word line voltages and levels are slightly different. For comparison, the conventional read operations require 4 and 5 discharge cycles to read QLC and PLC cells, respectively. In accordance with the invention, only one discharge cycle is needed to perform the read operations for QLC and PLC cells, thus reducing the read latency time to ¼ and ⅕ of the latency times for the QLC and PLC cells, respectively.

In addition to the read operation, the constant discharging speed illustrated above can be applied to program-verify operations as described below.

Figure 3B:
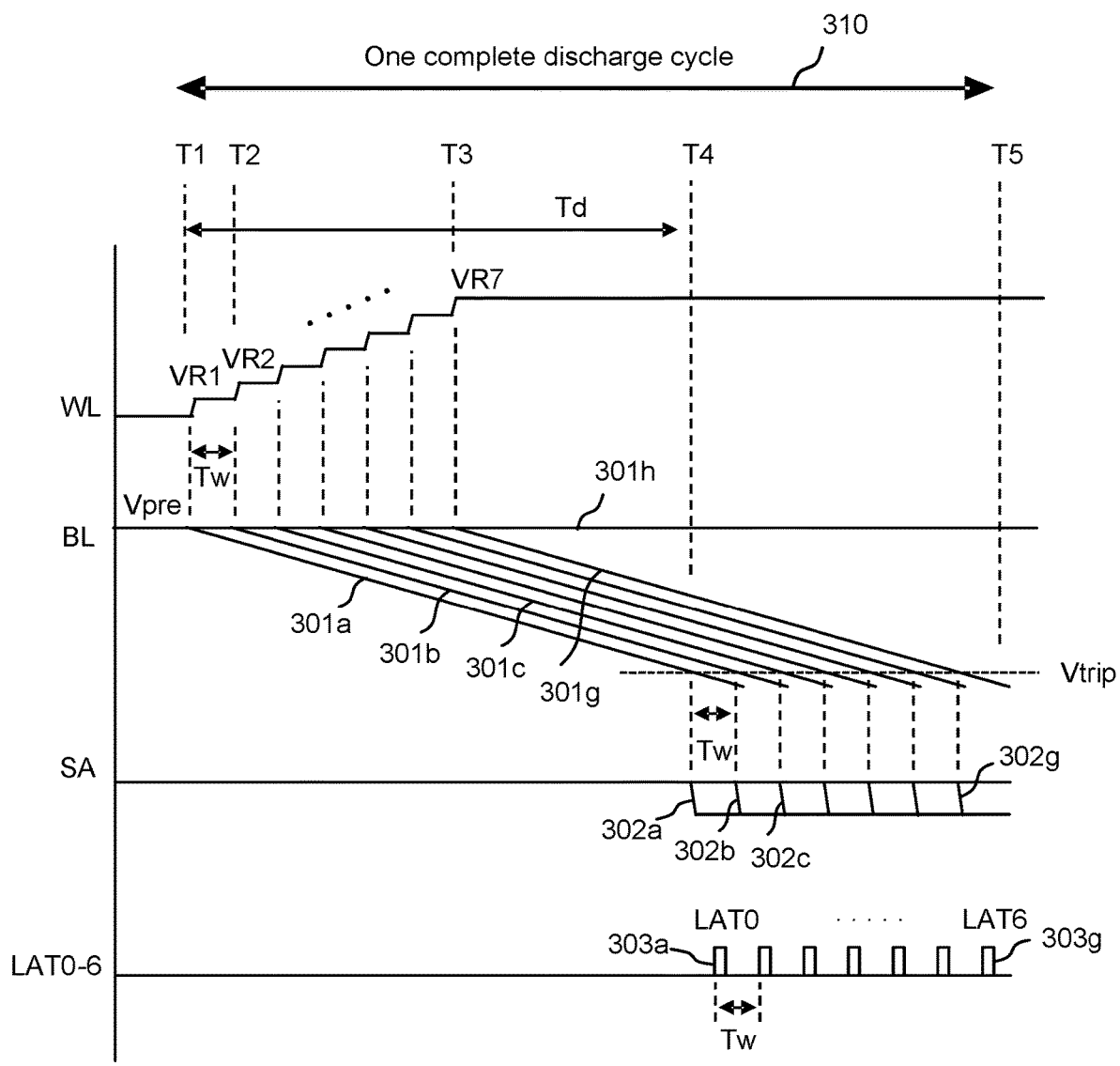
FIG. 3B shows an exemplary embodiment of program-verify operations for use with TLC according to the invention.

FIG. 3B shows an exemplary embodiment of program-verify operations for use with TLC according to the invention. It is assumed that eight TLC cells, CELL0 to CELL7 are programmed to have voltage threshold levels ranging from Vt0 to Vt7, respectively. It is further assumed that CELL0 to CELL7 are located in eight bit lines (301a) to (301g) and connected to a selected word line (WL). From time T1 to T3, the selected word line is sequentially supplied with increasing voltage levels VR1 to VR7. The time interval for each word line voltage level is a constant period, Tw. Tw is a relatively short time compared with the discharging time, Td. For example, Tw may be in the range of 20 ns to 100 ns.

At time T1, the word line is supplied with VR1, which turns on CELL0 (programmed to Vt0) to start discharging the bit line (301a). At time T2, the word line is supplied with VR2, which turns on CELL1 (programmed to Vt1) to start discharging the bit line (301b). At time T3, the word line is supplied with a voltage level VR7, which turns on CELL6 to discharge the bit line (301g). The word line voltages VR1 to VR7 are sequentially applied to turn on CELL0 to CELL6 to discharge their bit lines (301a) to (301g), respectively. However, CELL7 will remain off, thus its bit line (301h) will not be discharged and remains at the precharge voltage level (Vpre).

In accordance with aspects of the invention, the constant discharging speed of the bit lines is achieved by using constant discharging current. Because each bit line's capacitance is similar, this will result in a constant bit line discharging speed, as shown (301a) to (301g). Therefore, after the discharging time, Td, at time T4 the first bit line (301a) is discharged by CELL0 to the trip point (Vtrip) of the sense amplifier. This will cause the output of the sense amplifier, SA, to be flipped from 1 to 0 as shown in (302a).

Due to the constant bit line discharging speed, after time Tw, the second bit line (301b) will be discharged by CELL1 to the trip point and flip the SA data to 0, as shown at (302b). Similarly, the other bit lines (301c) to (301g) will be sequentially discharged by CELL2 to CELL6 to the trip point to flip their SA data, as shown (302c) to (302g).

From time T4 to T5, sequential latch pulses LAT0 (303a) to LAT6 (303g) are applied to latch the data of SA (302a) to (302g), and compare the data with the target data to determine the program data for the next program pulse. For example, if a cell is not fully programmed, another programming operation will be scheduled for that cell. Compared with the conventional program-verify operations shown in FIG. 1D, which needs seven discharge cycles to verify the programming of the eight voltage threshold levels, Vt0 to Vt7, the program-verify operations illustrated in FIG. 3B require only one discharge cycle to verify the Vt0 to Vt7 threshold level and therefore reduces the program-verify time to 1/7 of the conventional approach.

The embodiments shown in FIG. 3B may be applied to MLC, TLC, QLC, PLC, etc. The program-verify operations for those cells is similar to operations illustrated in FIG. 3B except that the word line is supplied with 15 and 31 voltage levels for QLC and PLC, respectively. For comparison, the conventional approach will require 15 and 31 discharge cycles to read QLC and PLC, respectively, while the inventive embodiment only requires one discharge cycle. Therefore, the inventive embodiments reduce the program-verify time to 1/15 and 1/31 of the conventional approach for QLC and PLC, respectively.

FIG. 3C shows a table that illustrates a comparison of read and program-verify performance for N bits per cell between the invention and the conventional art. For example, N is 1, 2, 3, 4, and 5 for SLC, MLC, TLC, QLC, PLC, respectively. Because the invention only requires one discharge cycle to read the N-bit cell, while the conventional art requires N discharge cycle, the read latency of the invention is only 1/N of the conventional art's and the read throughput is N times of the conventional art's. For program-verify operation, the inventive embodiments only require one discharge cycle and the conventional arts require (2N−1) discharge cycles. Therefore, the program-verify latency of the inventive embodiments is only 1/(2N−1) of the conventional art's and the program-verify throughput is (2N−1) times of the conventional art's.

Please notice, although the embodiments shown in FIGS. 3A-B use a 'bit line discharging' type of read technique, the inventive embodiments can be applied to any other read techniques, such as a 'source line charging' type of read technique.

Figure 3D:
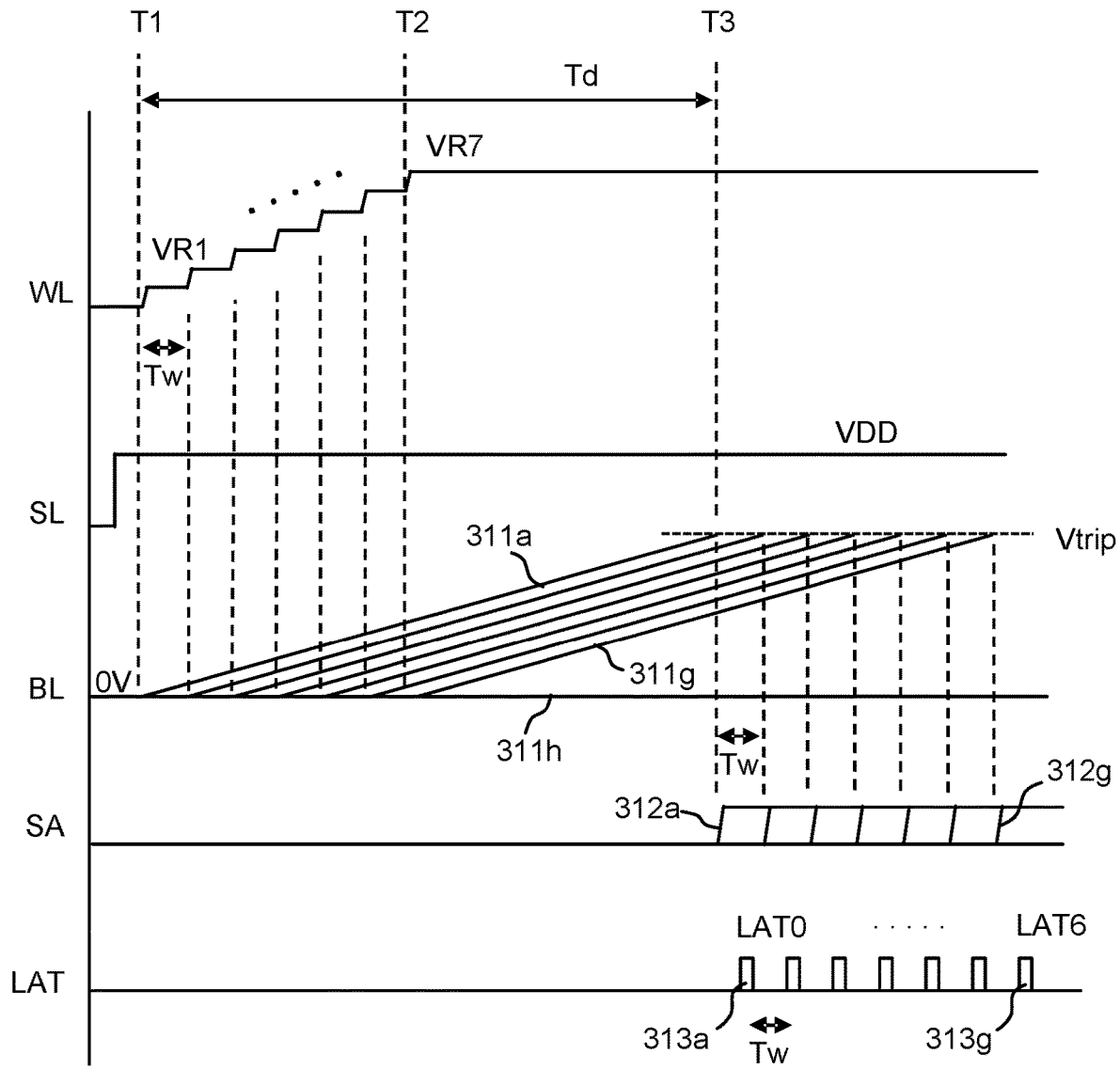
FIG. 3D shows an embodiment of a source line charging read technique.

FIG. 3D shows an embodiment of a source line charging read technique. The operation of this embodiment is similar to that of FIG. 3B except that the on-cell current is flowing in the opposite direction from the source line to the bit line. At the beginning, the bit line is pre-discharged to 0V or a bias voltage. The source line (SL) of the cell string is supplied with a voltage, such as VDD for example.

From time T1 to T2, the selected word line is sequentially supplied with the read voltages VR1 to VR7. This will turn on the Vt0 to Vt6 cells to charge up their bit lines (311a) to (311g), respectively. The Vt7 cells will remain off, thus their bit lines remain at 0V, as shown (311h). In as aspect, the bit lines (311a) to (311g) are charged by a constant current. Therefore, the charging speeds of bit lines (311a) to (311g) are constant. At time T3, the bit lines (311a) to (311g) are sequentially charged to the trip point of the sense amplifier, Vtrip. The SA outputs (312a) to (312g) will be flipped from 0 to 1. The latch pulses LAT0 (313a) to LAT6 (313g) are applied to latch the SA data (312a) to (312g). This embodiment illustrates that the TLC cell is read by using one bit line charging cycle, thus the read latency is reduced to 1/3 of conventional systems.

In the other words, the various exemplary embodiments may use constant charging or constant discharging current to achieve constant bit line charging or discharging speed. For simplicity, the following embodiments will only show the constant discharging current. However, all the embodiments may use the constant charging current scheme, which is within the scope of the inventive embodiments.

FIGS. 4A-F show exemplary embodiments to control a constant bit line discharging current in accordance with the invention. The constant bit line discharging current is achieved by controlling the current of the NAND flash memory cell strings' source select gate, drain select gate, or memory cells.

Figure 4A:
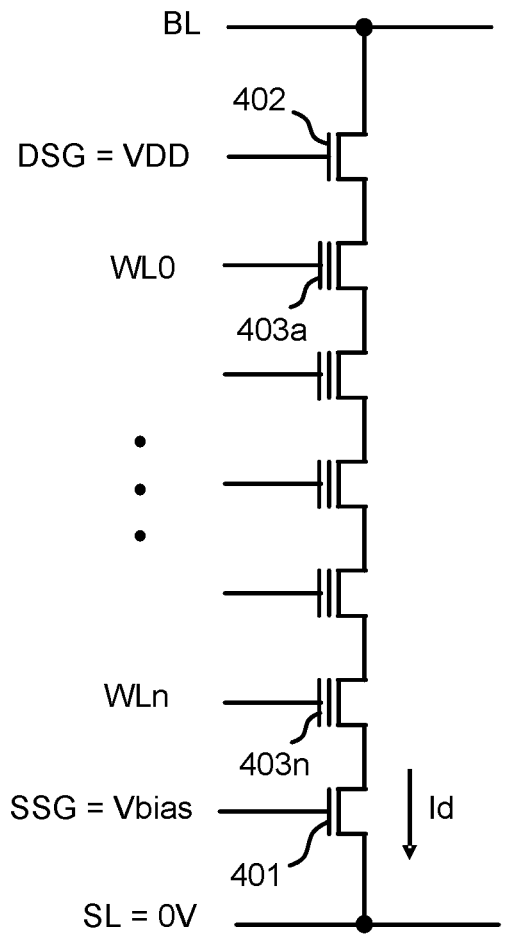

FIG. 4A shows an embodiment of a NAND cell string that contains a drain select gate, DSG (401), a source select gate, SSG (402), and multiple memory cells (403a) to (403n). In this embodiment, the constant bit line discharging current is controlled by the source select gate (401). During read operations, the source select gate (401) is supplied with a bias voltage, Vbias, to limit the discharging current, Id. The drain select gate, DSG (402), is supplied with VDD to fully turn on the drain select gate (402). The selected word line is supplied with the sequentially increasing read voltages shown in FIG. 3A. Because the unselected cells' Vt may be Vt0 to Vt7, the unselected word lines are supplied with a pass voltage higher than Vt7, such as VR8, to turn on the unselected cells.

In an exemplary embodiment, the constant discharging current, Id, may be equal to or lower than the minimal current of the cells, which may be VR8-Vt7, for example. Therefore, the discharging current of the string can be dominated by the constant current of the source select gate (401), regardless the cells' Vt. In the other words, the selected cell will function like a 'switch'. When the word line voltage is higher than the selected cell's Vt, the selected cell is turned on and allows the constant current controlled by the source select gate (401) to discharge the bit line. In this way, the constant bit line discharging speed as shown in FIGS. 3A-B can be realized.

During erase operations, all the cells (403a) to (403n) on the string are erased to the lowest Vt0, which results in the highest cell current. Then, during a program operation, the cells are programmed to gradually increase their Vt to the target value. In the other words, the cell current is gradually decreased during the program operation. This allows the bit line discharging current to be dominated by the source select gate (401) during the program-verification, thus the embodiment shown in FIG. 3B can be successfully performed during program-verification. On the other hand, the program-verification prevents the cells from being over-programmed to cause the cell current to be lower than the constant discharging current. Therefore, the read operation can be successfully performed.

The bit line discharging current, Id, can be adjusted by the bias voltage applied to the source select gate (401). By increasing the bias voltage, Vbias, the discharging current can be increased to increase the bit line discharging speed.

Figure 4B:
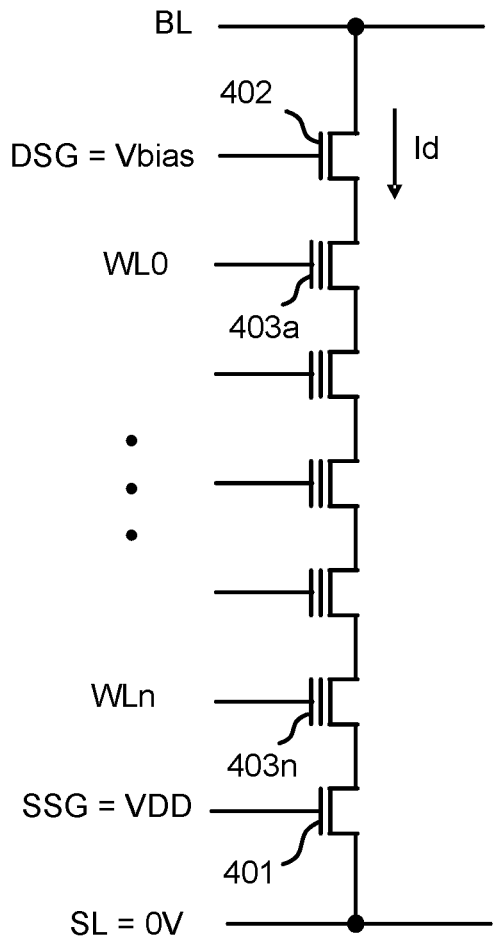

FIG. 4B shows another embodiment to control the bit line discharging current by using a drain select gate (402). During read operations, the drain select gate (402) is supplied with a bias voltage, Vbias, to limit the discharging current Id. The source select gate (401) may be applied with VDD to fully turn on the source select gate.

In another embodiment, both the drain select gate (402) and the source select gate (401) are supplied with bias voltages to achieve the desired discharging current Id.

FIG. 4C shows another embodiment to control the bit line discharging current according to the invention. In this embodiment, the cell string is configured to have multiple source select gates, SSG1 (401a) and SSG2 (401b). The SSG1 (401a) is supplied with Vbias to limit the discharging current Id, while the SSG2 (401b) is supplied with VDD to perform the regular select function. In another embodiment, the SSG1 (401a) and SSG2 (401b) are swapped, thus SSG2 (401b) is located below SSG1 (401a).

FIG. 4D shows another embodiment to control the bit line discharging current according to the invention. In this embodiment, the string is configured to have multiple drain select gates, DSG1 (402a) and DSG2 (402b). The DSG1 (402a) is supplied with Vbias to limit the discharging current Id, while the DSG2 (402b) is supplied with VDD to performs the regular select function. In another embodiment, the DSG1 (402a) and DSG2 (402b) are swapped, thus DSG1 (402a) is located below DSG2 (402b).

It should be noted that the type of devices shown to implement the source select gate (401) and drain select gate (402) shown in FIGS. 4A-D are exemplary. There are many other devices that may be used to implement the drain select gate and source select gate. For example, in another embodiment, the drain select gate (402) and source select gate (401) are formed using memory cells. In another embodiment, the drain select gate (402) and source select gate (401) are formed by multiple transistors connected in series with their gates connected. These variations and modifications are within the scope of the invention.

Figure 4E:
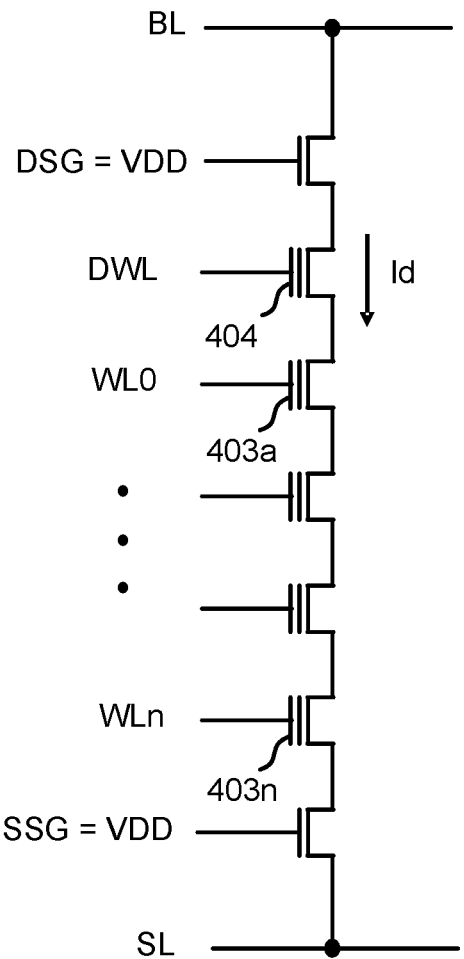
Figure 4F:
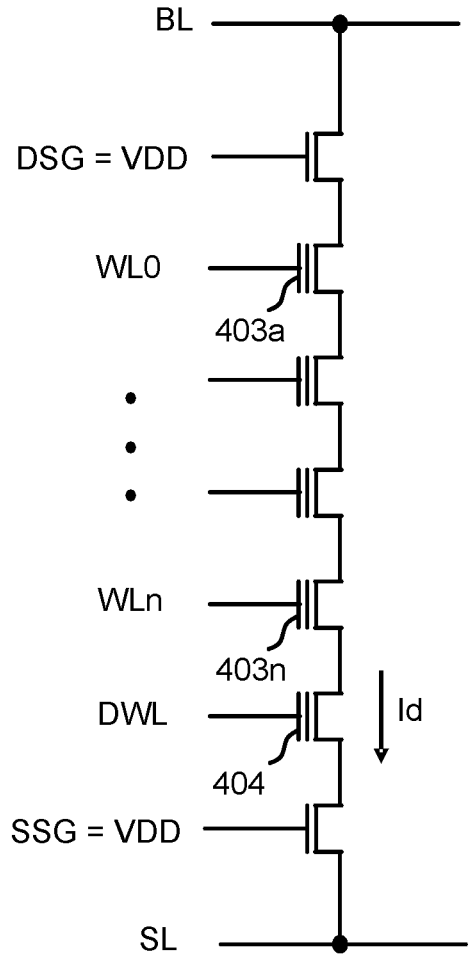

FIGS. 4E-F show additional exemplary embodiments that control the bit line discharging current by using a dummy cell (404) in accordance with the invention. In an embodiment, the string is configured to have at least one dummy cell (404) connected to a dummy word line, DWL. The dummy cell (404) is programmed to a proper Vt, such as Vt7. During read and program-verify operations, the dummy word line, DWL, is supplied with a pass voltage higher than Vt7, such as VR8 shown in FIG. 1A. As a result, the discharging current, Id, can be limited by the dummy cell (404). In another embodiment, the dummy cell (404) is programmed to a lower Vt, and thus the dummy word line's voltage can be lowered accordingly. For example, the dummy cell (404) may be programmed to a voltage level in the range of Vt0 to Vt6, and the dummy word line, DWL, may be supplied with VR1 to VR7, respectively. Again, the discharging current, Id, may be limited by the dummy cell (404).

During a block erase operation, the dummy cell (404) can be erased with other cells together. After the erase operation, or at the beginning of a program operation, the dummy cell (404) can be programmed to the desired Vt first, and then it can be used to control the bit line discharge current during program-verification for the other cells. When programming the dummy cell (404), since all the other cells' Vt are Vt0, the dummy cell (404) can be verified without being affected by the other cells.

As illustrated in FIGS. 4E-F, the dummy cell (404) is located on top and bottom of the string, respectively. In fact, the dummy cell can be located in any location within the sting. Also, the number of dummy cells used is not limited to one. The string can contain multiple dummy cells in any location. For example, the string can contain two dummy cells, one on top, and one on bottom of the string, respectively.

In another embodiment, the dummy cell can be implemented by programming at least one cell in a normally used word line to Vt7. In this way, when reading other cells, the cell will be supplied with the pass voltage, such as VR8. The cell will be turned on to limit the discharging current of the string. Because the cell is programmed to Vt7, its cell current will be the lowest among the cells. Therefore, the discharging current will be dominated by this cell. However, this embodiment utilizers a normal cell in one string, thus the density of the array is reduced.

Figure 4G:
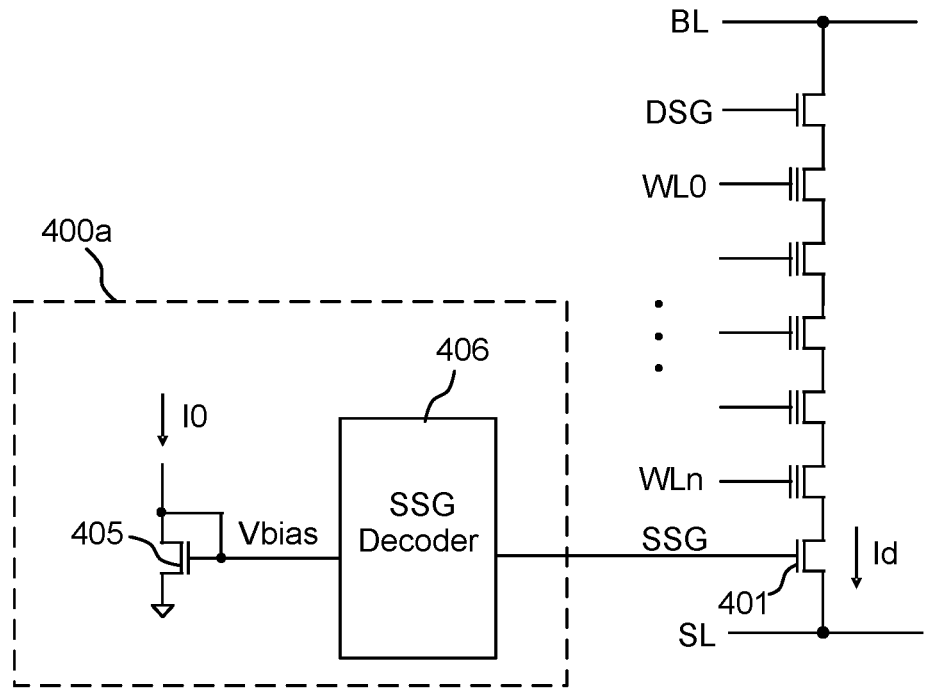
FIGS. 4G-I shows embodiments of a bias voltage generator for the source select gate and drain select gate shown in FIGS. 4A-B.
Figure 4H:
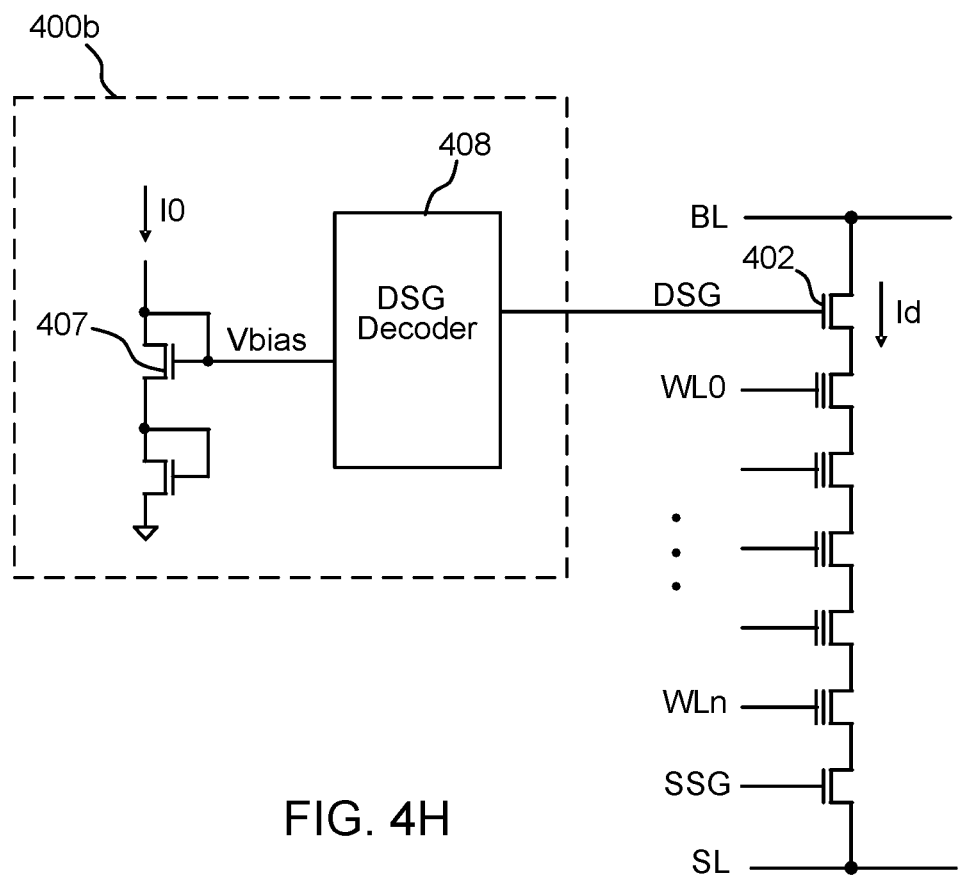
Figure 4I:
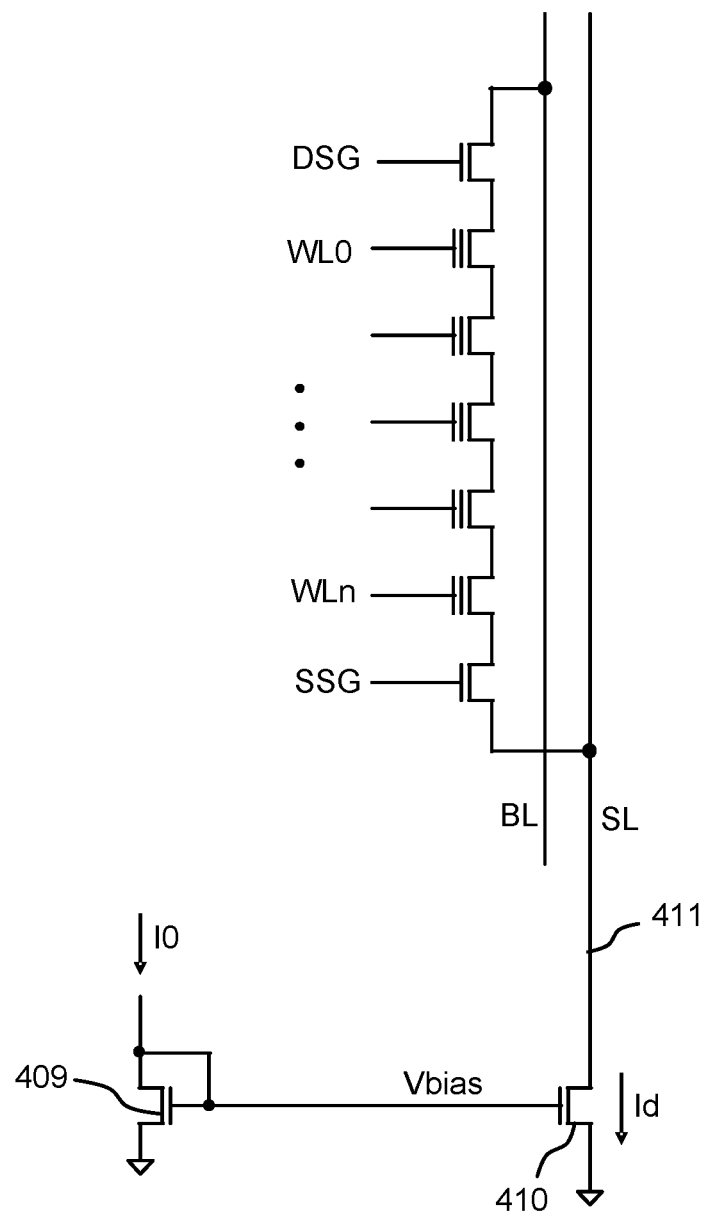

FIGS. 4G-I shows embodiments of a bias voltage generator for the source select gate (401) and drain select gate (402) shown in FIGS. 4A-B.

FIG. 4G shows an embodiment of a bias voltage generator 400a constructed in accordance with the invention to generate a bias voltage for the source select gate 401. In an embodiment, the bias voltage connected to the SSG 401 is generated by a constant current source, I0, and a current mirror (405), and then applied to the source select gate (401) through a source select gate decoder (406) as shown. The source select gate decoder (406) selects the source select gate (401) from the array and applies the bias voltage to the selected source select gate (401).

FIG. 4H shows an embodiment of a bias voltage generator 400b constructed in accordance with the invention to generate a drain select gate bias voltage. In an embodiment, the bias voltage is generated by a constant current source, I0, and a current mirror (407), and then applied to the drain select gate (402) through a drain select gate decoder (408) as shown. The drain select gate decoder (408) selects the drain select gate (402) from the array and applies the bias voltage to the selected drain select gate (402).

FIG. 4I shows another embodiment of a constant discharging current implementation. In NAND flash memory arrays, multiple selected strings are connected to a common source line (SL). During read operations, all the selected strings will dump current to the common source line. Therefore, the constant discharging current for each individual string cannot be controlled by a common device connected to the common source line. However, for arrays using a parallel bit line/source line structure as shown in FIG. 4I, each selected string is connected to only one source line (411). The constant discharging current of the string can be controlled by a discharging device (410) connected to the source line (411). The discharging device (410) is supplied with a bias voltage, Vbias, which is generated by a constant current source, I0, and a current mirror (409), to control the constant discharging current, Id.

The embodiments shown in FIGS. 4A-I are exemplary embodiments to implement the constant bit line discharging current. Other embodiments to implement constant discharging current can be utilized. For example, an extra device can be connected to the bit line, source line, or anywhere in the string to control the constant discharging current. These variations and modifications are within the scope of the invention.

The embodiments shown in FIGS. 4A-I can be applied to another read operation that uses the source line to charge the bit line, as shown in FIG. 3D. Similar to the constant discharging current embodiments, constant charging current can be controlled by applying a bias voltage to the drain select gate (402), source select gate (401), or a dummy cell (404), as shown in FIGS. 4A-F. In these embodiments, the current is flowing from the source line to the bit line.

Figure 13A:
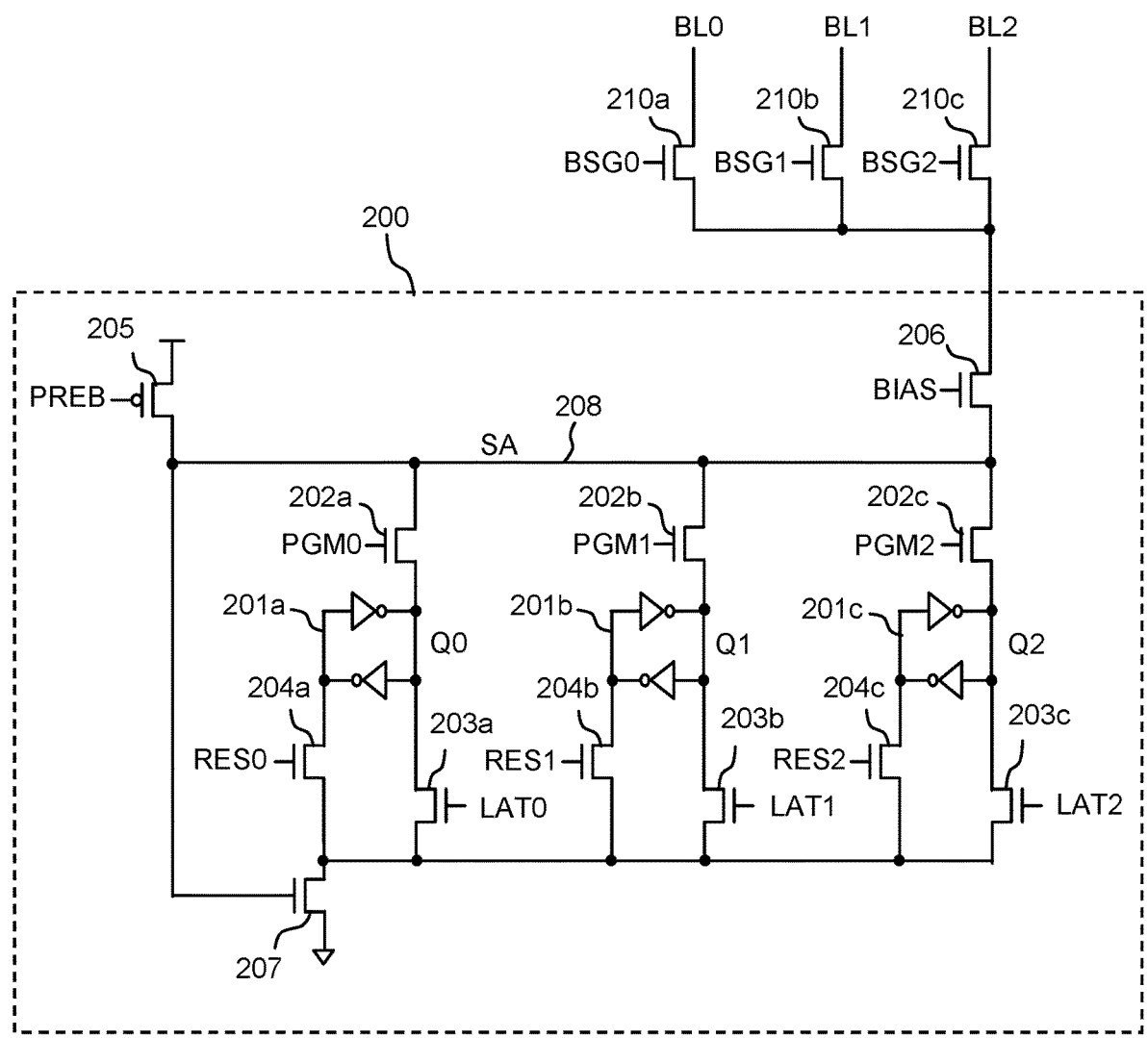
FIGS. 13A-B shows an additional embodiments of a page buffer according to the invention.

Moreover, for the source line charging read operations, because each bit line is connected to one page buffer, the constant charging current can be controlled by applying a bias voltage to the bias device (206) of the page buffer shown in FIG. 2, or the bit line select gates (210a) to (210c) shown in FIG. 13A.

FIGS. 5A-D show a conventional read method without using constant discharging current.

Figure 5A:
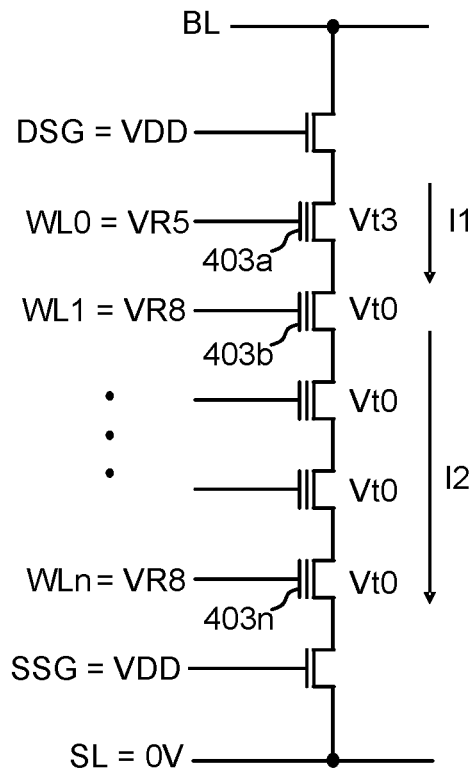
FIGS. 5A-D show a conventional read method without using constant discharging current.
Figure 5B:
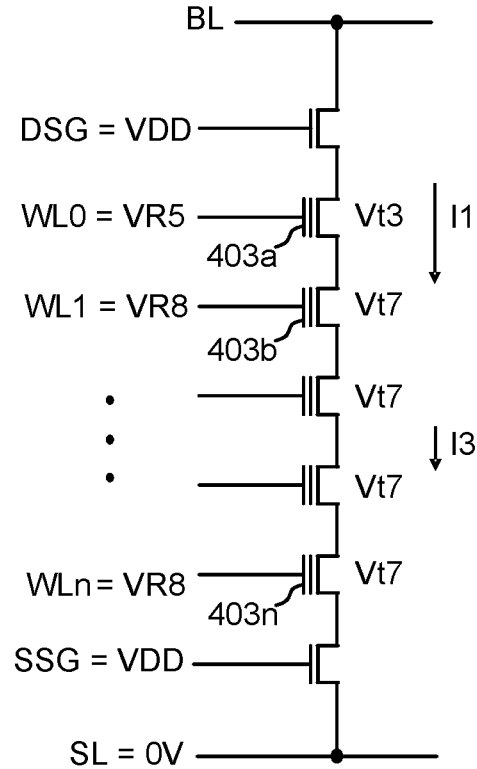

FIGS. 5A-B shows two NAND flash memory cell strings. It will be assumed that cell (403a) is the selected cell, and cells (403b) to (403n) are unselected cells. It will further be assumed that the Vt of the selected cell (403a) is Vt3 and the Vt of all the unselected cells (403b) to (403n) in FIG. 5A is Vt0, and in FIG. 5B is Vt7.

During a read operation, the selected cell (403a) is supplied with a read voltage, VR5, and the unselected cells (403b) to (403n) are supplied with a pass voltage, VR8. The cell current for the selected cell (403a) is I1, and the cell current for unselected cells (403b) to (403n) in FIG. 5A and FIG. 5B are I2 and I3, respectively.

Figure 5C:
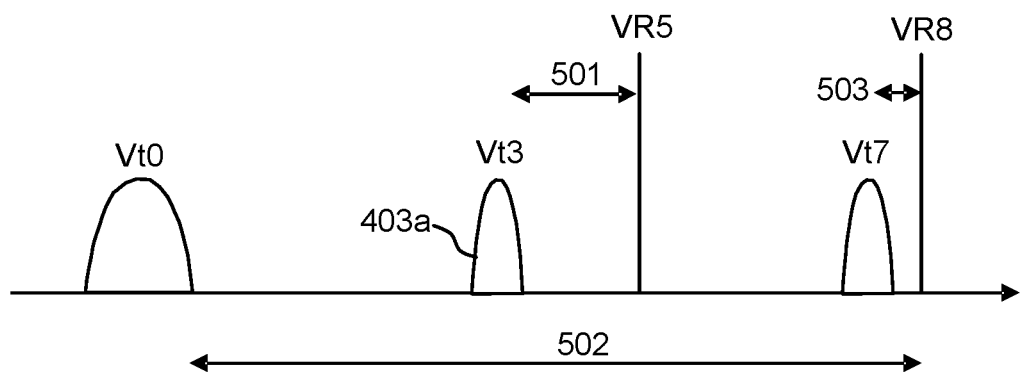

FIG. 5C shows a diagram of the Vt distribution for the cells (403a) to (403n). The cell current is linear proportional to VG-Vt, where, VG is the word line voltage and Vt is the cell's Vt. The diagram shows the VG-Vt difference (501) of the selected cell (403a) (providing I1) and the VG-Vt differences (502) (providing I2) and (503) (providing I3) of the unselected cells (403b) to (403n), respectively. Comparing (501), (502), and (503), shows that I2>I1>I3. Therefore, the bit line discharging current in FIG. 5A is dominated (controlled) by the selected cell (403a), while the discharging current is dominated (controlled) by the unselected cells (403b) to (403n) in FIG. 5B.

Figure 5D:
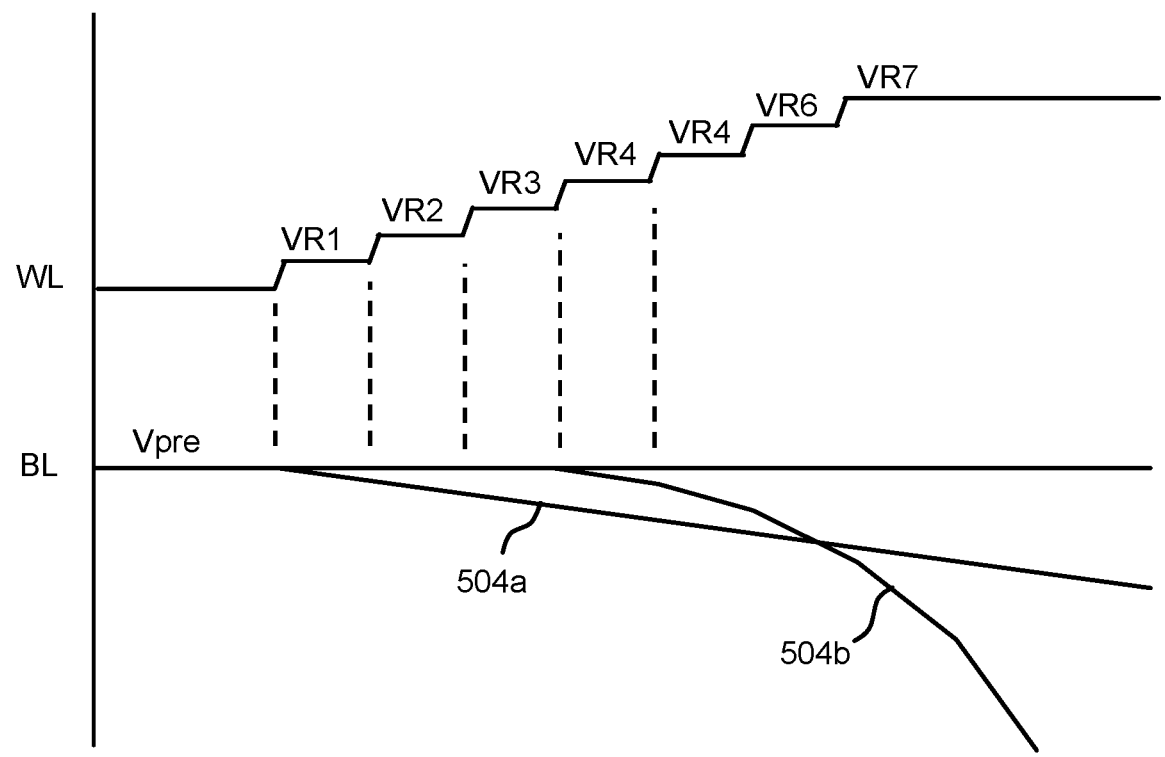

FIG. 5D shows an exemplary waveform that occurs when using the embodiment shown in FIG. 3B without using constant discharging current. The bit line (BL) is shown discharging (504a) by a string having unselected cells with high-Vt, as shown in FIG. 5B. Because the discharging current is limited by the high-Vt unselected cells, the discharging speed illustrated by (504a) is very slow. The bit line is shown discharging (504b) by a string having unselected cells with low-Vt, as shown in FIG. 5A. The discharging current is limited by the Vt of the selected cell (403a), and when the word line voltage is increased, the selected cell's current is increased. Assume that the selected cells' Vt is Vt0 and Vt3 for bit lines (504a) and (504b), respectively. The selected cells of (504a) and (504b) will be turned on by VR1 and VR4, respectively. Although the selected cell on bit line (504a) is turned on earlier than the selected cell on bit line (504b), the bit line (504b) will be discharged faster than the bit line (504a). Therefore, the read scheme may fail.

It should be noted that the discharging current of the conventional memory is not constant. When the cells on a string are all low Vt cells, its discharging current is higher. When the cells on a string have high Vt cells, its discharging current is lower. Therefore, the conventional memory cannot perform constant-speed bit line discharge as disclosed by the embodiments of invention.

In various exemplary embodiments, the bit line discharging current is controlled to be constant, thus the cells' Vt on a string will not affect the bit line discharging speed. The timing of the read operation is solely controlled by the time T1 for each word line voltage level. This results in a highly reliable multiple-level cell read operation.

Figure 5E:
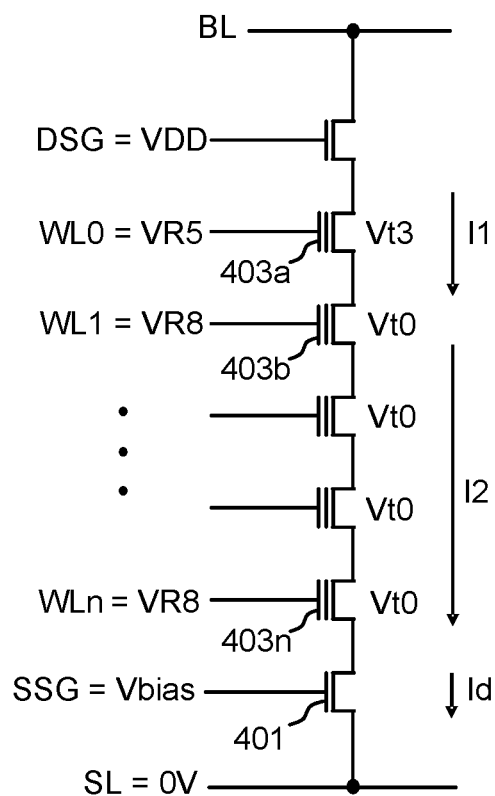
FIGS. 5E-G show read conditions according to the invention.
Figure 5F:
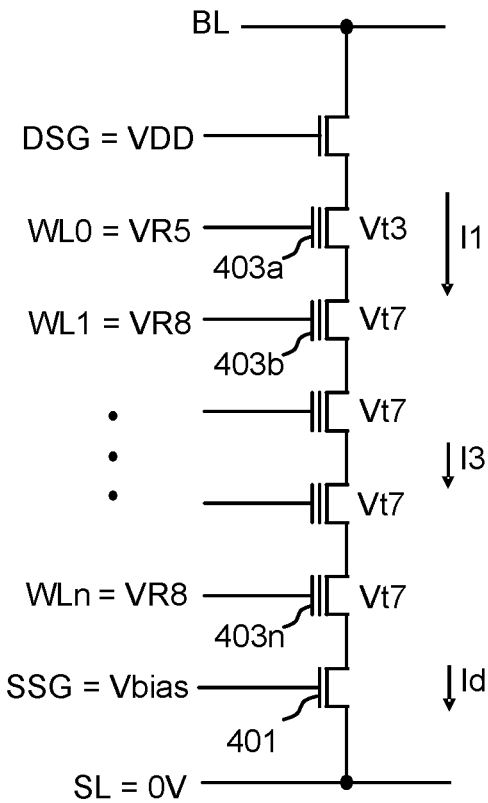
Figure 5G:
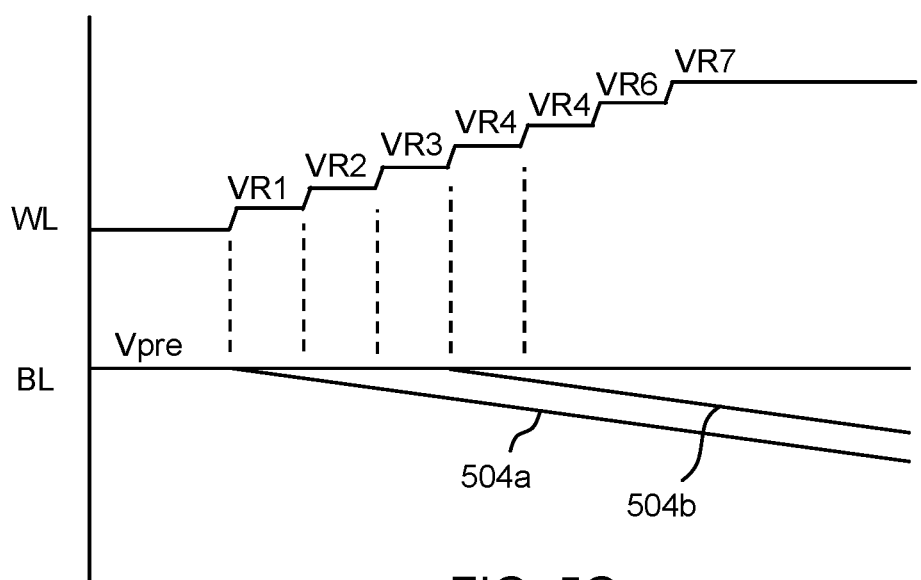

FIGS. 5E-G show read conditions according to the invention.

FIGS. 5E-F show two strings with Vt0 and Vt7 unselected cells (403b) to (403n), respectively. When applying the pass voltage, VR8, to the unselected word lines, the Vt0 and Vt7 unselected cells in FIGS. 5E-F will conduct current I2 and I3, respectively. The current I2 will be much higher than the current I3 as shown. However, in accordance with invention, the source select gate, SSG (401), is supplied with a bias voltage, Vbias. This bias voltage will limit the current through the source select gate (401) to be a constant discharging current, Id. The current Id may be equal to or lower than the lowest cell current, I3. In this way, both strings in FIGS. 5E-F will have the same discharging current.

FIG. 5G shows read operations using the configurations shown in FIGS. 5E-F. As shown in FIG. 5G, the bit lines discharge (504a) and (504b) have the same discharging speed. The same discharging speed for the two configurations results from using the constant discharging current provided by the SSG bias regardless of the Vt differences of the unselected cells.

As described above, the constant discharging current approach can be applied for both read and program-verify operations. Applying the same approach to both operations not only reduces the operation time, but also provides tracking between the read and program-verification operations and eliminates the variations caused by using different approaches.

FIGS. 6A-I show exemplary embodiments of detailed program-verify operations using constant discharging current according to the invention.

Figure 6A:
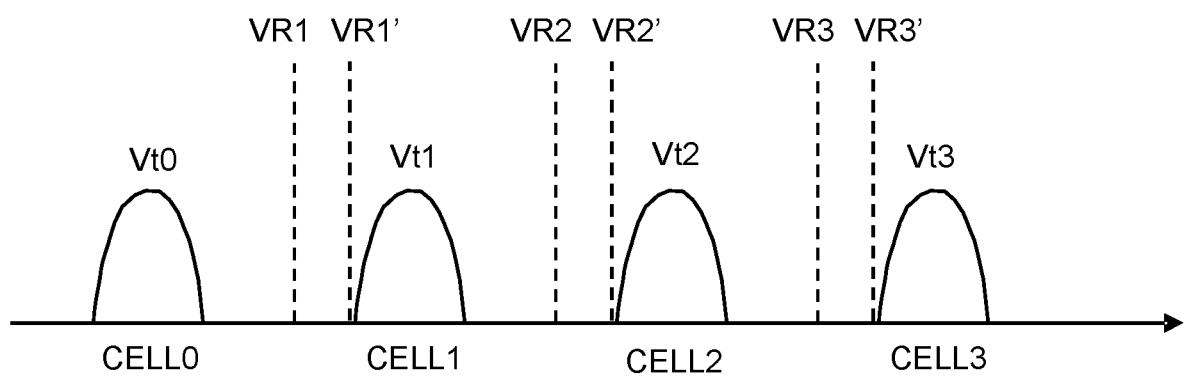
FIGS. 6A-I show exemplary embodiments of detailed program-verify operations using constant discharging current according to the invention.

FIG. 6A show an exemplary Vt distribution of four MLC (two bits per cell). Each cell can have any one of four Vt levels, Vt0 to Vt3. As illustrated, the four cells, CELL0 to CELL3, have Vt0 to Vt3, respectively. During a read operation, the word line is supplied with VR1 to VR3 to read the cells. During a program-verification, the word line is supplied with slightly higher voltages VR1' to VR3' to read the cells. This causes the cells to be programmed to the Vt slightly higher than the target Vt. This increases the cells' read margin. In case the cells' Vt dropped due to data retention or high voltage stress, the cells' data still can be read correctly.

FIGS. 6B-I show exemplary embodiments of a program-verification sequence according to the invention. It will be assumed that four cells, CELL0 to CELL3 are programmed to Vt0 to Vt3 as shown in FIG. 6B, FIG. 6D, FIG. 6F, and FIG. 6H, and verified by the waveforms shown in FIG. 6C, FIG. 6E, FIG. 6G, and FIG. 6I, respectively.

Figure 6B:
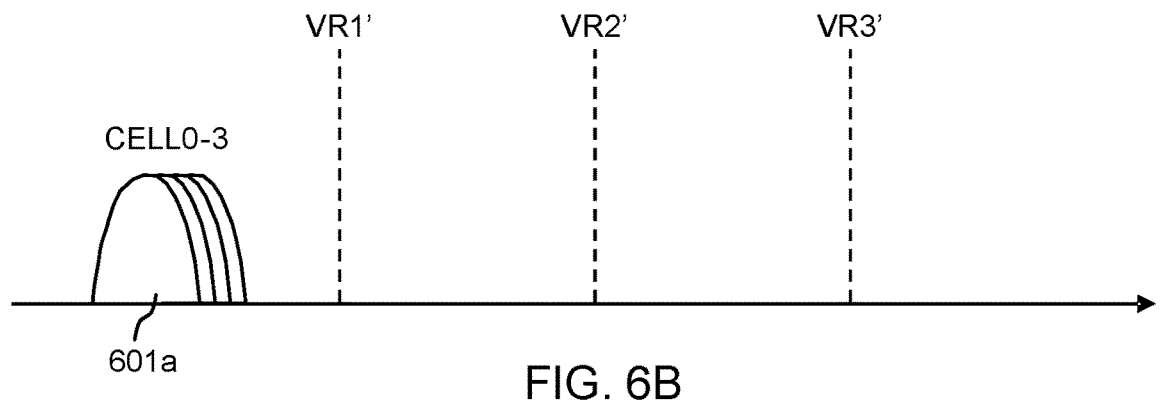

FIG. 6B shows that the four cells, CELL0 to CELL3, are initially in an erased state, Vt0, as shown (601a).

Figure 6C:
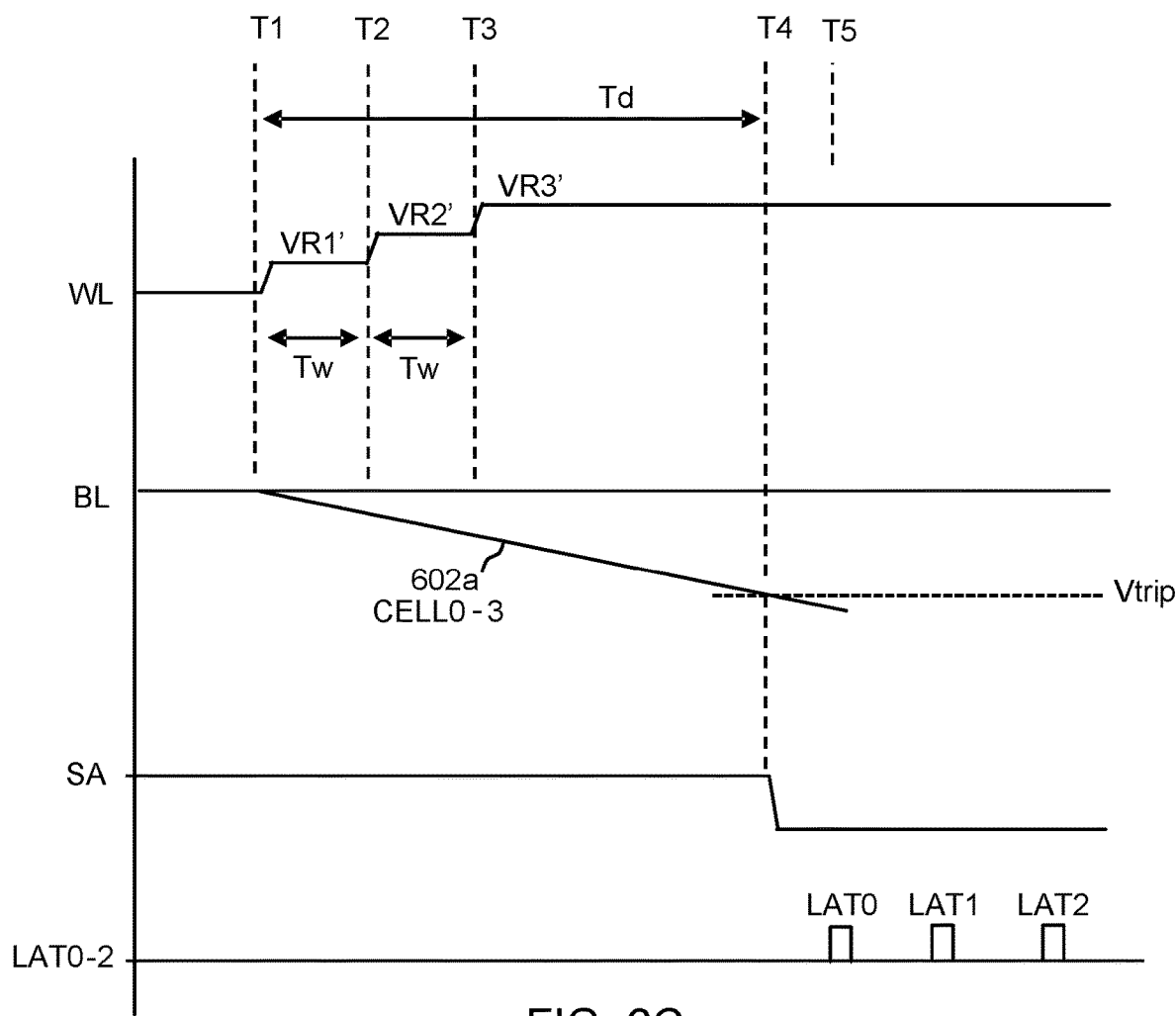

FIG. 6C shows an exemplary program-verification operation for Vt0 according to the invention. From time T1 to T3, the word line is sequentially supplied with the program-verify voltage, VR1' to VR3', with a period Tw (time interval) for each level. At time T1, when the word line is supplied with VR1', all of CELL0 to CELL3 will turn on to discharge the bit lines as shown (602a). Therefore, after a discharging time Td, that ends at time T4, all the bit lines are discharged to the trip point of the sense amplifier, Vtrip. All the data of SA are flipped from 1 to 0. At time T5, when the latch pulse LAT0 is applied, it will latch all the cells' SA data as 0. That indicates all the cells' Vt are below VR1'. Because the target Vt of CELL0 is Vt0, the CELL0 will be supplied with an inhibit voltage to stop programming. CELL1 to CELL3 will be supplied with a program voltage to continue the programming in the next program pulse.

Figure 6D:
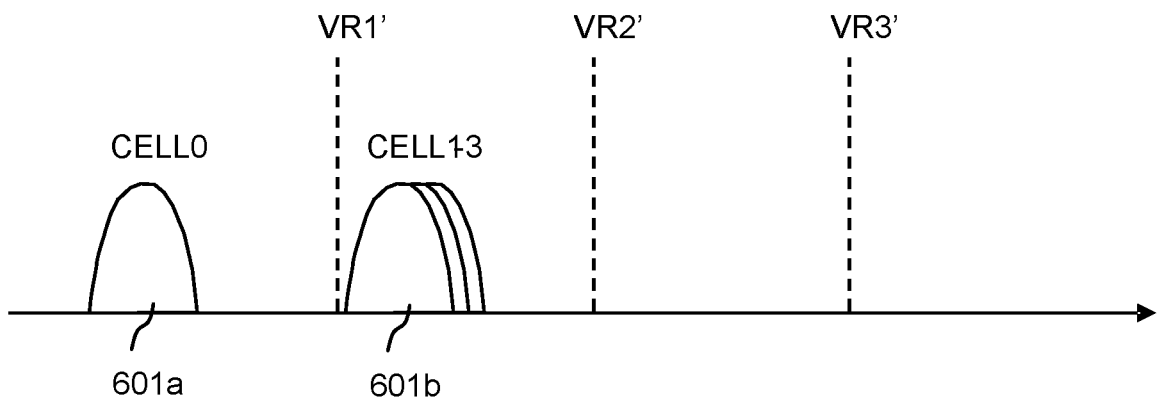

FIG. 6D shows the Vt distribution of CELL0 to CELL3 after the next program pulse. It will be assumed that CELL1 to CELL3 are programmed to a Vt that is higher than VR1', as shown (601b). Cell0 remains at Vt0 as shown (601a).

Figure 6E:
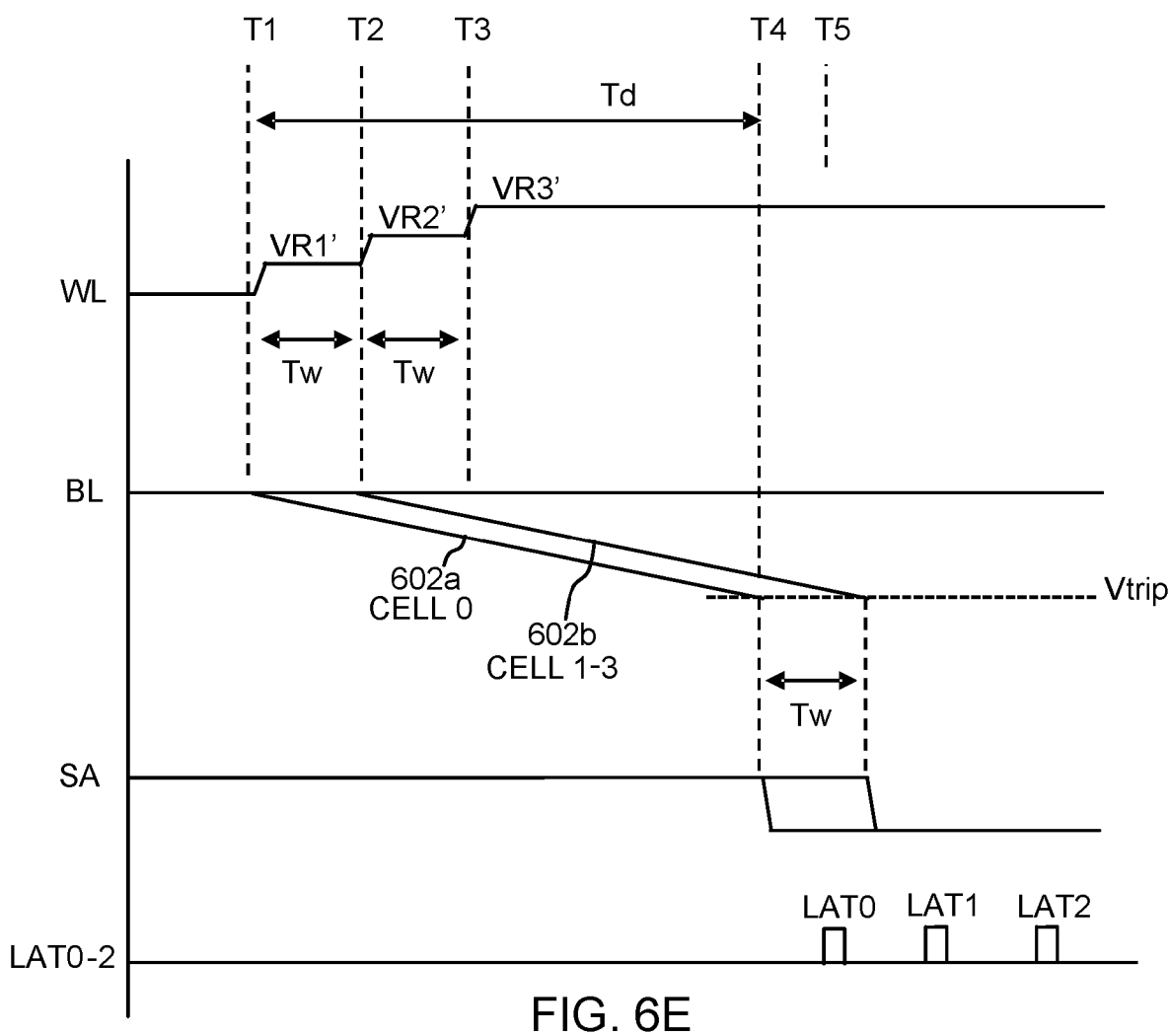

FIG. 6E shows exemplary program-verification operation for CELL1 to CELL3. At time T1, the word line is supplied with VR1' and only CELL0 will be turned on to discharge the bit line as shown (602a). CELL1 to CELL3 will remain off. At time T2, the word line is ramped up to VR2', which will turn on CELL1 to CELL3, thus their bit lines will be discharged as show (602b). After the discharge time Td, at T5 time, the latch pulse LAT0 will latch CELL0's SA data 0 as on-cell, and CELL1 to CELL3's SA data 1 as off-cell. That indicates CELL1 to CELL3 are already programmed to a Vt higher than VR1'. Because CELL1 already reaches its target Vt, the bit line of CELL1 will be supplied with an inhibit voltage to stop programming CELL1. CELL2 and CELL3 will be supplied with the program voltage to continue the programming in the next program pulse.

Figure 6F:
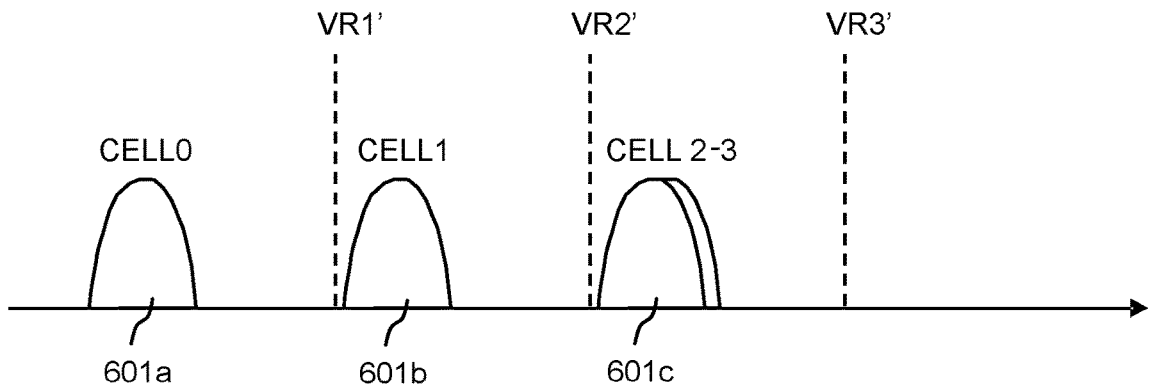

FIG. 6F illustrates the Vt distribution of CELL0 to CELL3 after the next program pulse. It will be assumed CELL2 and CELL3 are programmed to a Vt higher than VR2', as shown (601c).

Figure 6G:
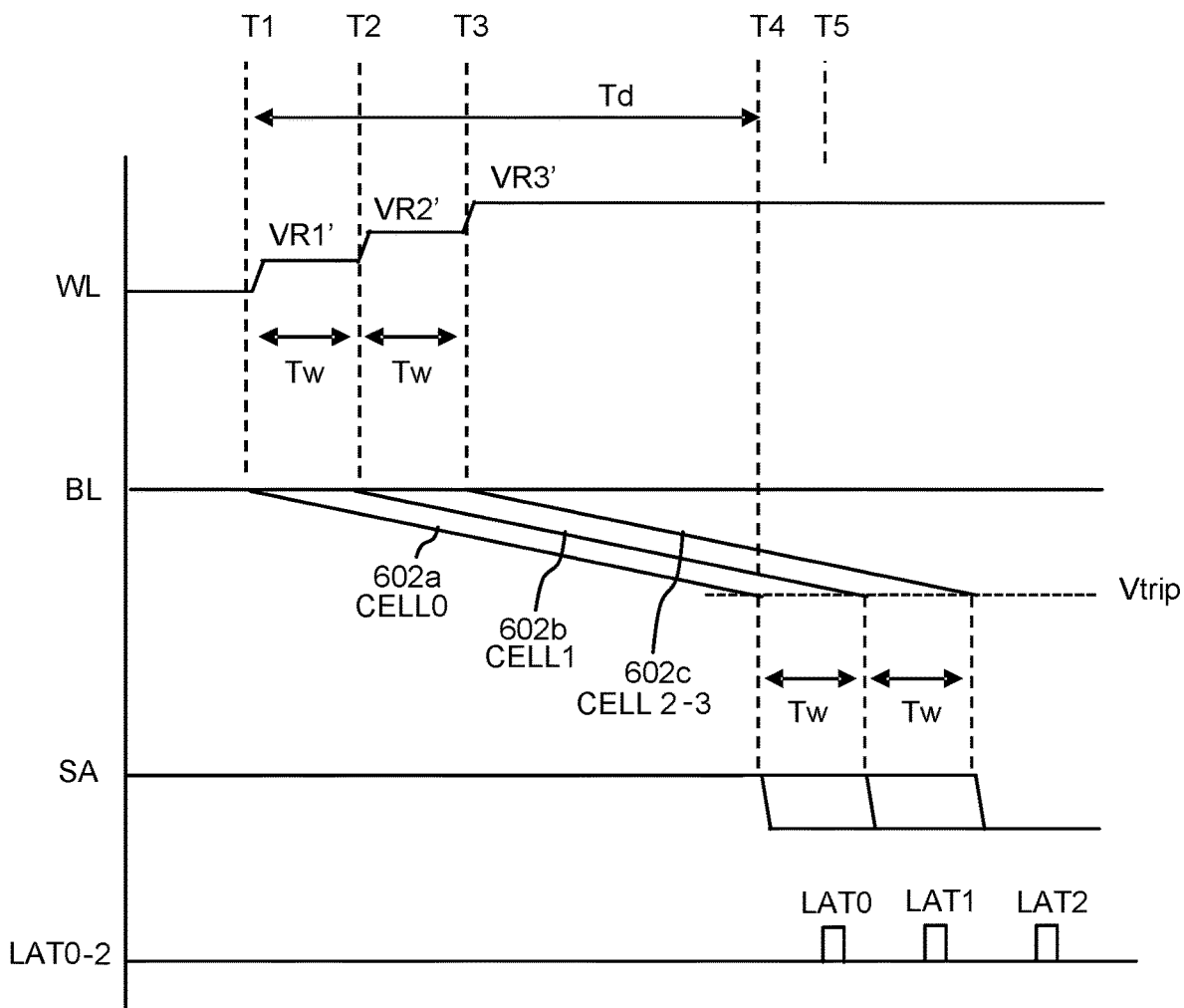

FIG. 6G shows exemplary program-verification operations for CELL2 and CELL3. At times T1 and T2, when the word line is supplied with VR1' and VR2', respectively, it will only turn on CELL0 and CELL1 to discharge their bit lines as shown (602a) and (602b), respectively. CELL2 to CELL3 will remain off until the word line is supplied with VR3' at time T3. CELL2 and CELL3 will discharge their bit lines as shown (602c). After the discharge time Td, at time T5, the latch pulses LAT0 and LAT1 are sequentially applied to latch the SA data of CELL0 to CELL3. LAT0 will latch CELL0' SA data 0 as on-cell. LAT1 will latch CELL1's SA data 0 as on-cell. Both LAT0 and LAT1 will latch CELL2 to CELL3's SA data 1 as off-cells. That indicates CELL2 and CELL3 are already programmed to a Vt higher than VR2'. Because CELL2 has already reached its target Vt, the bit line of CELL2 will be supplied with an inhibit voltage to stop programming CELL2. CELL3 will be supplied with the program voltage to continue the programming in the next program pulse.

Figure 6H:
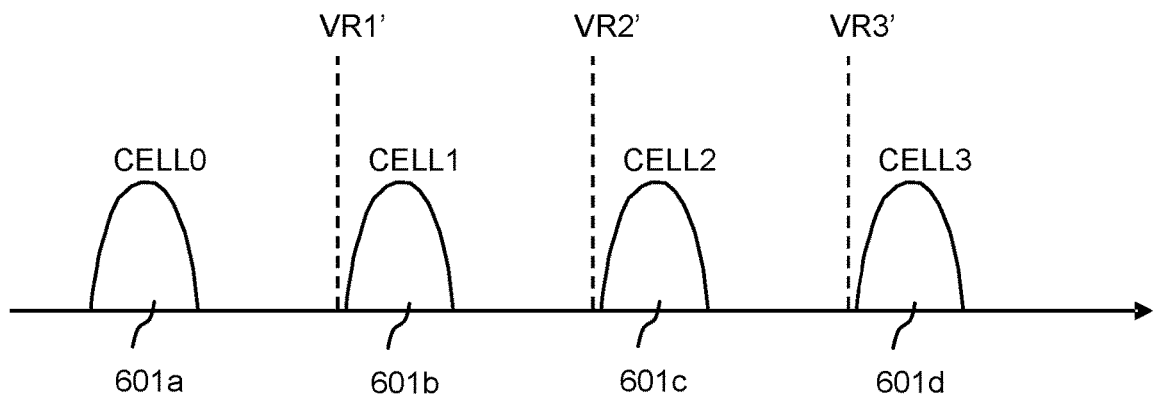

FIG. 6H illustrates the Vt of CELL0 to CELL3 after the next program pulse. It will be assumed that CELL3 is programmed to Vt higher than VR3', as shown at (601d).

Figure 6I:
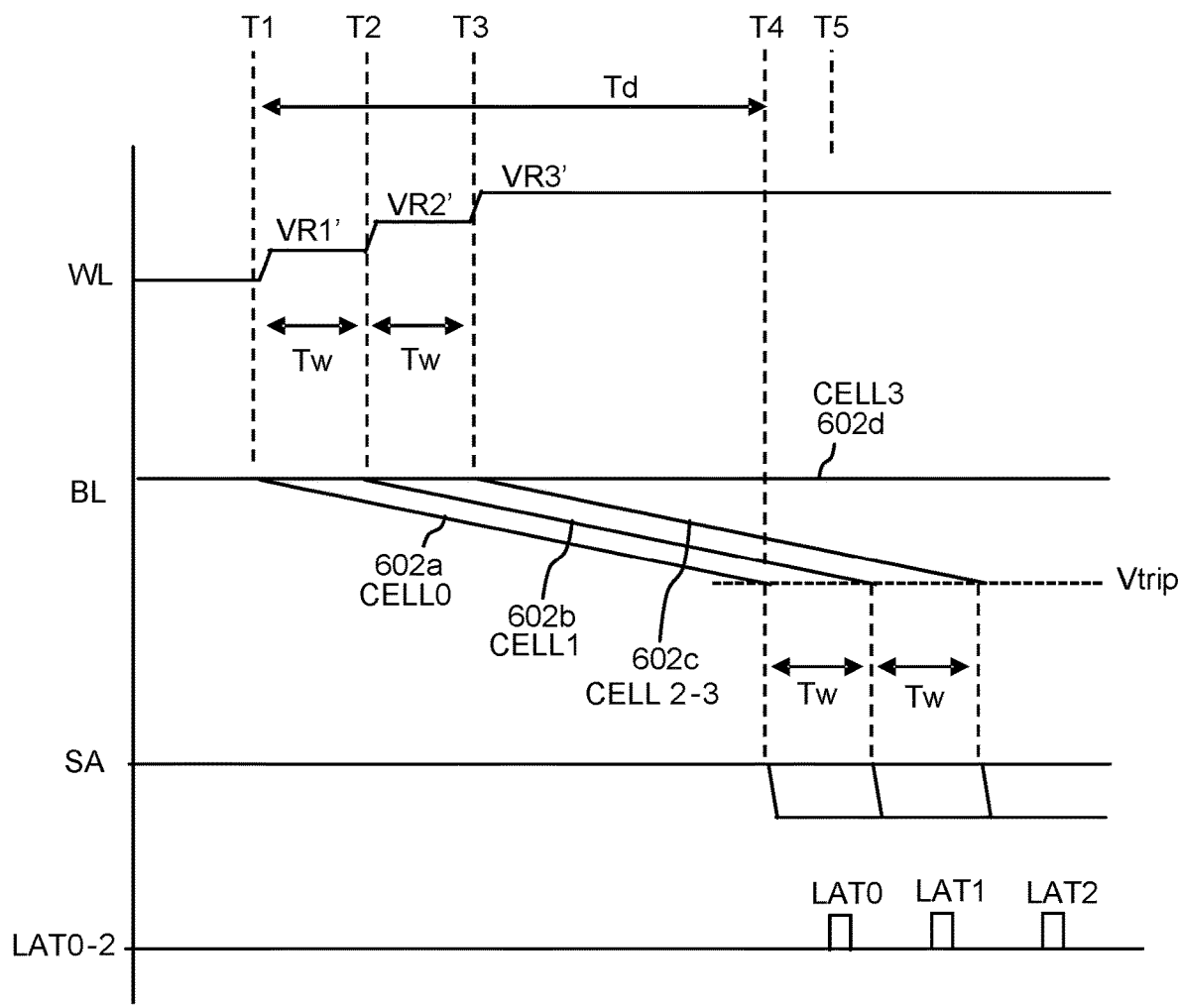

FIG. 6I shows exemplary program-verification operations for CELL3. From time T1 to T3, when the word line is supplied with VR1', VR2' and VR3', respectively, it will turn on CELL0, CELL1, and CELL2 to discharge their bit lines as shown (602a), (602b), and (602c), respectively. CELL3 will remain off because its Vt is higher than VR3'. The bit line of CELL3 will remain un-discharged as shown (602d). After discharging time Td, at time T5, the latch pulses LAT0, LAT1, and LAT2 are sequentially applied to latch the SA data of CELL0 to CELL3. The latch pulses LAT0, LAT1, and LAT2 will latch CELL0, CELL1, and CELL2' SA data 0 as on-cells, respectively, and latch CELL3's SA data 1 as off-cell. That indicates that the Vt of CELL3 is higher than VR3'. Therefore, CELL3 has already reached its target Vt.

By using the program-verify operations shown in FIGS. 6A-I, CELL0 to CELL3 are successfully programmed to Vt0 to Vt3, respectively. Because only one discharge cycle is required instead of three to verify the TLC cells, the program-verify operation according to the invention reduces the program-verify time to ⅓ of the conventional approach.

Figure 7A:
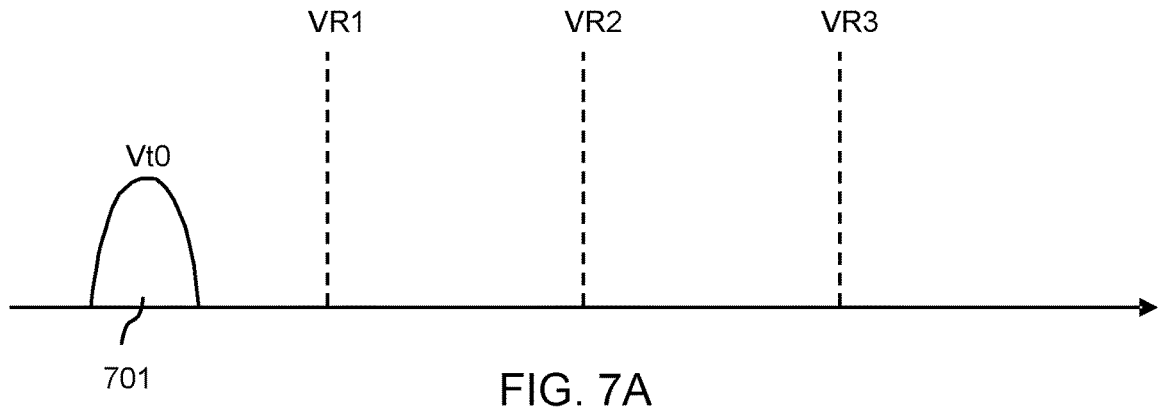
FIGS. 7A-B show exemplary embodiments according to the invention to determine the discharging time Td for the timing of the latch signals LAT0 to LAT2.
Figure 7B:
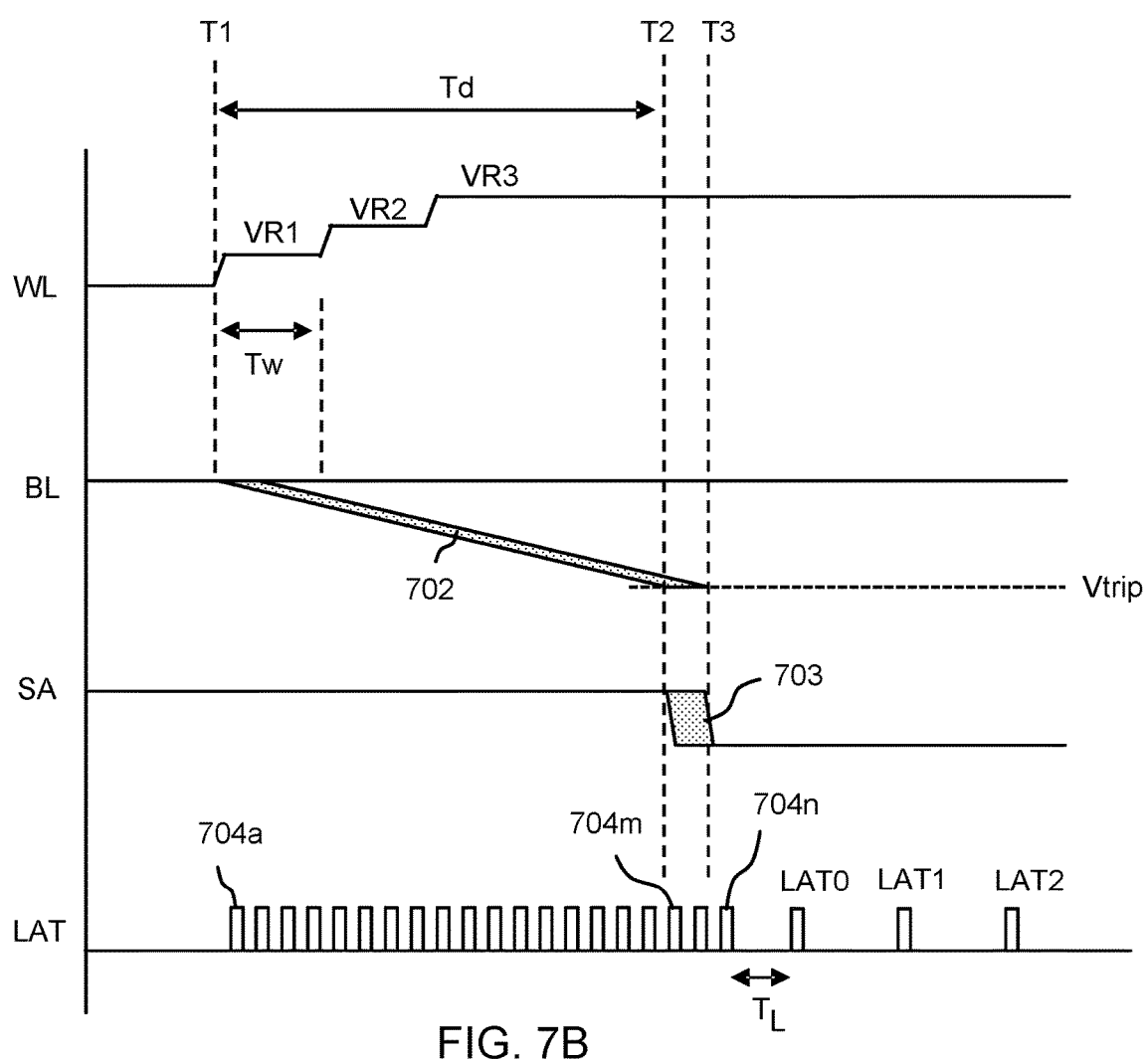

FIGS. 7A-B show exemplary embodiments according to the invention to determine the discharging time Td for the timing of the latch signals LAT0 to LAT2.

FIG. 7A illustrates that after an erase operation, all the cells in a block are erased to Vt0, as shown (701).

FIG. 7B shows an exemplary program-verify operation. At time T1, when the word line is supplied with the VR1 voltage, the Vt0 cells will discharge the bit lines as shown voltage, (702). Because there are multiple cells, the discharging bit lines (702) have a distribution due to the variation of cell current and bit line capacitance. However, because the bit lines are discharged by a constant current, the discharging speeds of the bit lines are near constant, regardless the cells' Vt. Therefore, the distribution of (702) is much narrower than the Vt distribution (701) shown in FIG. 7A.

During time T2 to T3, when the bit lines (702) are discharged to the trip point of sense amplifiers, Vtrip, the SA data of the bit lines are flipped from 1 to 0 as shown (703).

From time T1, the system or the control logic of the chip continuously sends "detecting" latch pulses (704a) to (704n) to check the data of the SA. High-frequency latch pulses (704a) to (704n) are used to increase the accuracy of detection. From time T1 to T2, the SA data are 1. Therefore, the SA data latched by the detecting latch pulses (704a) to (704m-1) are always 1. At time T2, the detecting latch pulse (704m) will latch the first SA data 0. This indicates the first bit line in (702) is discharged the trip point, Vtrip. Therefore, the system or the control logic of the chip may stop sending the detecting latch pulses and generate the real latch pulses LAT0 to LAT2 after a proper delay time, TL, to read the cells.

In another embodiment, at T3 time, the detecting latch pulse (704n) will latch all SA data 0. That means all the bit lines in (702) are discharged to the trip point, Vtrip. The system or the control logic of the chip stops sending the detecting latch pulses and generates the real latch pulses LAT0 to LAT2 after a proper delay time, TL, to read the cells. By using this approach, the discharging time, Td, can be detected in real chips according to the real bit line capacitance and cell currents. Therefore, accurate timing for the latch signals LAT0 to LAT2 can be determined.

In one embodiment, the operation shown in FIG. 7B is performed during a manufacturing test. The tester uses this operation to determine the timing of LAT0 to LAT2, and then programs the timing to the control logic of the chip. After that, the chip uses the fixed timing of LAT0 to LAT2 to read the cells. In another embodiment, the operation in FIG. 7B is performed on the chip. The control logic of the chip uses this operation to find the timing of LAT0 to LAT2 from the erased cells, and then applies the timing to the program-verify and read operations.

In another embodiment, the operations are used during every read operation to determine the timing of LAT0 to LAT2 from the selected cells. However, during read operation, it is not guaranteed that there are always Vt0 cells in the selected page. To address this, in another embodiment according to the invention, the discharging time Td is determined by using reference bit lines as shown in FIG. 8A.

Figure 8A:
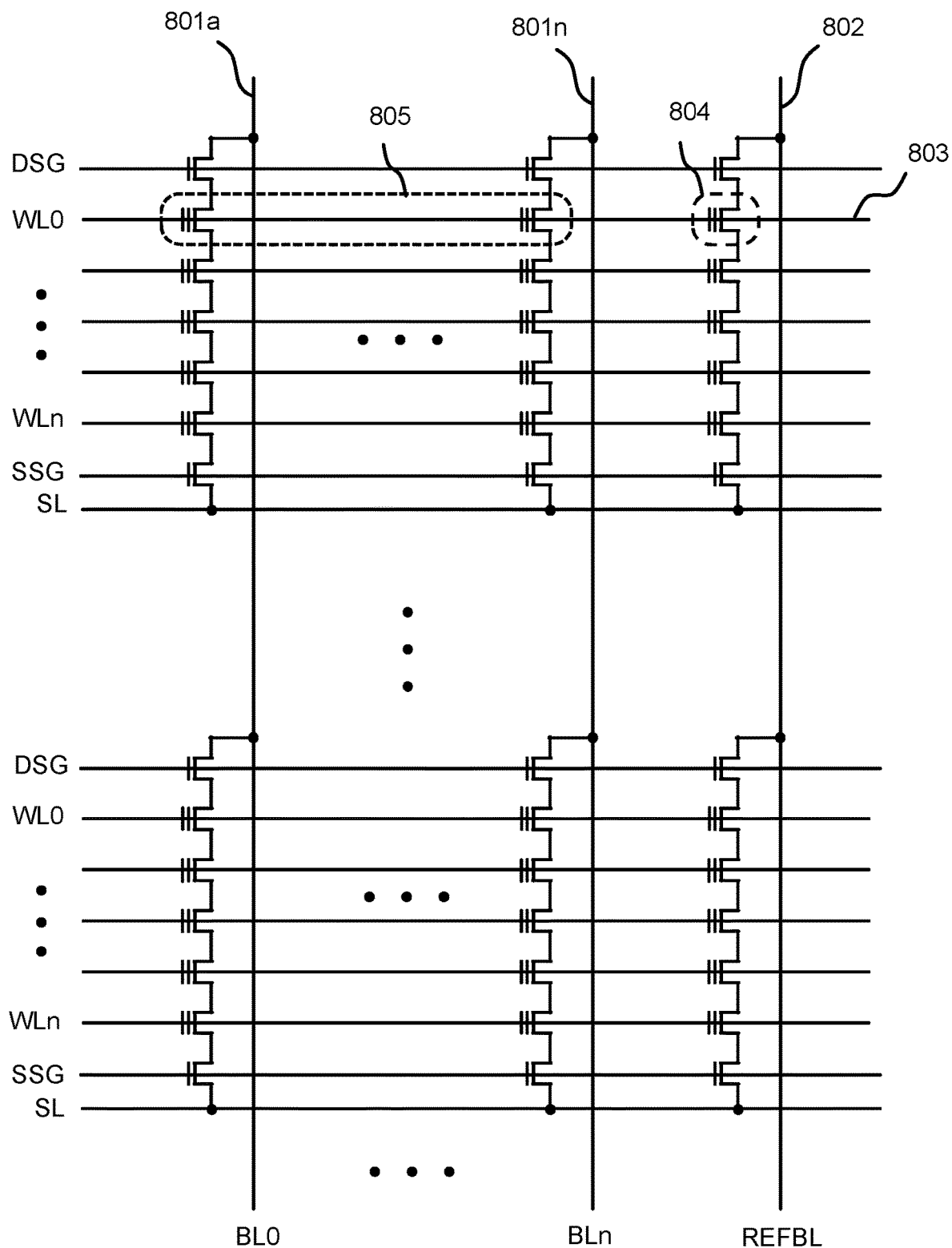
FIG. 8A shows an embodiment of an array architecture with a reference bit line.

FIG. 8A shows an embodiment of an array architecture with a reference bit line. For example, FIG. 8A shows bit lines (801a) to (801n) and a reference bit line (802) (REFBL). The cells on the reference bit line (802) can be erased to Vt0 with the cells on the regular bit lines (801a) to (801n) during a block erase operation. During a program operation for cells on WL0 803, the reference bit line (802) is supplied with an inhibit voltage, or the program voltage for Vt0. Therefore, the selected reference cell (804) will remain at Vt0, while the regular bit lines (801a) to (801n) are supplied with the program data to program the selected cells (805).

During program-verification and read operation, the selected word line (803) will turn on the reference cell (804) to discharge the reference bit line (802) to determine the discharging time Td and generate the timing for LAT0 to LAT2 to read the selected cells (805). Because the reference cell (804) is located in the same word line (803) as the selected cells (805), it can provide tracking for process and device variations, such as bit line capacitance, word line delay, cell geometry, operation voltage, etc.

In accordance with the invention, the reference cell (804) is not limited to a memory cell. The reference cell may be implemented by any suitable device, such as a single-poly cell, transistor, or mask ROM (read-only-memory) cell, etc. These variations and modifications are within the scope of the invention.

In another embodiment, the array can contain multiple reference bit lines in different locations of the array.

Figure 8B:
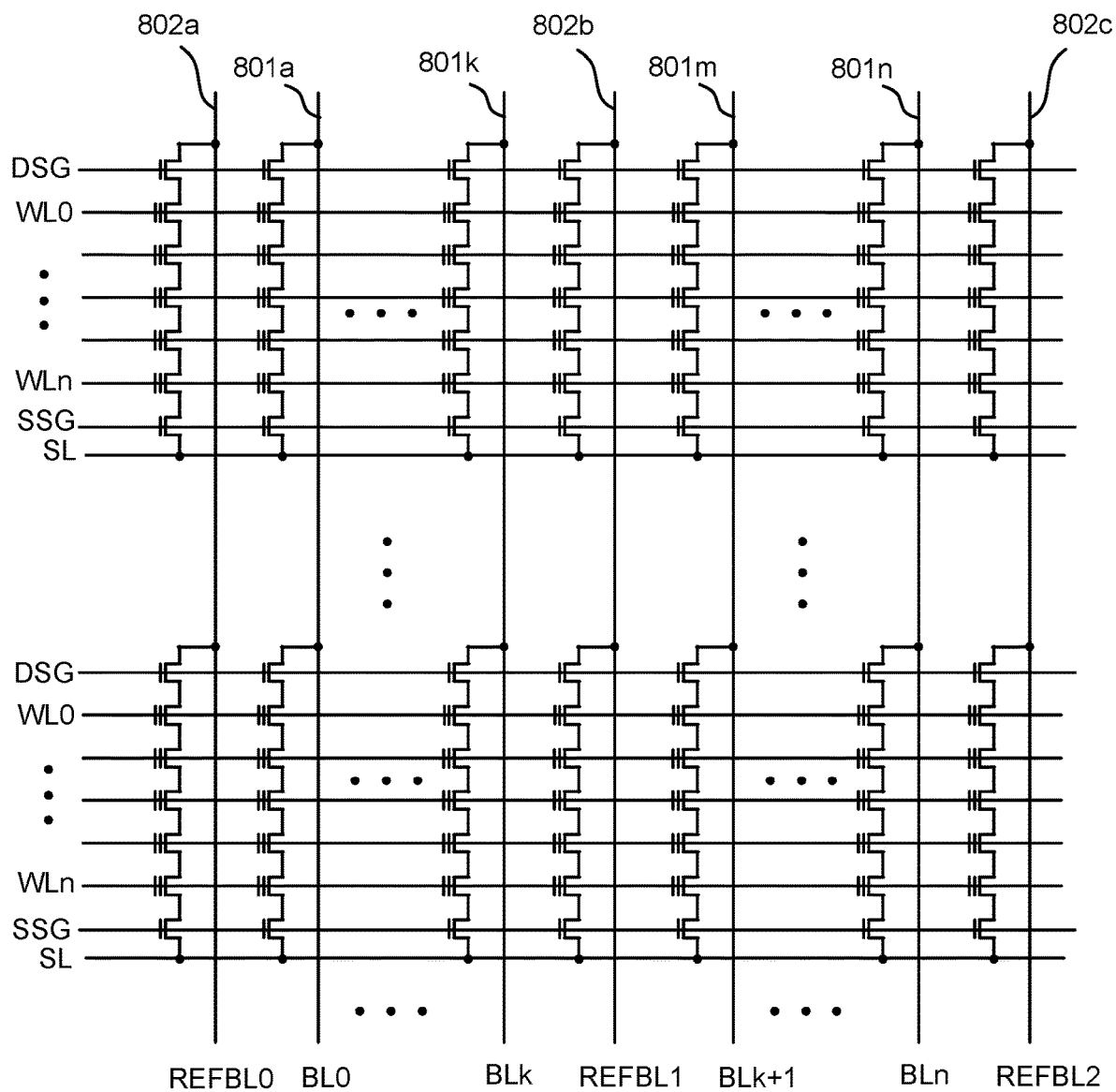
FIG. 8B shows an array that comprises multiple reference bit lines in the middle and two sides of the array.

FIG. 8B shows an array that comprises multiple reference bit lines (802a) to (802c) (REFBL0-2) in the middle and two sides of the array as shown. The array includes regular bit lines (801a) to (801n) (BL0-n). Using multiple reference bit lines can provide better tracking for the cells' Vt variation and word line delay in different locations in the array. In another embodiment, the reference bit lines are located in a mini array outside the regular array. In this way, the reference cells' Vt can be specially trimmed to a desired value to provide more flexibility for margin adjustment for program-verify and read operations. Moreover, the reference cells can be supplied with different word line voltage from the regular array to provide more flexibility for the timing control of the latch pulses.

Figure 9A:
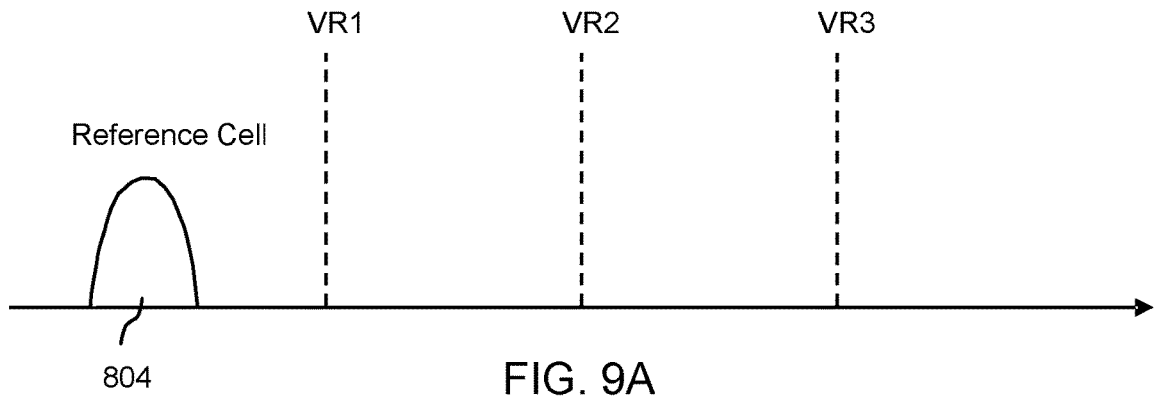
FIGS. 9A-B show an exemplary embodiment array operation using reference cells to determine the timing of latch pulses LAT0 to LAT2.
Figure 9B:
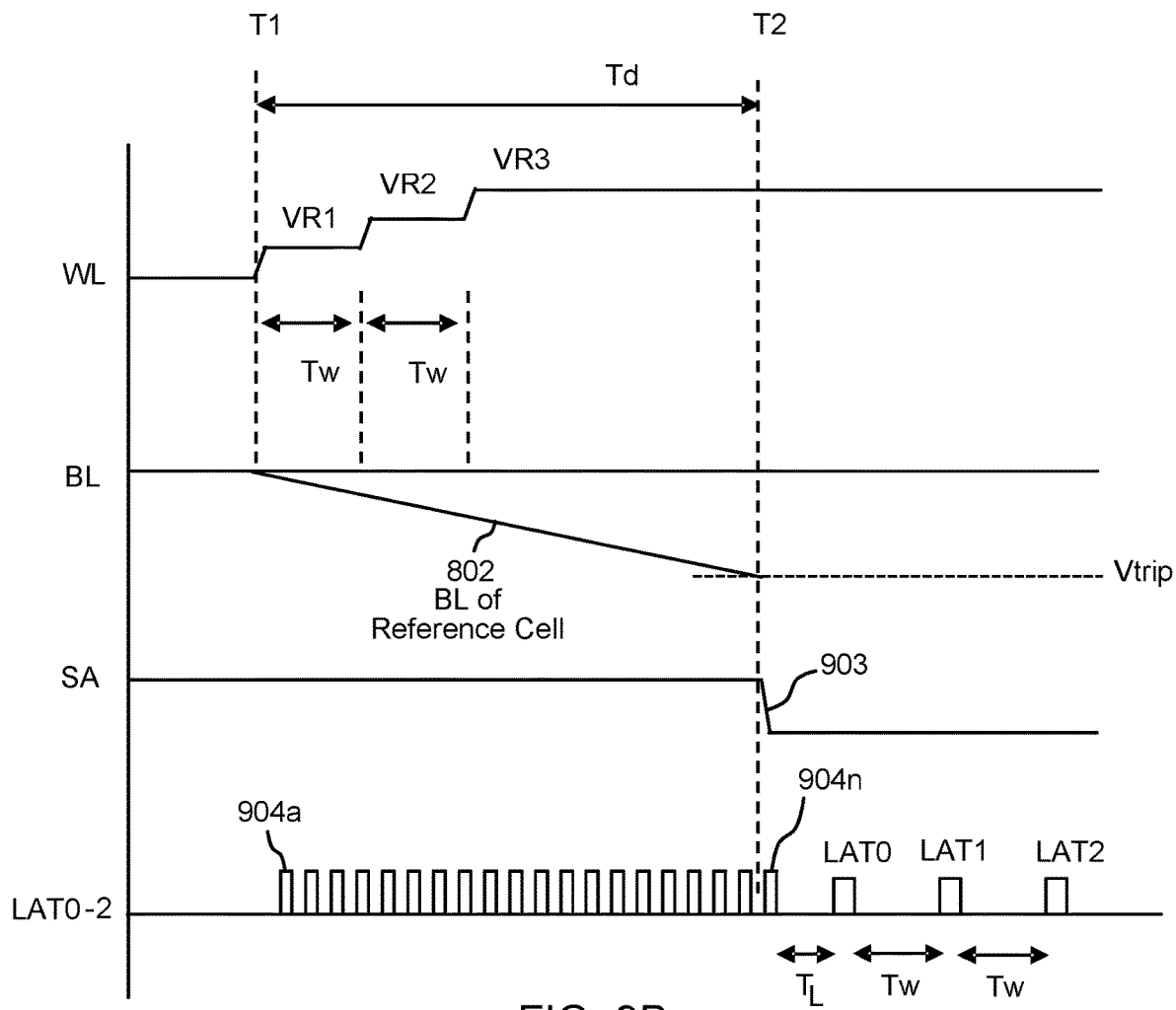

FIGS. 9A-B show an exemplary embodiment array operation using reference cells to determine the timing of latch pulses LAT0 to LAT2.

FIG. 9A shows a Vt distribution of a reference cell (804), which may be erased to Vt0 during erase operation. The reference cell (804) can be located in the reference bit line (802) shown in FIG. 8A.

FIG. 9B shows a waveform diagram that illustrates the use of the reference cell (804). At time T1, the selected word line is sequentially supplied with VR1 to VR3 to read the normal cells. At time T1, the reference cell (804) is turned on and starts discharging the reference bit line as shown (802). The control logic of the chip continuously applies 'detecting' latch pulses (904a) to (904n) to check the SA data. At time T2, when the reference bit line (802) is discharged to the trip point of the sense amplifier, Vtrip, it will flip the SA data from 1 to 0, as shown in (903). The latch pulse (904n) will detect this condition. Because the reference bit line and the normal bit lines have similar capacitance, they have a similar discharging time, Td. Therefore, the control logic can stop sending the detecting latch pulses and generate the real latch pulses LAT0 to LAT2 after a proper delay time, TL, to latch the SA data of the normal cells.

Figure 9C:
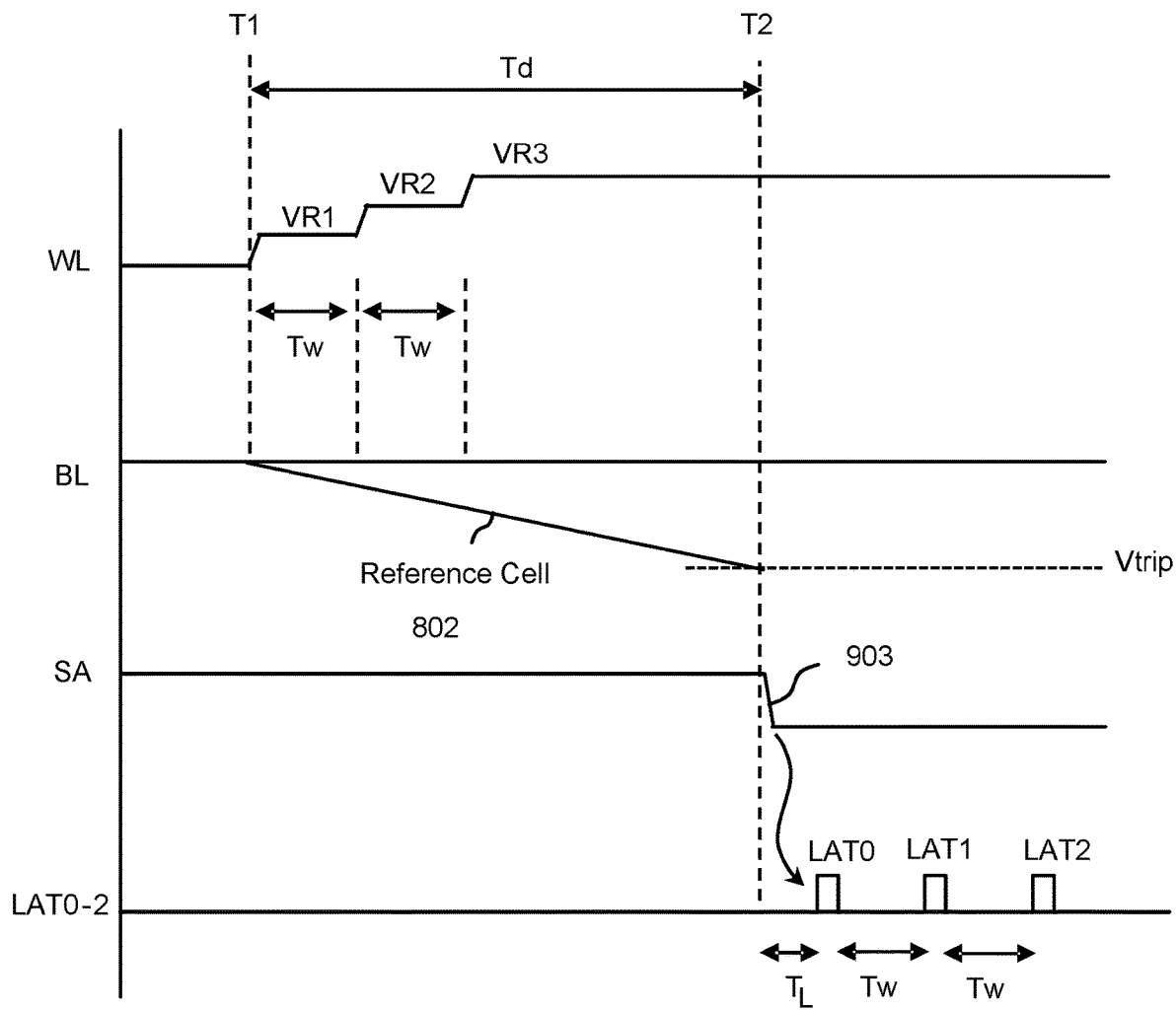
FIG. 9C shows another embodiment of a timing diagram illustrating the use of the reference cell to determine the timing of latch pulses LAT0 to LAT2.

FIG. 9C shows another embodiment of a timing diagram illustrating the use of the reference cell to determine the timing of latch pulses LAT0 to LAT2. This embodiment is similar to FIG. 9B except that the detecting latch pulses (904a) to (904n) are eliminated. Instead, the control logic directly monitors the SA output of the reference bit line (802). At time T2, when the SA output of the reference bit line (802) is flipped from 1 to 0, as shown in (903), the control logic detect this condition and then generate the latch pulses LAT0 to LAT2 after a proper delay time, TL, to latch the SA data of the normal cells.

Figure 10A:
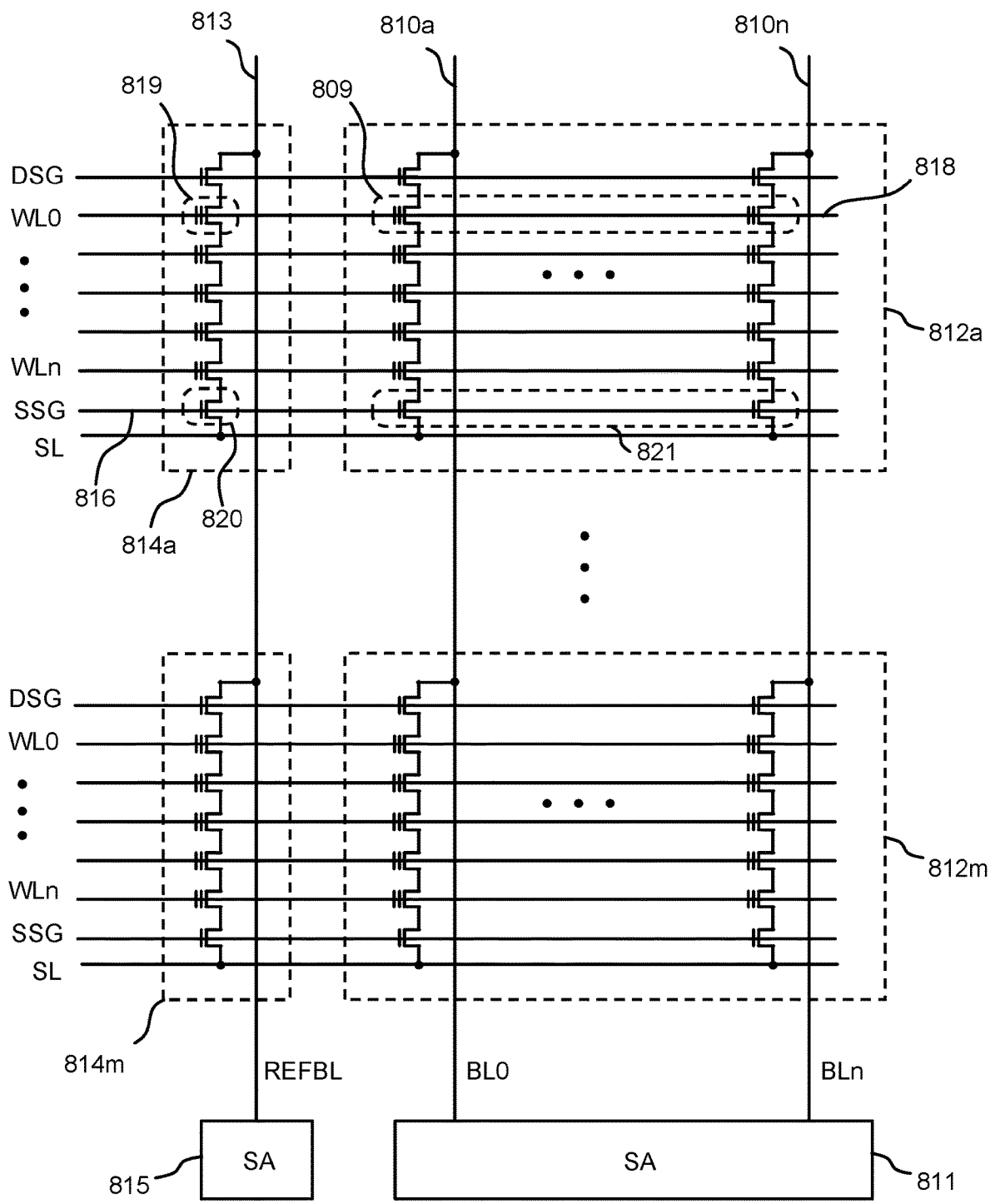
FIG. 10A shows a memory architecture that includes an embodiment of a reference bit line implementation in accordance with the waveform diagram shown in FIG. 9C.

FIG. 10A shows a memory architecture that includes an embodiment of a reference bit line implementation in accordance with the waveform diagram shown in FIG. 9C. The architecture includes bit lines (810a) to (810n) and a reference bit line (813). The bit lines (810a) to (810n) are connected to sense amplifier circuits (811). The reference bit line (813) is connected to a sense amplifier circuit (815). It is assumed that the strings (812a) and (812m) are located in the far side and the near side of the array, respectively, from the sense amplifiers (811). Due to the bit line resistance and capacitance, which result in an (RC) delay, the bit line discharging time of the strings (812a) may be longer than the strings (812m).

To address this issue, the reference strings (814a) and (814m) on the reference bit line (813) provide tracking for the discharging time difference between the regular strings (812a) and (812m). For example, assuming that the word line (818) in the string (812a) is selected. In accordance with the invention, the signal SSG (816) is supplied with a bias voltage that is passed to the source select gates (820) and (821) to limit the discharging current of the regular strings (812a) and also the reference string (814a). When the selected word line (818) is supplied with the read voltage, it will turn on the selected cells (809) and the reference cell (819) to start discharging the regular bit lines (810a) to (810n) and the reference bit line (813). Although the threshold voltage of the reference cell (819) and the regular cells (809) are different, because the discharging current is limited by the source select gate (816) instead of the cells, the discharging speeds of the reference bit line (813) and the regular bit lines (810a) to (810n) are similar.

Due to the reference string (814a) and the selected strings (812a) being located in the same far side from the sense amplifiers (815) and (811), the RC delay for the reference bit line (813) and the regular bit lines (811a) to (811n) are similar. Similarly, when the strings (812m) in near-side block are selected, the reference string (814m) will be selected to provide RC delay tracking.

By using this configuration, when the reference bit line (813) is discharged to the trip point of the sense amplifier (815), it flips the SA (815) output data from 1 to 0, as shown at (903) in FIG. 9C. Then, the control logic may detect the SA (815) signal 0 to generate the latch pulses LAT0 to LAT2 to the sense amplifier (811) in FIG. 10A to latch the SA data of the regular bit lines (810a) to (810n).

Figure 10B:
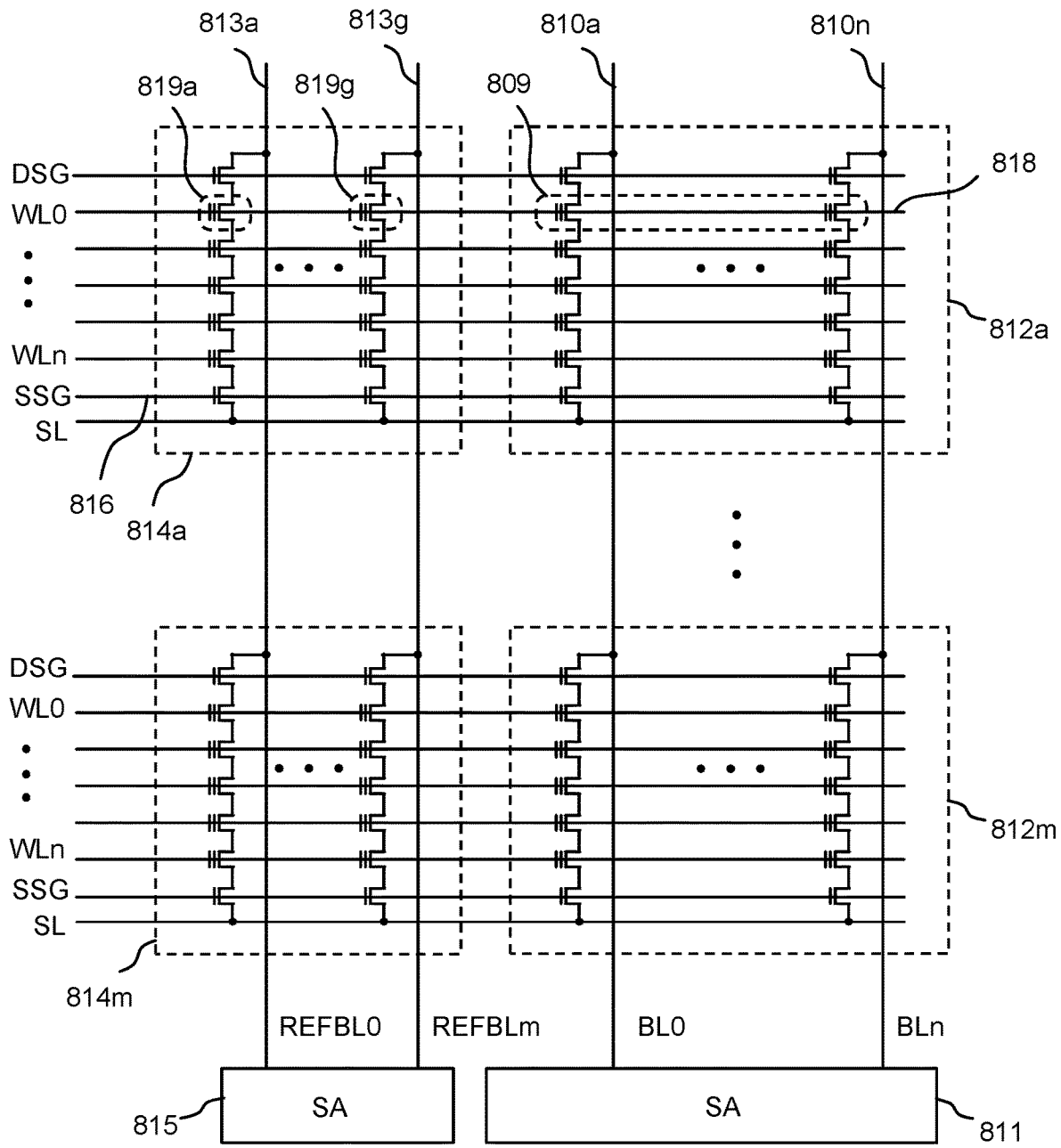
FIG. 10B shows another embodiment of the reference bit line implementation according to the invention.

FIG. 10B shows another embodiment of the reference bit line implementation according to the invention. In this embodiment, the array contains multiple reference bit lines (813a) to (813g). The reference cells on the reference bit lines (813a) to (813g) may have different threshold voltages. For example, in one embodiment, the array may have seven reference bit lines (813a) to (813g). The reference cells on the reference bit lines (813a) to (813g) may be programmed to have voltage threshold levels Vt0' to Vt6', respectively.

Figure 10C:
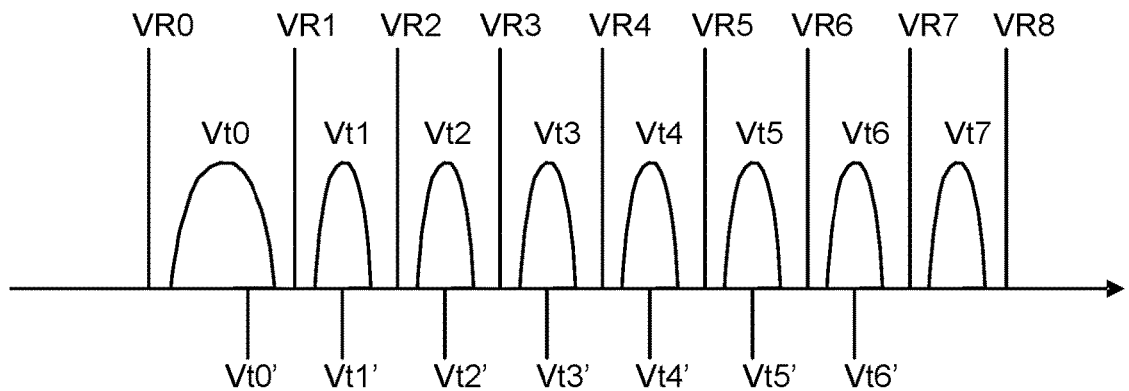
FIG. 10C shows an exemplary Vt distribution for the reference cells, Vt0' to Vt6', and the normal cells, Vt0 to Vt7, shown in FIG. 10B.

FIG. 10C shows an exemplary Vt distribution for the reference cells, Vt0' to Vt6', and the normal cells, Vt0 to Vt7, shown in FIG. 10B.

In this embodiment, because the discharging current is controlled to be constant by the source select gate, drain select gate, or dummy cell, as shown in FIGS. 4A-F, the reference cells and normal cells are operating like switches. When the reference cells or normal cells are turned on, they will conduct the same constant discharging current, regardless the cells' Vt. For example, in FIG. 10C, the normal cells with Vt0 and the reference cell with Vt0' will conduct the same discharging current. Therefore, the reference cells' Vt0' to Vt6' may be the same as the normal cells' Vt0 to Vt6, respectively. The reference cells' Vt do not need to be placed between the normal cells' Vt levels.

Figure 10D:
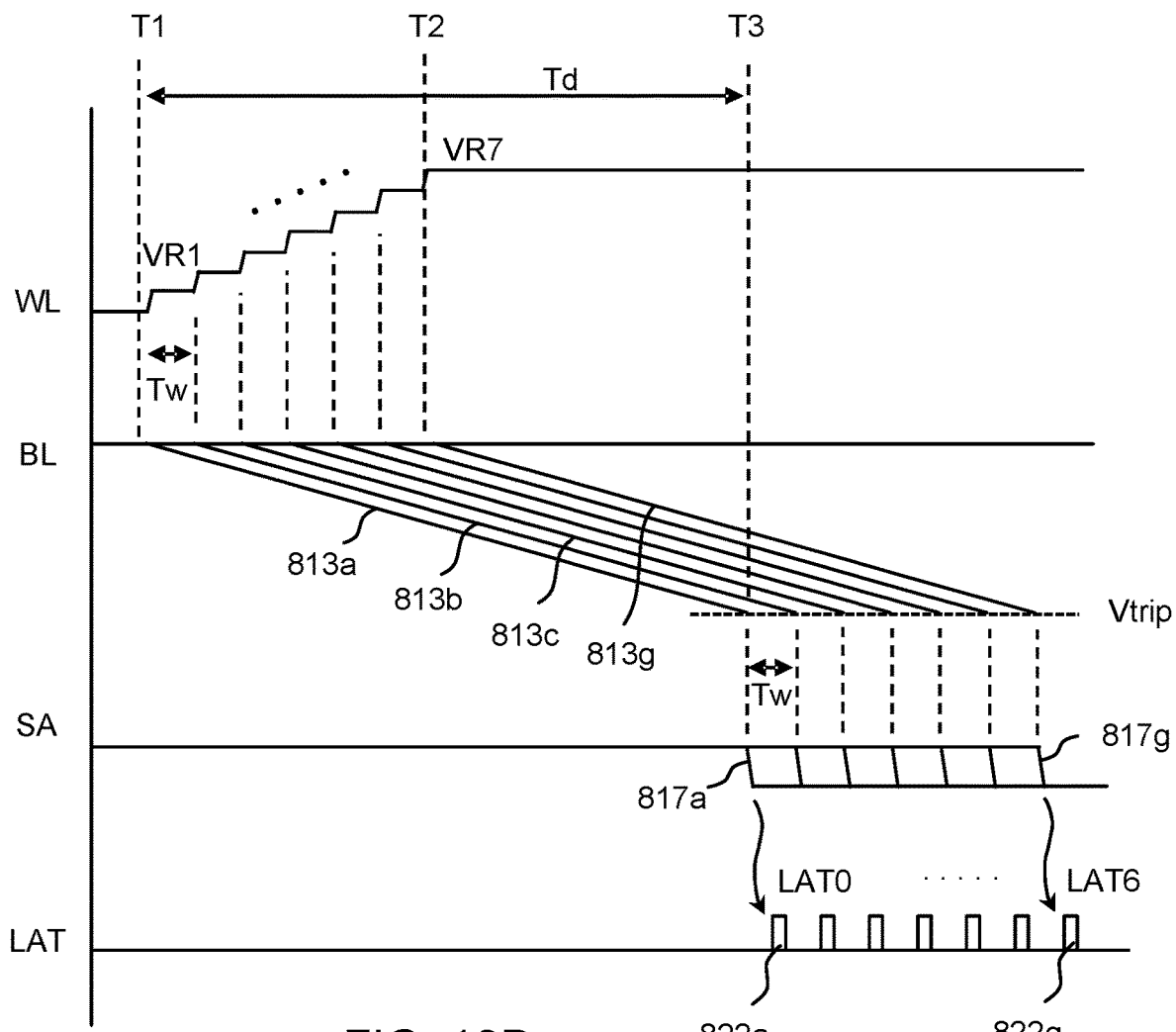
FIG. 10D shows the read and program-verify operations using the reference cells Vt0' to Vt6' shown in FIG. 10B.

FIG. 10D shows the read and program-verify operations using the reference cells Vt0' to Vt6' shown in FIG. 10B. From time T1 to time T2, when the selected word line (818) is supplied with the read voltages VR1 to VR7, it will sequentially turn on the cells having voltage threshold levels Vt0 to Vt7 to discharge the bit lines (not shown). Meanwhile, it also turns on the reference cells having voltage threshold levels Vt0' to Vt6' to discharge the reference bit lines (813a) to (813g).

At time T3, when the reference bit lines (813a) to (813g) are sequentially discharged to the trip point of the sense amplifiers, Vtrip, the reference bit lines (813a) to (813g) will sequentially flip the SA data from 1 to 0 as shown at (817a) to (817g). The reference bit lines' sense amplifier (815) shown in FIG. 10B or the control logic of the chip may detect these conditions and generate the latch pulses LAT0 (822a) to LAT6 (822g) to latch the SA data of the normal bit lines. Thus, this configuration provides tracking for the bit line discharging time between the reference cells and normal cells.

In addition to the strings' location, for current advanced 3D NAND flash memory, the number of word line layers already reaches 128 layers. Due to the geometry difference between the cells located on top and bottom of the string, their cell current and RC delay may be different. The reference cells shown in FIG. 10B provide tracking because the reference cells are located in the same word line layer as the selected cells.

Figure 10E:
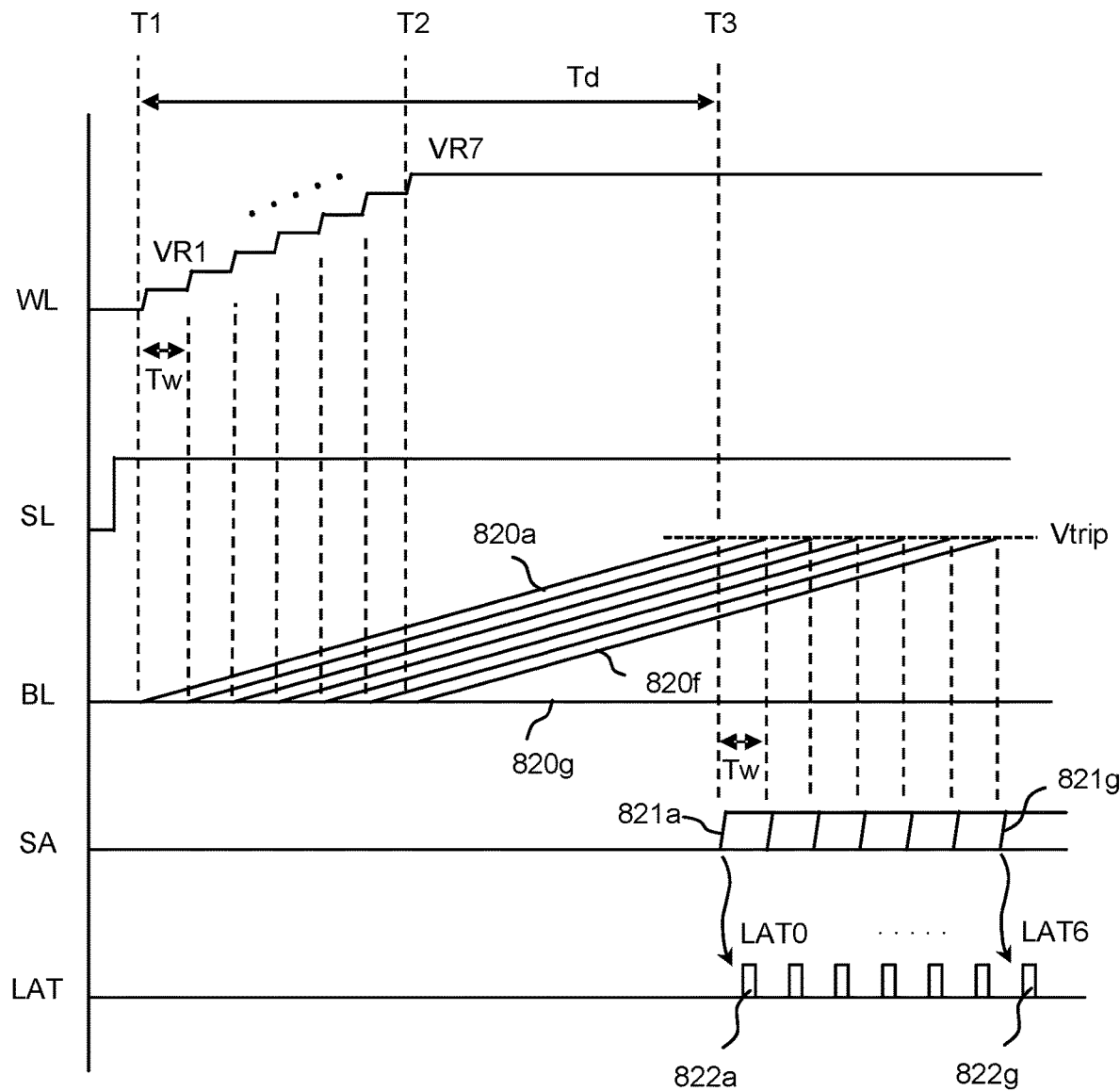
FIG. 10E shows another embodiment of read and program-verify operations using a source line to charge the bit line.

FIG. 10E shows another embodiment of the read and program operations using the reference cells Vt0' to Vt6' shown in FIG. 10B. This embodiment is similar to the embodiment shown in FIG. 10D except that the read operation is using the source line to charge the bit line.

Figure 10F:
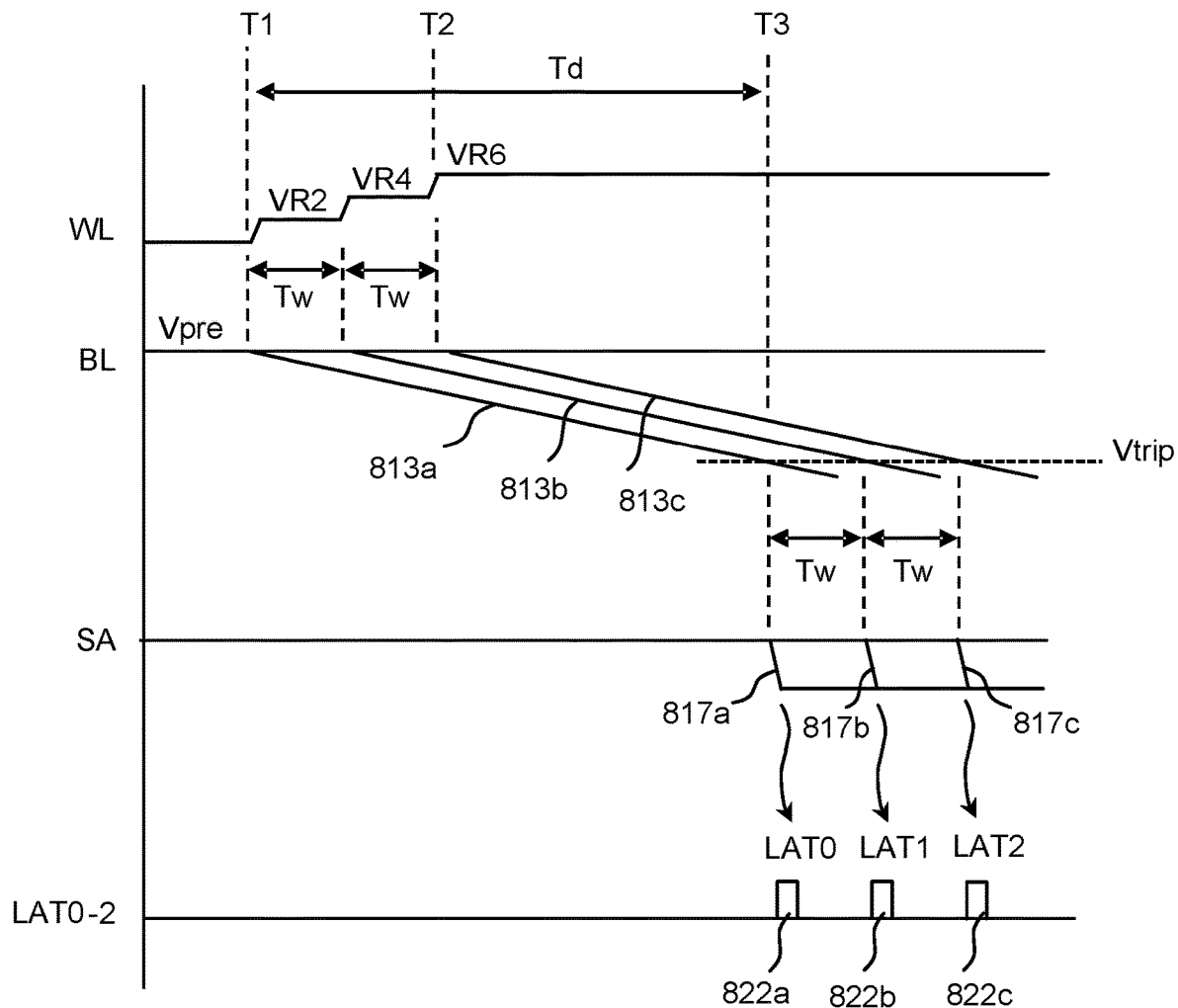
FIG. 10F shows another embodiment memory array operation using reference cells to read a D1 bit.

FIG. 10F shows another embodiment memory array operation using reference cells to read a D1 bit. This operation is similar to that shown in FIG. 10D except only three reference cells, Vt1', Vt3', and Vt5' are used. When the word line voltage is supplied with VR2, VR4, and VR6, it will turn on Vt1', Vt3', and Vt5' reference cells, respectively, to discharge the reference bit lines (813a) to (813c). When the reference bit lines (813a) to (813c) are discharged to the trip point, Vtrip, they will generate the latch pulses LAT0 (822a) to LAT2 (822c) to latch the SA data of selected bit lines. The approach shown in FIG. 10F may be used to read D0 bit and D2 bit as well. The operation is similar to that shown in FIG. 10F except that when reading the D0 bit, it supplies VR1 and VR5 to the word line and uses Vt0' and Vt4' reference cells to generate the latch pulses. When reading the D2 bit, it supplies VR3 and VR7 to the word line and use Vt3' and Vt7' reference cells to generate the latch pulses.

Figure 11A:
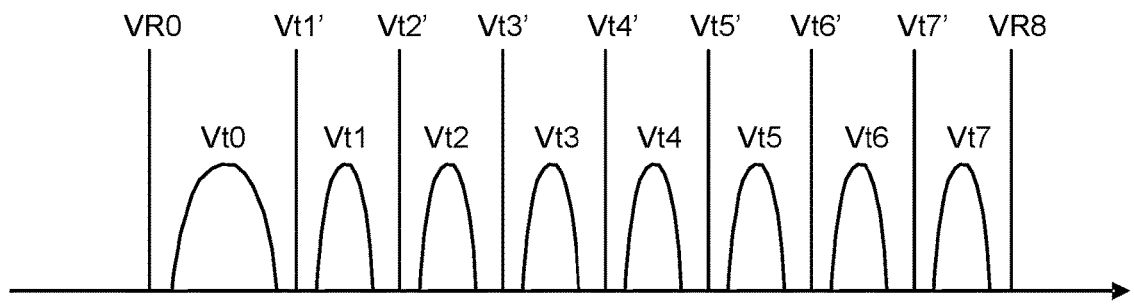
FIGS. 11A-B show another embodiment of a read and program-verify operation according to the invention.
Figure 11B:
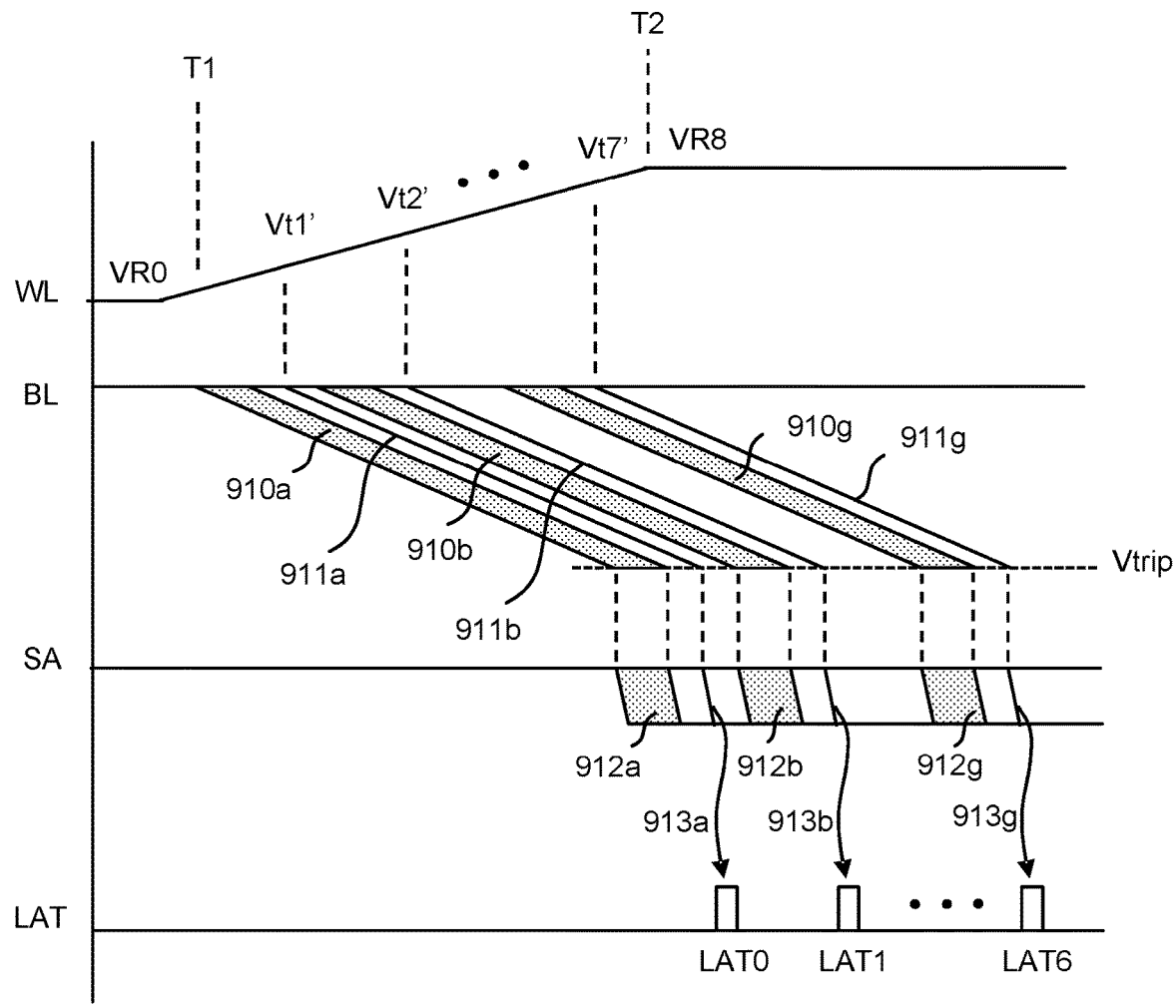

FIGS. 11A-B show another embodiment of a read and program-verify operation according to the invention. This embodiment uses a 'ramp word line voltage' to read the cells instead of 'stepwise word line voltage' shown in the previous embodiments. Because the word line is supplied with a ramp voltage, this embodiment may not use the word line voltages' timing to generate the latch pulses' timing. Therefore, this embodiment can use the reference cells shown in FIG. 10B to generate the latch timing.

FIG. 11A shows exemplary TLC cells' Vt distribution from Vt0 to Vt7. Seven reference cells with threshold voltage Vt1' to Vt7' are used to read the cells. The reference cells' Vt is placed between two adjacent cells' Vt levels. For example, Vt3' is between Vt2 and Vt3. The reference cells are located in the reference bit lines (813a) to (813g) shown in FIG. 10B and programmed to Vt1' to Vt7' during program operation.

FIG. 11B shows a waveform diagram illustrating the operation of the configuration described in FIG. 11A. The voltage supplied to the selected word line is ramped up from voltage VR0 to VR8. VR0 is lower than Vt1' and VR8 is higher than Vt7'. The ramping word line voltage will sequentially turn on the cells from Vt0 to Vt7, when the word line voltage reaches the cells' Vt. The Vt0 to Vt7 cells will discharge the bit lines (910a) to (910g), respectively. Because each cell Vt has a distribution, the discharged bit lines for each Vt level is also a distribution, as shown by the grey area.

The ramping word line voltage will also sequentially turn on the reference cells with Vt1' to Vt7', when the word line voltage reaches the reference cells' Vt. The Vt1' to Vt7' reference cells will discharge the reference bit lines (911a) to (911g), respectively. Because all the bit lines and the reference bit lines are discharged by using a constant current, the discharging speed for the bit lines (910a) to (910g) and the reference bit lines (911a) to (911g) are constant.

When the bit lines (910a) to (910g) and the reference bit lines (911a) to (911g) are discharged to the trip point of sense amplifier, Vtrip, their SA data will be flipped from 1 to 0, as shown (912a) to (912g) and (913a) to (913g), respectively.

The reference bit lines' sense amplifier (815) shown in FIG. 10B or the control logic of the chip may detect the SA data of the reference bit lines (913a) to (913g) to generate the latch signals LAT0 to LAT6 to latch the SA data of the bit lines (912a) to (912g).

It should be noted that the waveforms in FIG. 11B are exemplary and not drawn to scale. In actual operation, the word line ramping time from T1 to T2 may be much shorter than the bit line discharging time.

Compared with the other embodiments using stepwise word line voltages, such as in FIGS. 3A-B, this embodiment does not require a fixed timing for the latch pulses LAT0 to LAT7, because the latch pulses are generated by reference cells. When the word line voltage ramping rate is increased or decreased, the reference cells can automatically provide tracking to generate correct timing for the latch pulses between Vt0 to Vt7 cells.

Figure 11C:
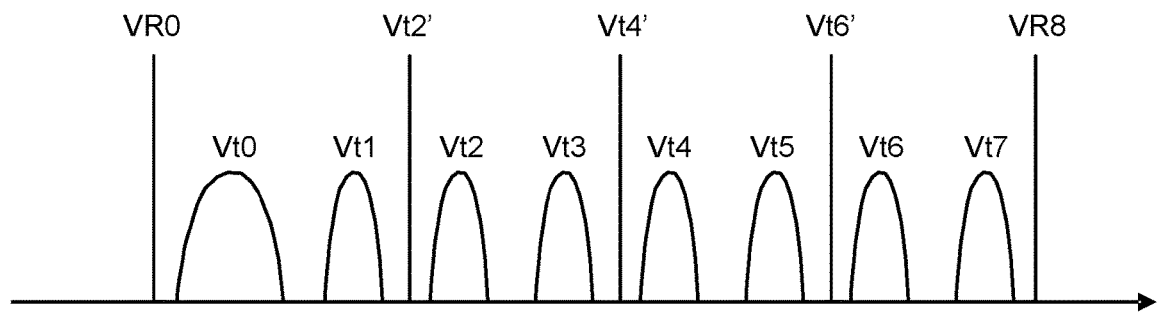
FIGS. 11C-D show another embodiment of read and program-verify operations using a ramping word line voltage to read a D1 bit.
Figure 11D:
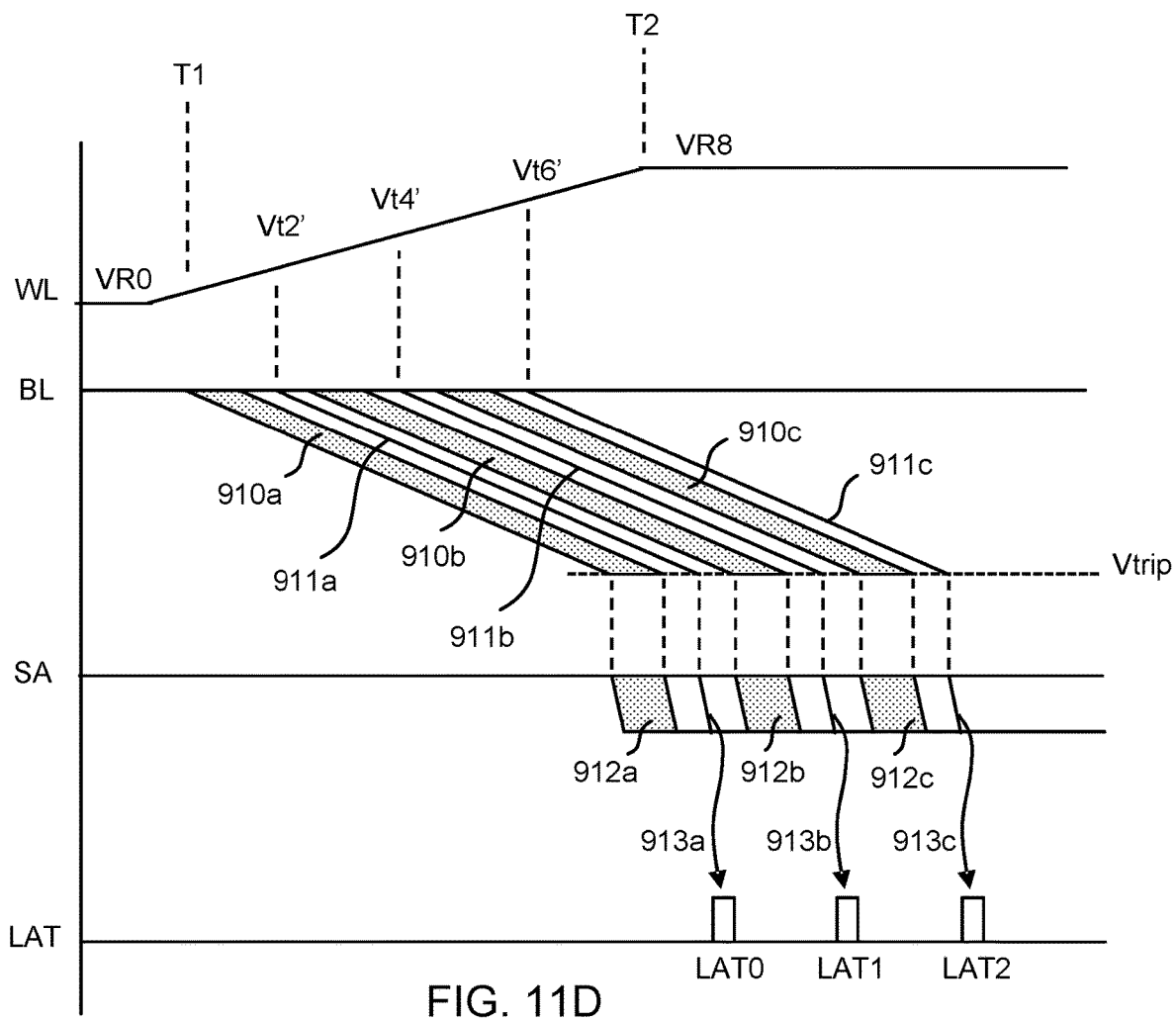

FIGS. 11C-D show another embodiment of read and program-verify operations using a ramping word line voltage to read a D1 bit. This operation is similar to FIGS. 11A-B except that only three reference cells, Vt2', Vt4', and Vt6' are used. When the word line voltage is ramped from VR0 to VR8, it will turn on Vt0 and Vt1 cells to discharge the bit lines (910a), and Vt2 and Vt3 cells to discharge the bit lines (910b), and Vt4 and Vt5 cells to discharge the bit lines (910c). The ramping word line voltage will also turn on the reference cells Vt2', Vt4', and Vt6' to discharge the reference bit lines (911a), (911b), and (911c). When the reference bit lines (911a) to (911c) are discharged to the trip point, Vtrip, they will generate the latch pulses LAT0 to LAT2, as shown at (913a) to (913c), to latch the SA data of selected bit lines, (912a) to (912c). As shown in FIG. 11D, the latch pulses are placed between the data in different Vt groups. For example, the latch pulse (913a) is placed between the data group (912a) and (912b), so that it will latch the data group (912a). Similarly, the latch pulses (913b) and (913c) will latch the data groups (912b) and (912c), respectively.

The configuration described and shown in FIGS. 11C-D can be used to read the D0 bit and the D2 bit as well. The operations to read the D0 and D1 bits are similar to FIGS. 11C-D except that Vt1' and Vt5' reference cells are used to read the D0 bit, and Vt3' and Vt7' reference cells are used to read the D2 bit.

Moreover, U.S. patent application Ser. No. 16/849,875 filed by the same inventor discloses embodiments to read multiple-level cells using only one data latch. By combining the present embodiments with the embodiments disclosed in Ser. No. 16/849,875, the read latency and data throughput for multiple-level cells can be further reduced.

Figure 12A:
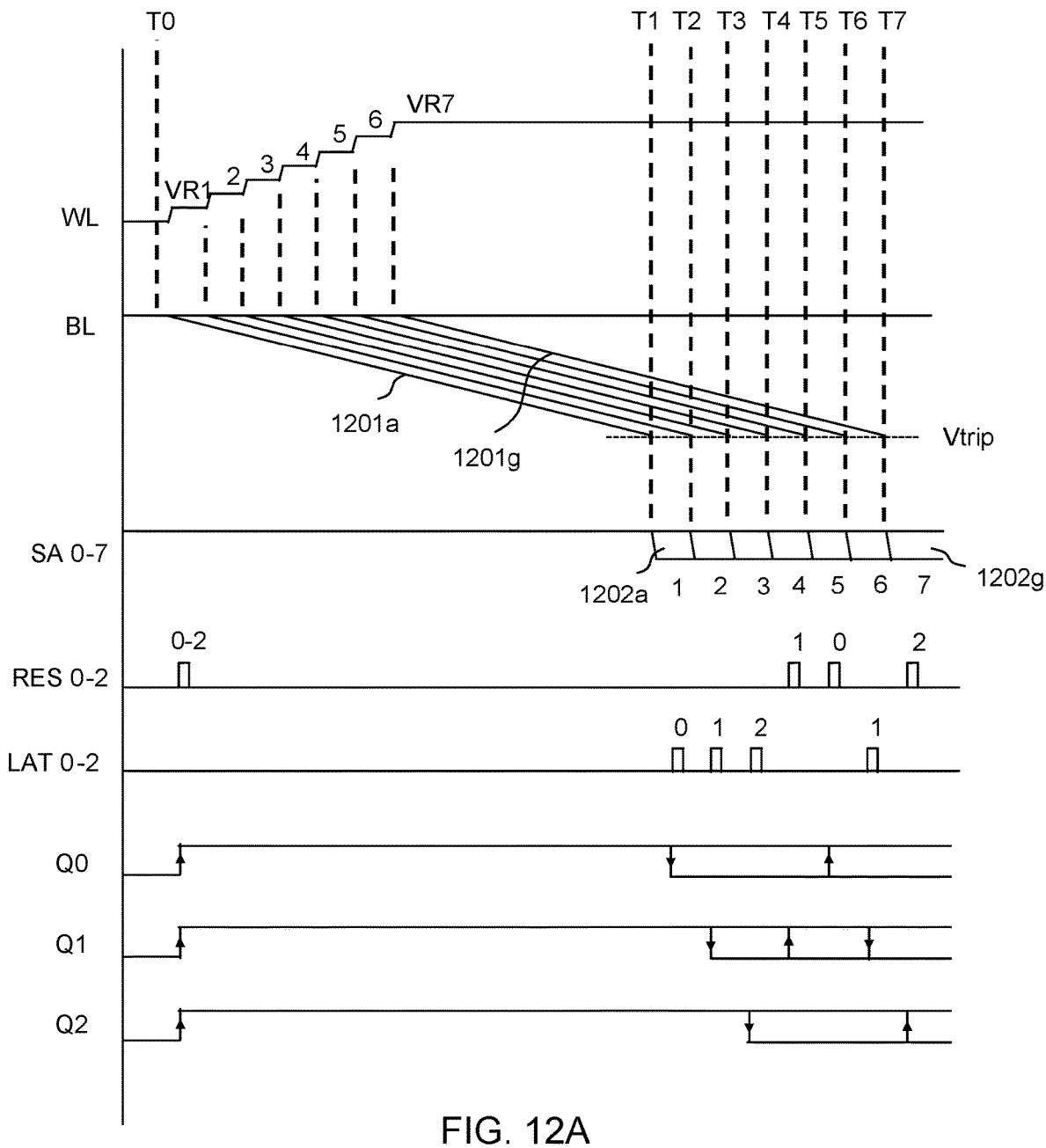
FIG. 12A shows an embodiment of signal waveforms used to read TLC cells using the TLC page buffer circuit shown in FIG. 2.

FIG. 12A shows an embodiment of signal waveforms used to read TLC cells using the TLC page buffer circuit shown in FIG. 2. In this embodiment, when the SA (208) data is 1 (SA voltage is VDD), the sensing device (207) will be turned on. Therefore, the reset pulses RES0 to RES2 will reset the data latches (201a) to (201c) to 1, respectively. The latch pulses LAT0 to LAT2 will set the data latches (201a) to (201c) to 0, respectively. When the SA (208) data is 0 (SA voltage is lower than Vt of the sensing device (207)), the sensing device (207) will be turned off. Therefore, the data of the latches (201a) to (201c) will remain unchanged.

The data Q0 to Q2 of the data latches (201a) to (201c) are shown in FIG. 12A. At T0 time, the data Q0 to Q2 of the data latches (201a) to (201c) are all reset to 1. The word line is sequentially supplied with VR1 to VR7 to turn on Vt0 to Vt6 cells to discharge their bit lines as shown (1201a) to (1201g). From T1 to T7 time, the bit lines (1201a) to (1201g) are sequentially discharged to the trip point, Vtrip, and generate the SA data, SA1 to SA7 (1202a) to (1202g).

The control logic of the chip will send the reset pulses RES0 to RES2 and latch pulses LAT0 to LAT2 as shown to reset and set the data Q0 to Q2 of the data latches (201a) to (201c) according to the SA1 to SA7 data (1202a) to (1202g).

At time T1, LAT0 signal will set Q0 of the off-cells (Vt1 to Vt7) to 0, while Q0 of the on-cell (Vt0) will remain at 1. At time T2, LAT1 signal will set Q1 of the off-cells (Vt2 to Vt7) to 0, while the Q1 of on-cells (Vt0 and Vt1) will remain at 0. At time T3, LAT2 signal will set the Q2 of the off-cells (Vt3 to Vt7) to 0, while the Q2 of the on-cells (Vt0 to Vt2) will remain at 1. At time T4, RES1 signal will reset the Q1 of the off-cells (Vt4 to Vt7) to 1, while the Q1 of the on-cells (Vt0 to Vt3) will remain unchanged. At time T5, RES0 signal will reset the Q0 of the off-cells (Vt5 to Vt7) to 1, while the Q0 of the on-cells (Vt0 to Vt4) will remain unchanged. At time T6, LAT1 signal will reset the Q1 of the off-cells (Vt6 to Vt7) to 0, while the Q1 of the on-cells (Vt0 to Vt5) will remain unchanged. At time T7, RES2 signal will reset the Q2 of the off-cell (Vt7) to 1, while the Q2 of the on-cells (Vt0 to Vt6) will remain unchanged. As a result, the three-bit data, D0, D1, D2, will be stored in the data latches (201a) to (201c), respectively.

Figure 12B:
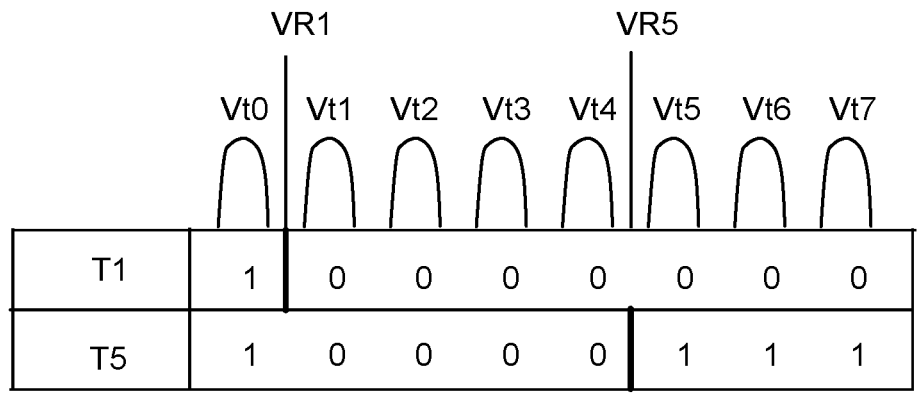
FIGS. 12B-D show the detailed operation from time T1 to T7 of D0-D2 data latches.
Figure 12C:
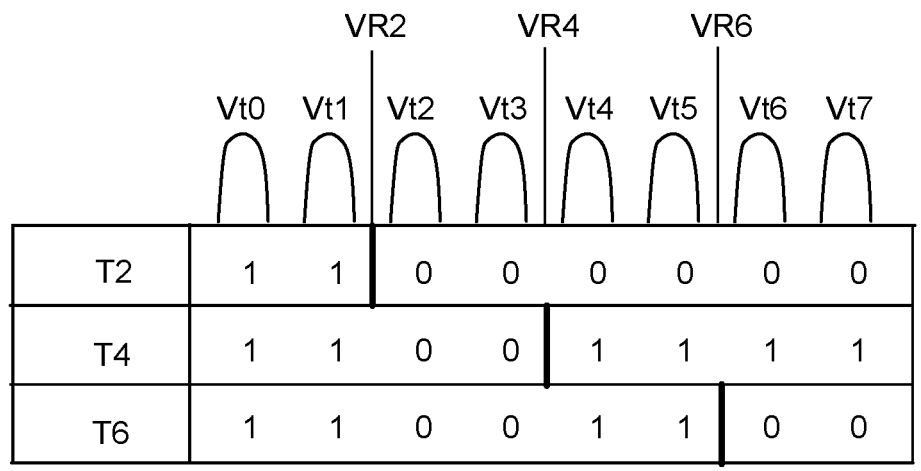
Figure 12D:
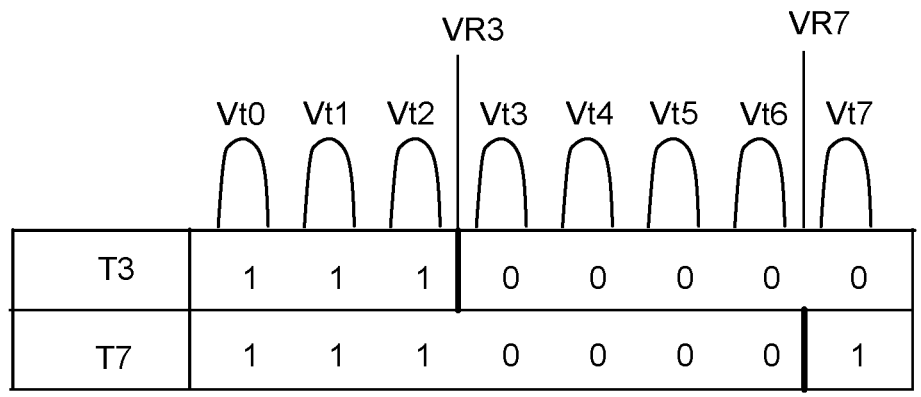

FIGS. 12B-D show the detailed operation from T1 to T7 time for D0-D2 data latches (201a) to (201c), respectively. For the D0 data latch (201b), referring to FIG. 12A, LAT0 pulse is applied at time T1 to set the latch based on SA1 data, and RES0 pulse is applied at time T5 to reset the latch based on SA5 data. SA1 and SA2 are the SA data read by word line voltage VR1 and VR5, respectively.

FIG. 12B shows exemplary operation for the D0 data latch. At time T1, LAT0 pulse will set the data latch of off-cells (Vt0 to Vt7) to 0, while the on-cell's (Vt0) remain at 1. At time T5, RES0 pulse will reset the data latch of off-cells (Vt5 to Vt7) to 1, while the on-cells' (Vt0 to Vt4) remain unchanged. As a result, the D0 data is stored in the data latch (201a).

For D1 data latch (201b), referring to FIG. 12A, the LAT1 pulse is applied at times T2 and T6 to set the latch based on SA2 and SA6 data, respectively. The RES1 pulse is applied at time T4 to reset the latch based on SA4 data. SA2, SA4, and SA6 are the SA data read by word line voltage VR2, VR4, and VR6, respectively.

FIG. 12C shows exemplary operation of the D1 data latch. At time T2, the LAT1 pulse will set the latch of off-cells (Vt2 to Vt7) to 0, while the on-cells' (Vt0 and Vt1) remain at 1. At time T4, the RES1 pulse will reset the latch of off-cells (Vt4 to Vt7) to 1, while the on-cells' (Vt0 to Vt3) remain unchanged. At time T6, the LAT1 pulse will set the latch of off-cells (Vt6 and Vt7) to 0 again, while the on-cells' (Vt0 to Vt5) remain unchanged. As a result, the D1 data is stored in the data latch (201b).

For the D2 data latch (201b), referring to FIG. 12A, the LAT2 pulse is applied at time T3 to set the latch based on SA3 data, and the RES2 pulse is applied at time T7 to reset the latch based on SA7 data. SA3 and SA7 are the SA data read by word line voltage VR3 and VR7, respectively.

FIG. 12D shows exemplary operation of the D2 data latch. At time T3, the LAT2 pulse will set the latch of off-cells (Vt3 to Vt7) to 0, while the on-cells' (Vt0 and Vt2) remain at 1. At time T7, the RES2 pulse will reset the latch of off-cell (Vt7) to 1, while the on-cells' (Vt0 to Vt6) remain unchanged. As a result, the D2 data is stored in the data latch (201c).

By using the configurations shown in FIG. 12A, the three-bit data can be read in one discharge cycle. Compared with the conventional art that requires two discharge cycles to read the D0 and D2 bit, and three discharge cycles to read the D1 bit, the embodiments of the invention reduce read latency to ⅓ and increase data throughout by 7 times.

Figure 13B:
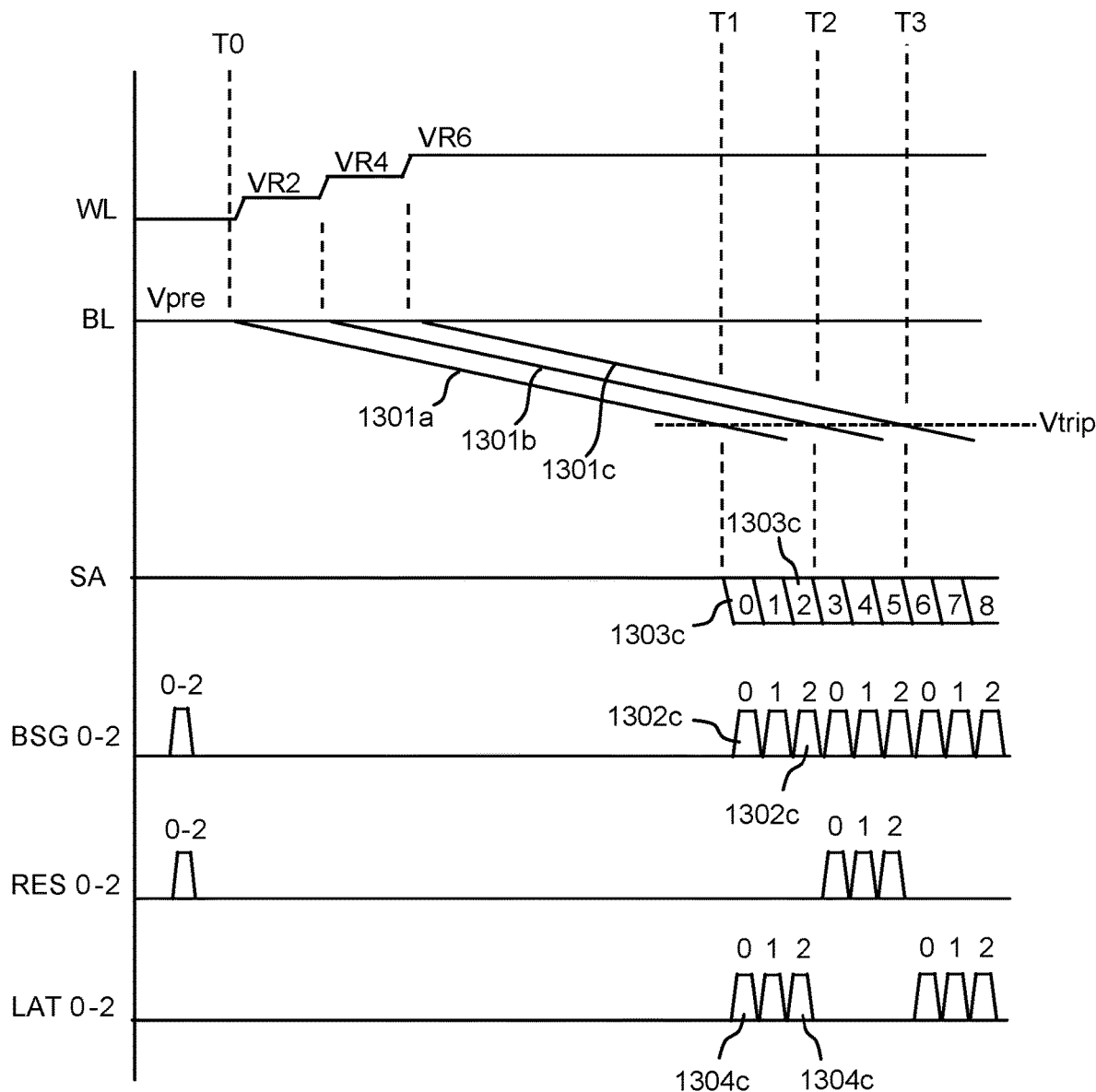

FIGS. 13A-B shows an additional embodiments of a page buffer according to the invention.

FIG. 13A shows a page buffer architecture according to U.S. patent application Ser. No. 16/849,875 filed by the same inventor of this invention. The page buffer (200) is connected to three bit lines BL0 to BL2 through the bit line select gates, BSG0 (210a) to BSG2 (210c). During read operations, the bit lines BL0 to BL2 are precharged and discharged by cells simultaneously. Then, the bit line select gates (210a) to (210c) are sequentially turned on to let the page buffer (200) sense the voltage of the bit lines BL0 to BL2 and latch the data to the data latches (201a) to (201c), respectively. This increases the read data throughput without increasing the number of the page buffer circuits.

FIG. 13B shows exemplary signal waveforms for performing a read operation for the D1 bit using the array architecture shown in FIG. 13A. At time T0, the bit line select gates (210a) to (201c) are turned on by pulses on BSG0 to BSG2 to precharge BL0 to BL2, to Vpre. Then, the word line is sequentially supplied with read voltages VR2, VR4, and VR6, to turn on the cells on BL0 to BL2 to discharge their bit lines. VR2 will turn on Vt0 and Vt1 cells to discharge the bit lines (1301a). VR4 will turn on Vt2 and Vt3 cells to discharge bit lines (1301b). VR6 will turn on Vt4 and Vt5 to discharge bit lines (1301c).

At time T1, when the bit lines (1301a) are discharged to the trip point, Vtrip. The bit line select gates BSG0 (1302a) to BSG2 (1302c) are sequentially turned on to connect BL0 to BL2 to the page buffer. The sense amplifier of the page buffer will generate the SA data, SA0 (1303a) to SA2 (1303c), respectively. The latch pulses LAT0 (1304a) to LAT2 (1304c) are applied to set the data latches (201a) to (201c) to 0 according to the data of SA0 to SA2, respectively. This will set Vt2 to Vt7 cells' data to 0, as shown at T2 in FIG. 12C.

At time T2, the bit lines (1301b) are discharged to the trip point, Vtrip. The bit line select gates (210a) to (210c) are sequentially turned on by signals BSG0 to BSG2 to connect BL0 to BL2 to the page buffer to generate SA3 to SA5, respectively. The reset pulses RES0 to RES2 are applied to reset the data latches (201a) to (201c) to 1 according to the data of SA3 to SA5, respectively. This will reset Vt4 to Vt7 cells' data to 1, as shown at T4 in FIG. 12C.

At time T3, the bit lines (1301c) are discharged to the trip point, Vtrip. The bit line select gates (210a) to (210c) are sequentially turned on by signals BSG0 to BSG2 to connect BL0 to BL2 to the page buffer (200) to generate SA6 to SA8, respectively. The latch pulses LAT0 to LAT2 are applied to set the data latches (201a) to (201c) to 0 according to the data of SA6 to SA8, respectively. This will set Vt6 and Vt7 cells' data to 0, as shown at T6 in FIG. 12C.

As a result, the D1 bit of three cells on BL0 to BL2 are stored in the latches (201a) to (201c), respectively. This configuration can read three data in one cycle. Compared with the conventional system shown in FIG. 1C that reads one bit in three cycles, the embodiments of the invention reduce read latency to ⅓, and increase read data throughput by 9 times.

The disclosure above describes read and program-verify operations using constant bit line discharging current according to the invention. In addition to the read and program-verify operations, the configurations may be applied to many other operations, such as checking the cells' Vt distributions. The following paragraphs describe some embodiments of the some additional operations for which the exemplary embodiments can be applied.

Figure 14A:
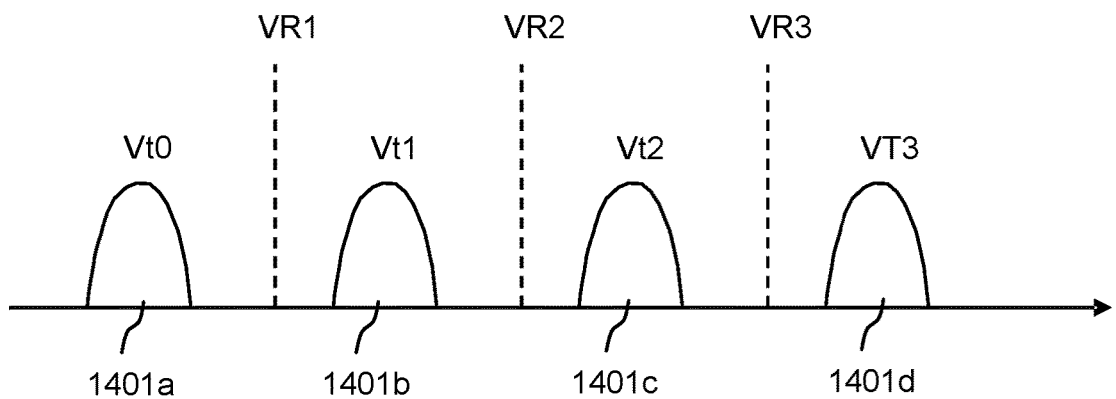
FIGS. 14A-B show exemplary operations for using multiple latch pulses to optimize the timing of LAT0 to LAT2.
Figure 14B:
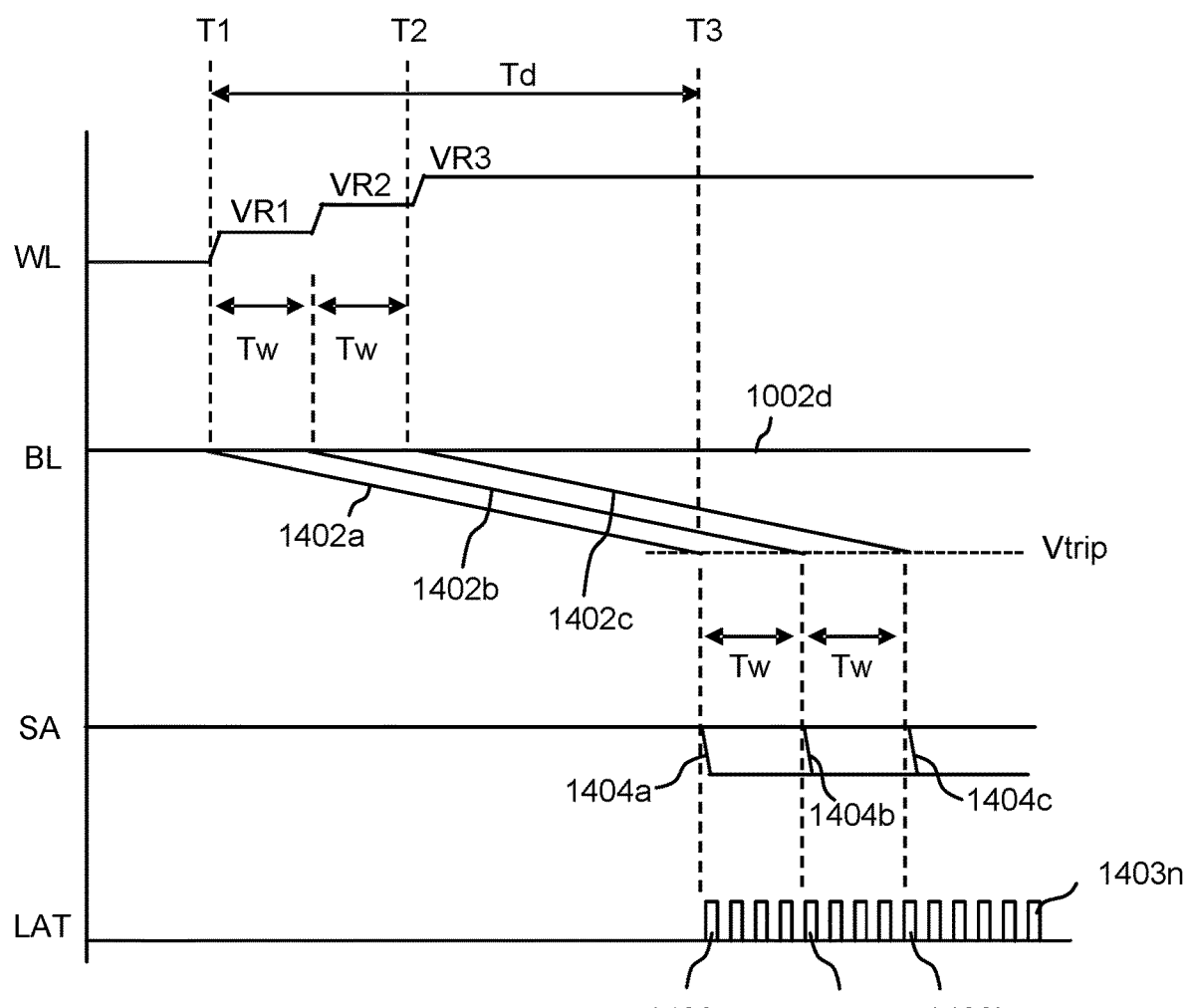

FIGS. 14A-B show exemplary operations for using multiple latch pulses to optimize the timing of LAT0 to LAT2.

FIG. 14A shows the Vt distribution of a MLC from Vt0 (1401a) to Vt3 (1401d).

FIG. 14B shows exemplary operations to read the MLC shown in FIG. 14A.

From time T1 to time T2, the word line is sequentially supplied with VR1 to VR3 to turn on Vt0 to Vt3 cells to discharge their bit lines, as shown (1402a) to (1402c). From time T3, bit lines (1402a) to (1402c) are sequentially discharged to the trip point, Vtrip, and generate the SA data (1404a) to (1404c). The system or the control logic of the chip supplies high-frequency latch pulses (1403a) to (1403n) to latch the SA data (1404a) to (1404c). The latch pulses (1403a), (1403f), and (1403j) latch the SA data (1404a) to (1404c) after flipping from 1 to 0, respectively. This allows the system or control logic of the chip to obtain accurate timing of the discharging time, Td, of the bit lines (1402a) to (1402c). Therefore, the system or the control logic optimizes the timing of the latch signals LAT0 to LAT2 to increase the accuracy of the read and program-verify operations.

Figure 15A:
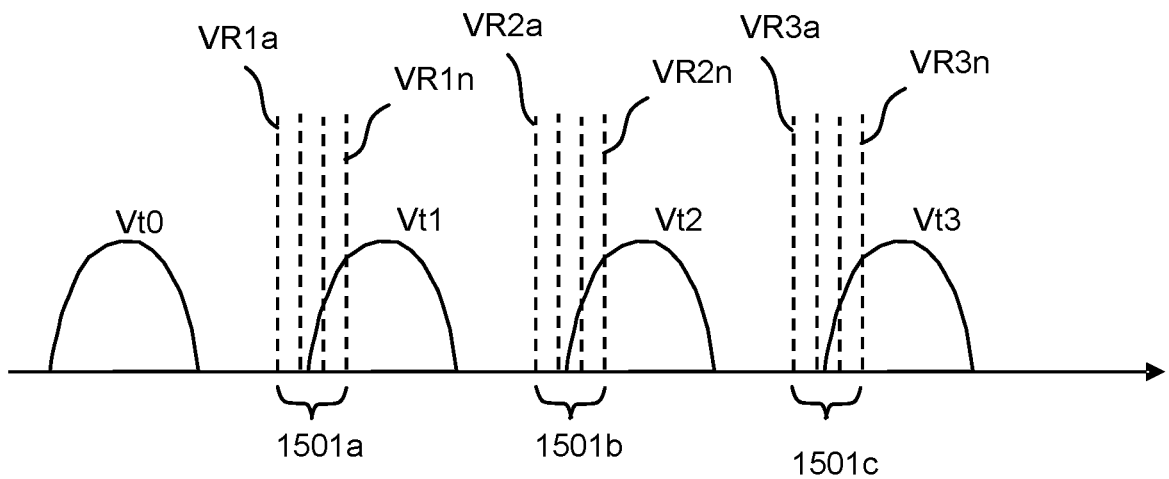
FIGS. 15A-B show another embodiment of exemplary operations using multiple word line voltage levels to check the distribution of the tail bits for each Vt level.
Figure 15B:
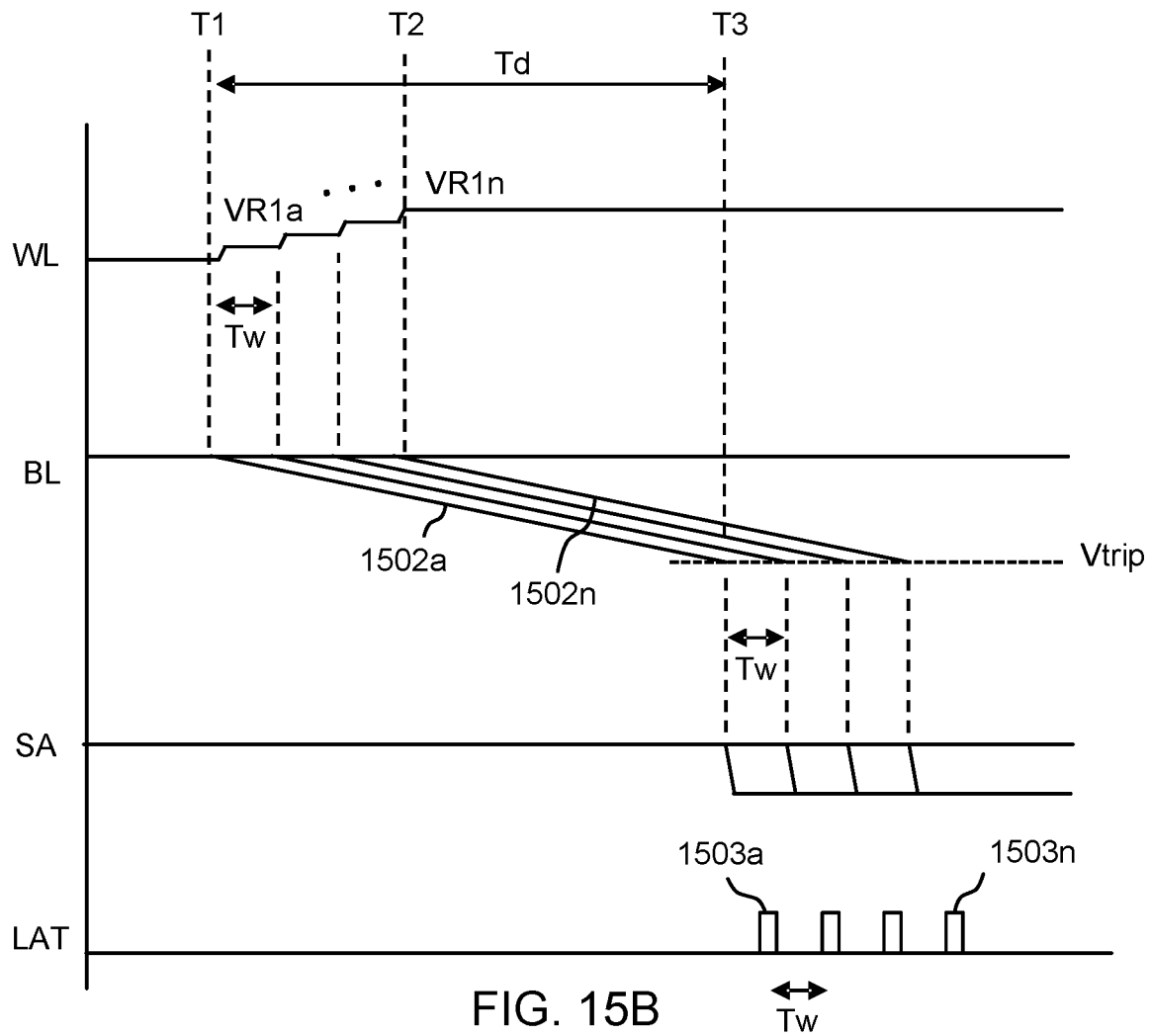

FIGS. 15A-B show another embodiment of exemplary operations using multiple word line voltage levels to check the distribution of the tail bits for each Vt level.

FIG. 15A shows the Vt distribution for MLC. During program-verify operation, multiple word line voltage levels with small voltage difference such as VR1a to VR1n are applied to read Vt1 cells' tail bits (1501a). Similarly, VR2a to VR2n are applied to read Vt2 cells; tail bits (1501b), and VR3a to VR3n may be applied to read Vt3 cells' tail bits (1501c).

FIG. 15B shows exemplary operations to read the MLC shown in FIG. 15A. For simplicity, FIG. 15B only shows waveforms for reading Vt1 cells. From time T1 to T2, the word line is sequentially supplied with voltages VR1a to VR1n. This will turn on the cells with Vt from VR1a to VR1n sequentially to discharge their bit lines as shown (1502a) to (1502n). At time T3, after the bit line (1502a) discharge to the trip point, Vtrip, multiple latch pulses (1503a) to (1503n) are applied to latch the SA data of the bit lines (1502a) to (1502n). In one embodiment, the latch pulses (1503a) to (1503n) have Tw time delay between each pulse to match the Tw time delay between the word line voltage levels as shown. In another embodiment, high-frequency latch pulses such as (702a) to (702n) shown in FIG. 14B are applied to increase the accuracy of detecting the tail bits' Vt distribution. By using this configuration, the detailed Vt distribution of the tail bits can be checked to obtain more accurate Vt control for program operation.

Figure 16A:
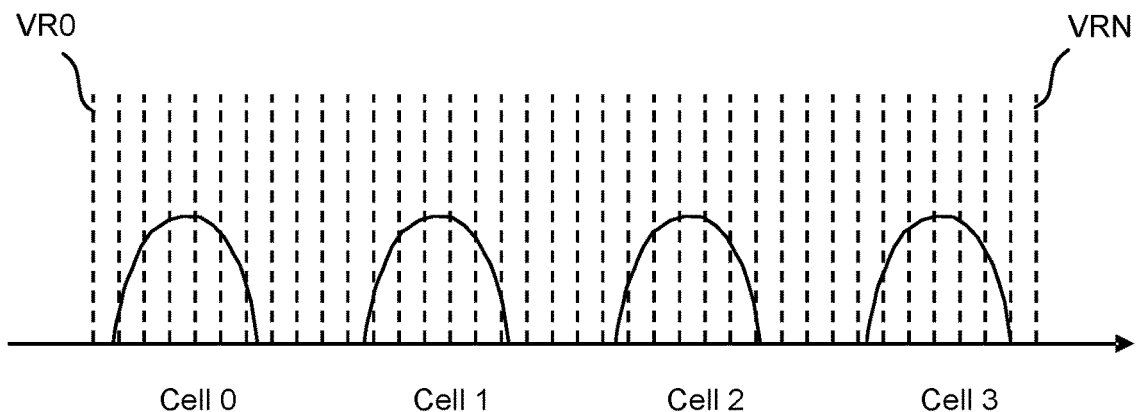
FIGS. 16A-B show another embodiment of exemplary operations using multiple word line voltage levels to check the cells' Vt distribution.
Figure 16B:
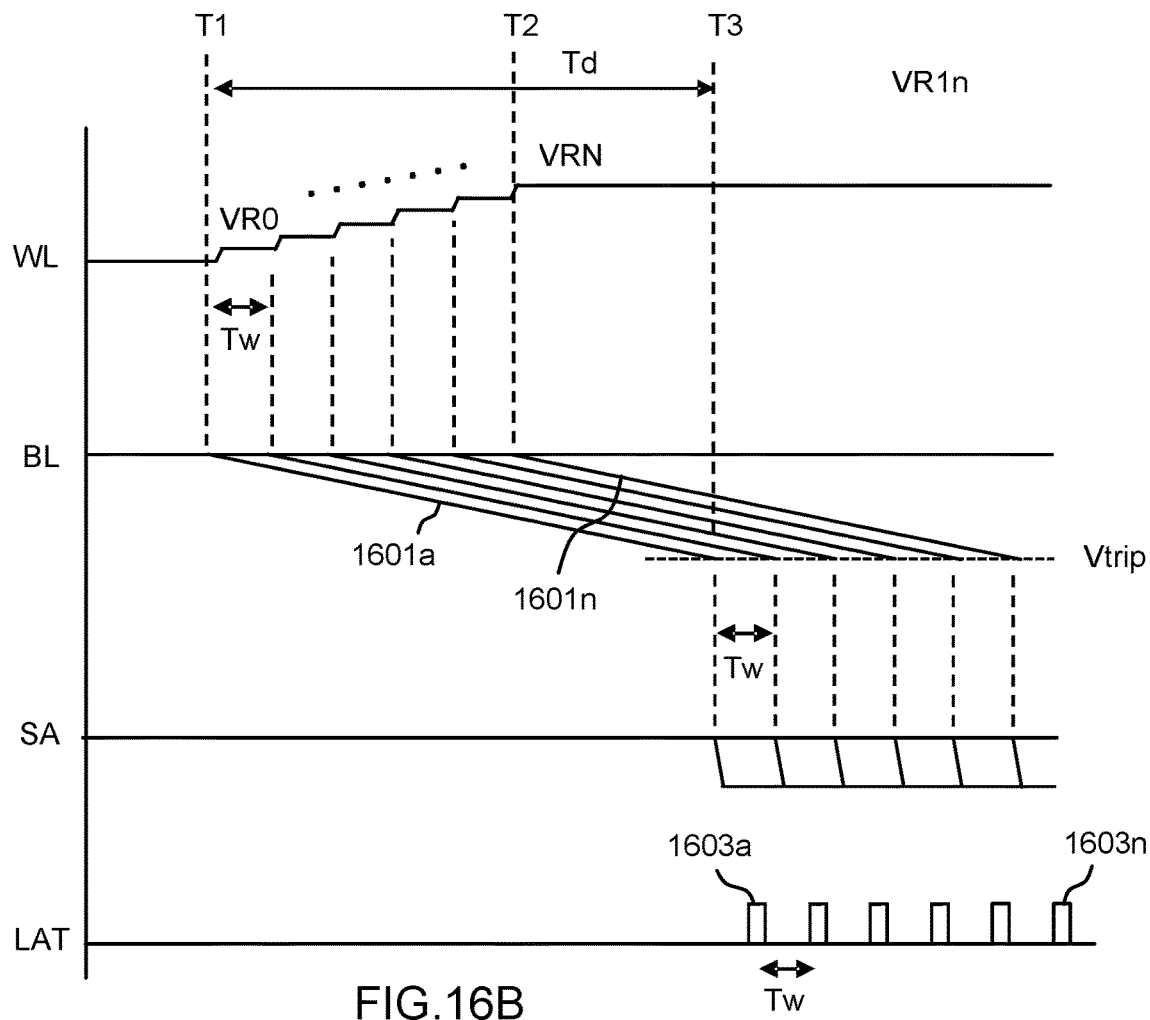

FIGS. 16A-B show another embodiment of exemplary operations using multiple word line voltage levels to check the cells' Vt distribution.

FIG. 16A shows the Vt distribution for MLC. During read or program-verification, multiple word line voltage levels with small voltage variations, such as VR0 to VRN, are applied to check the selected cells' Vt distributions.

FIG. 16B shows exemplary operations to read the MLC shown in FIG. 16A. From time T1 to time T2, the word line is sequentially supplied with the multiple voltages VR0 to VRN. This will turn on the cells according to their Vt to discharge their bit lines sequentially, as shown in (1601a) to (1601n). After the discharging time Td, at time T3, multiple latch pulses (1603a) to (1603n) are applied to latch the SA data for the bit lines. In one embodiment, the latch pulses (1603a) to (1603n) have Tw time delay between each pulse to match the Tw time delay between the word line voltage levels as shown. In another embodiment, high-frequency latch pulses (702a) to (702n) as shown in FIG. 14B are applied to increase the resolution of the cells Vt distribution. By using this configuration, the detailed Vt distribution of the selected cells can be checked. This provides information for optimizing the conditions for read, program, and program-verification operations.

Figure 17A:
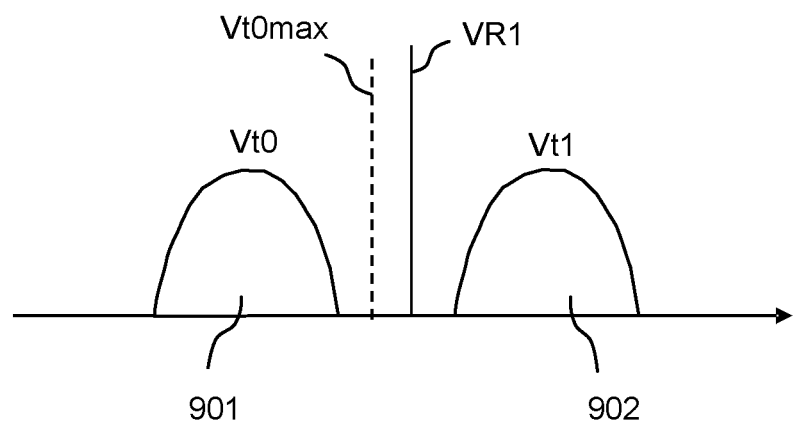
FIGS. 17A-B show the effect of changing the constant discharging current.
Figure 17B:
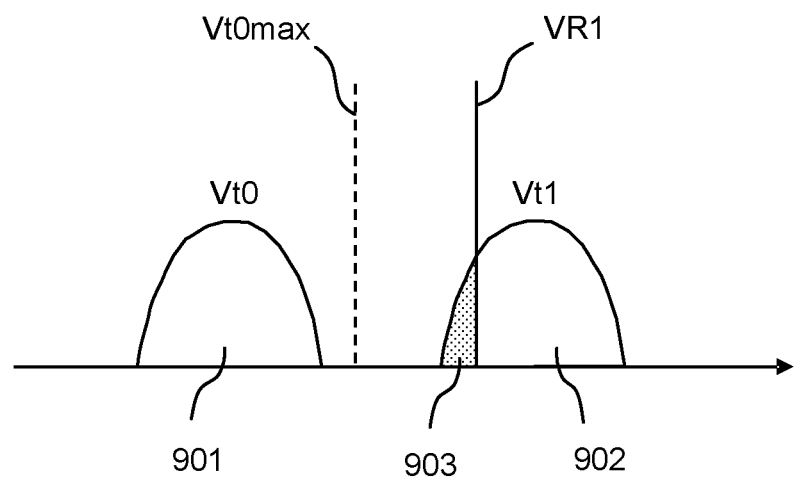

FIGS. 17A-B show the effect of changing the constant discharging current.

FIG. 17A shows an exemplary Vt distribution for Vt0 (901) and Vt1 (902). During read operations, the word line is supplied with VR1 to read the cells. VR1 will turn on the cells in (901) and turn off the cells in (902). As described with respect to FIG. 4G and FIG. 4H, the embodiments can use the source select gate or drain select gate to limit a constant bit line discharging current, Id. The on-cell's current can be equal or higher than the constant discharging current, otherwise the cell will limit the discharging current and cause the cell to be read as an off-cell. Assuming Vt0max is the Vt for the cell to conduct the same current as the constant discharging current, Id, the Vt of the cells (901) must be lower than Vt0max and the Vt of the cells (902) must be higher than Vt0max.

FIG. 17B shows the condition when the constant discharging current, Id, is increased by changing the bias voltage of the source select gate or drain select gate as shown in FIG. 4G and FIG. 4H. Because the cell current is proportional to VG-Vt, when the constant discharging current, Id, is increased, it allows VR1 to be increased to generate the same cell current as the increased constant discharging current, Id, from the same Vt0max. Therefore, the bit line discharging speed for Vt0 cells (901) is increased. Although the higher VR1 may turn on the cells (903) in the Vt1 group, the cells (903) will conduct lower current than the constant discharging current, Id, because their Vt is higher than Vt0max. Therefore, the cells in (903) will be still read as off-cells. The margin between Vt0max to Vt0 and Vt0max to Vt1 are kept the same in both FIG. 17A and FIG. 17B. Therefore, increasing the constant discharging current will not affect the cells' reliability.

Figure 17C:
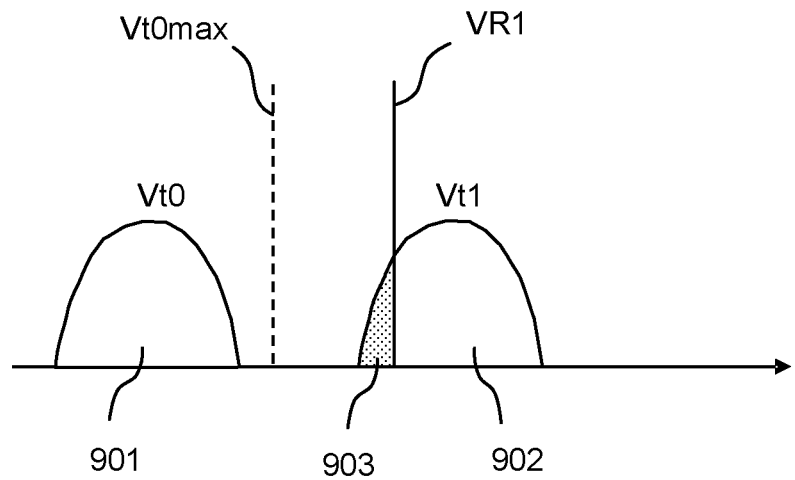
FIG. 17C shows another condition when increasing the constant discharging current of the source select gate or drain select gate.

FIG. 17C shows another condition when increasing the constant discharging current of the source select gate or drain select gate. In this embodiment, the word line voltage VR1 is kept the same as FIG. 17A. When the constant discharging current is increased, Vt0mx is decreased. This allows the Vt of the cells (901) and (902) to be programmed to lower Vt.

The read voltage VR1 can be increased to increase the cell current to be the same as the constant discharging current, Id, from the same Vt0max. This further increases the bit line discharging speed of the Vt0 cells (901). The cells in (903) will be turned on but they will conduct lower current than the constant discharging current. Thus, the cells in (903) will be read as off-cells. As a result, increasing the constant discharging current will effectively increase the bit line discharging speed and reduce the read latency.

Figure 18A:
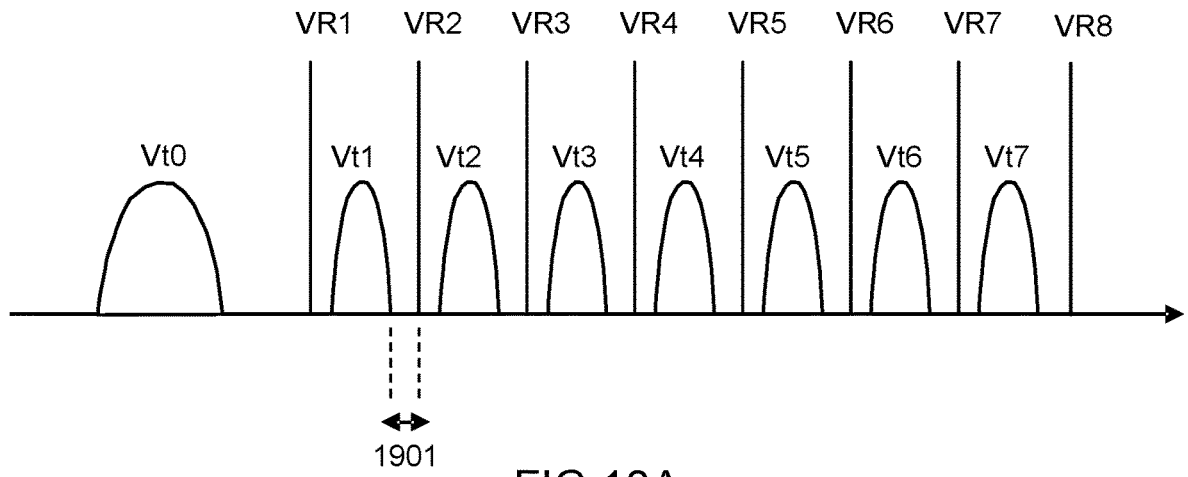
FIG. 18A shows an exemplary Vt distribution of TLC using lower constant discharging current.

FIG. 18A shows an exemplary Vt distribution of TLC using lower constant discharging current. VR1 to VR7 are read voltages for selected word line and VR8 is the pass voltage applied to unselected word lines. The cell current is proportional to VG-Vt, as shown (1901) for Vt1 cells.

Figure 18B:
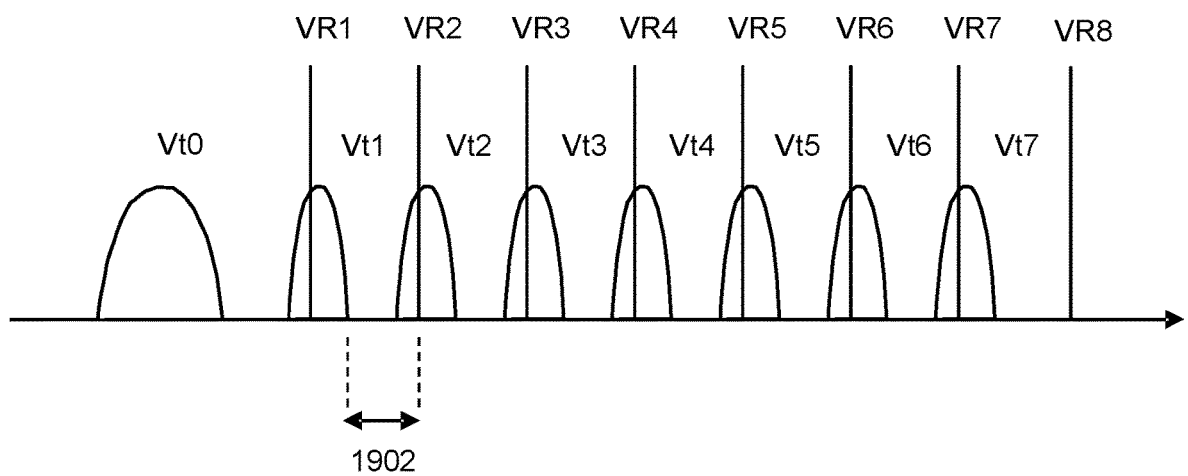
FIG. 18B shows the Vt distribution of TLC using higher constant discharging.

FIG. 18B shows the Vt distribution of TLC using higher constant discharging. As described with respect to FIGS. 17A-C, when the constant discharging current is increased, the voltage level of Vt1 to Vt7 can be reduced, while the word line voltages VR1 to VR8 remain the same. As a result, the cell current is increased due to the VG-Vt for Vt1 cells is increased from (1901) to (1902). This significantly increases the bit line discharging speed while the word line voltages are the cells' reliability remain the same.

For NAND flash memory, Vt0 is the erased cells' Vt which is a negative voltage. Typically the voltage difference between Vt0 to Vt1 is much higher than the other programmed cells, such as Vt1 to Vt2. Therefore, reducing the programmed cells' Vt1 to Vt7 will not cause any problems or issues for the Vt0 cells.

Figure 19A:
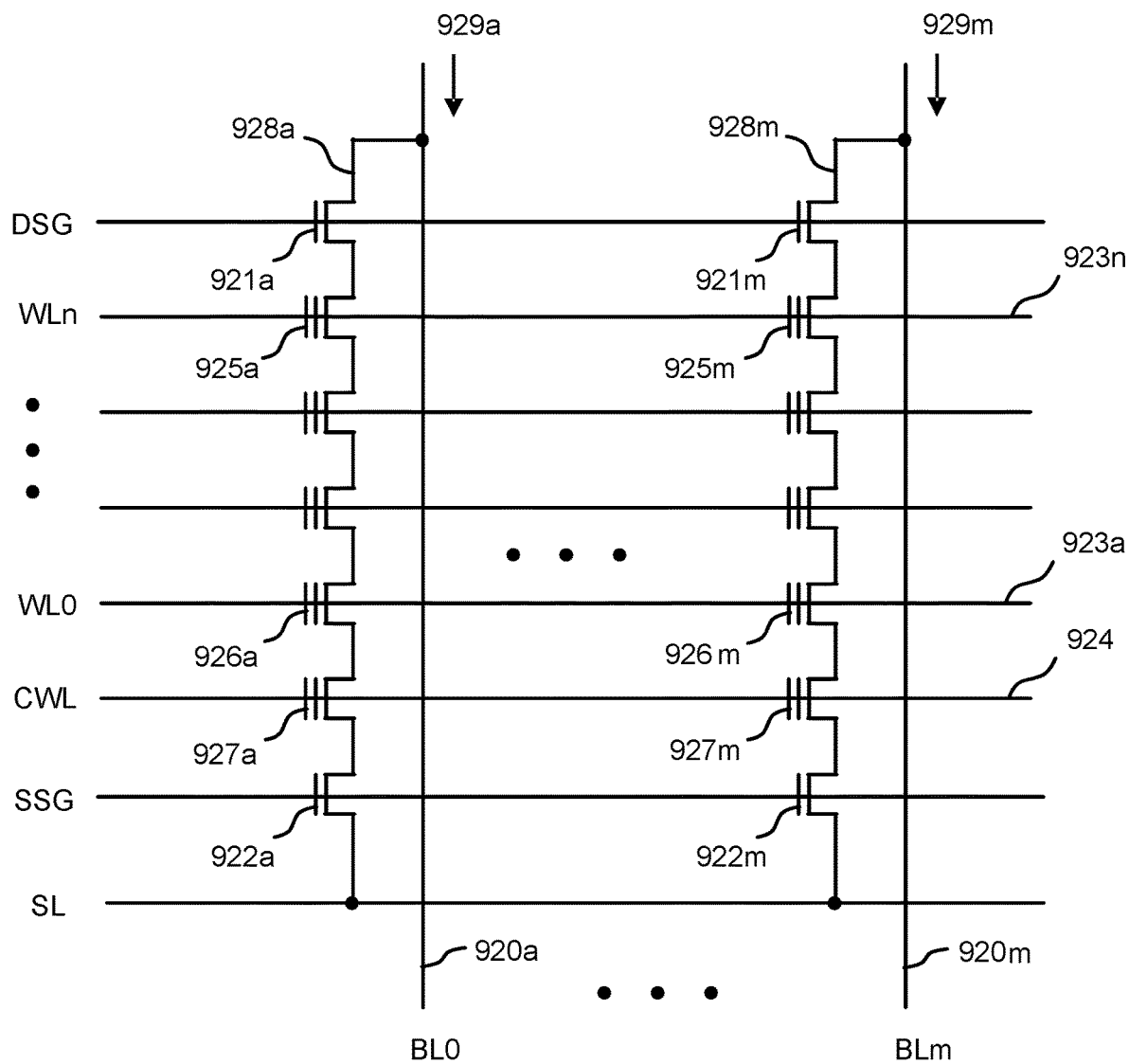
FIGS. 19A-B show exemplary embodiments utilizing a compensate word line to implementation constant bit line discharging current in accordance with the invention.

FIG. 19A shows another embodiment of the implementation of constant bit line discharging current in accordance with the invention. As shown in FIG. 19A, multiple bit lines BL0 to BLm, (920a) to (920m) are connected to multiple strings (928a) to (928m). The strings include drain select gates (921a) to (921m), source select gates (922a) to (922m), and multiple word lines, WL0 to WLn, as shown (923a) to (923n). In an embodiment, the strings include an extra word line called 'compensate word line' (CWL), as shown (924), to achieve constant discharging current for each bit line.

Due to the different Vt of the cells in the word lines (923a) to (923n), the strings (928a) to (928m) may conduct different discharging current (929a) to (929m). To achieve constant discharging current for each string, the cells (927a) to (927m) in the compensate word line (924) are programmed to selected Vt levels to compensate for the difference between the discharging of each string, which results in equal discharging current for each string. For example, assuming the cells (925a) to (926a) in the string (928a) have high Vt, and the cells (925m) to (926m) in the string (928m) have low Vt. This will cause the bit line discharging current (929a) to be lower than the current (929m). In accordance with the invention, the cells (927a) and (927m) in the compensate word line (924) are programmed to low Vt and high Vt, respectively. This will decrease the discharging current (929m) and make the discharging currents (929a) and (929m) equal.

In an aspect, the compensate word line (924) may be located anywhere between the drain select gates (921a) to (929m) and source select gates (922a) to (929m). For example, in an embodiment, the compensate word line (924) is located above WLn (923n) or between any two word lines. During read operation, the compensate word line (924) is supplied with the pass voltage, the same as the unselected word lines, or any other suitable bias voltage.

Detailed program operations using the compensate word line (924) are described below. During erase operations, all the cells in the word lines (923a) to (923n) and the compensation word line (924), such as cells (925a) to (925m), (926a) to (926m), and (927a) to (927m) are erased to low Vt. During program operations, assume the word lines are programmed in the sequence from WL0 (923a) to WLn (923n). After the first word line, WL0 (923a), is programmed, the inversed data of WL0 (923a) is programmed to the compensate word line (924) to make the discharging current (929a) to (929m) of each bit line equal. For example, when programming WL0 (923a), assume BL0 (920a) and BLm (920m) are supplied with data 0 (0V) and 1 (VDD) to program the cells (926a) and (926m) to high Vt and low Vt, respectively. This will make the bit line discharging current (929a) lower than (929m).

In accordance with the invention, the inversed data of WL0 (923a), 1 (VDD) and 0 (0V) are applied to BL0 (920a) and BLm (920m), respectively, to program the compensate word line (924). This will program the cells (927a) and (927m) in the compensate word line (924) to low Vt and high Vt, respectively. This will decrease the bit line discharging current (929m) and make the discharging currents (929a) and (929m) equal.

During programming of the compensate word line (924), the bit line discharging currents (929a) to (929m) or the bit line discharging speed of each bit line (920a) to (920m) are monitored, and the programming of each bit line (920a) to (920m) can be stopped individually when the bit line discharging currents (929a) to (929m) become the same. As a result, constant bit line discharging current can be realized by using the compensate word line (924).

The above-mentioned process can be performed word line by word line. Whenever a word line is programmed, the compensate word line (924) is programmed with the inversed data to make the bit line discharging currents (929a) to (929m) equal. This process can be repeated until all the word lines (923a) to (923n) are programmed.

During the entire program operation, the discharging currents (929a) to (929m) of the strings (928a) to (928m) are gradually decreased when the word lines (923a) to (923m) are programmed one by one. The cells (927a) to (927m) in the compensation word line (924) will be repeatedly programmed with the inversed data of each word line to make the discharging currents (929a) to (929m) equal.

In another embodiment, the compensate word line (924) can be programmed once after all the word lines (929a) to (929n) are programmed. After the word lines (923a) to (923n) are programmed, the bit lines (920a) to (920m) are supplied with a bias condition to check the bit line discharging currents (929a) to (929m) or the discharging speeds of the bit lines. The bit lines with higher current or faster discharging speed will be supplied with data 0 (0V) to program the cells in the compensate word line (924). The bit lines with lower current or slower discharging speed will be supplied with data 1 (VDD) to inhibit the programming of the cells. As a result, the cells (927*a*) to (927*m*) in the compensate word line (924) are programmed accordingly to make the bit line discharging currents (929*a*) to (929*m*) equal.

In another embodiment, during the programming of a selected word line, the selected word line and the compensate word line (924) can be alternatively programmed in each program pulse. The program operation typically contain many program pulses. Each program pulse can be 10 us to 20 us. The program-verify operation is performed after each program pulse. In this embodiment, the program pulses are alternatively applied to the selected word line and the compensate word line (924) with the inversed data. This keeps the discharging currents of the bit lines always equal after each program pulse.

Figure 19B:
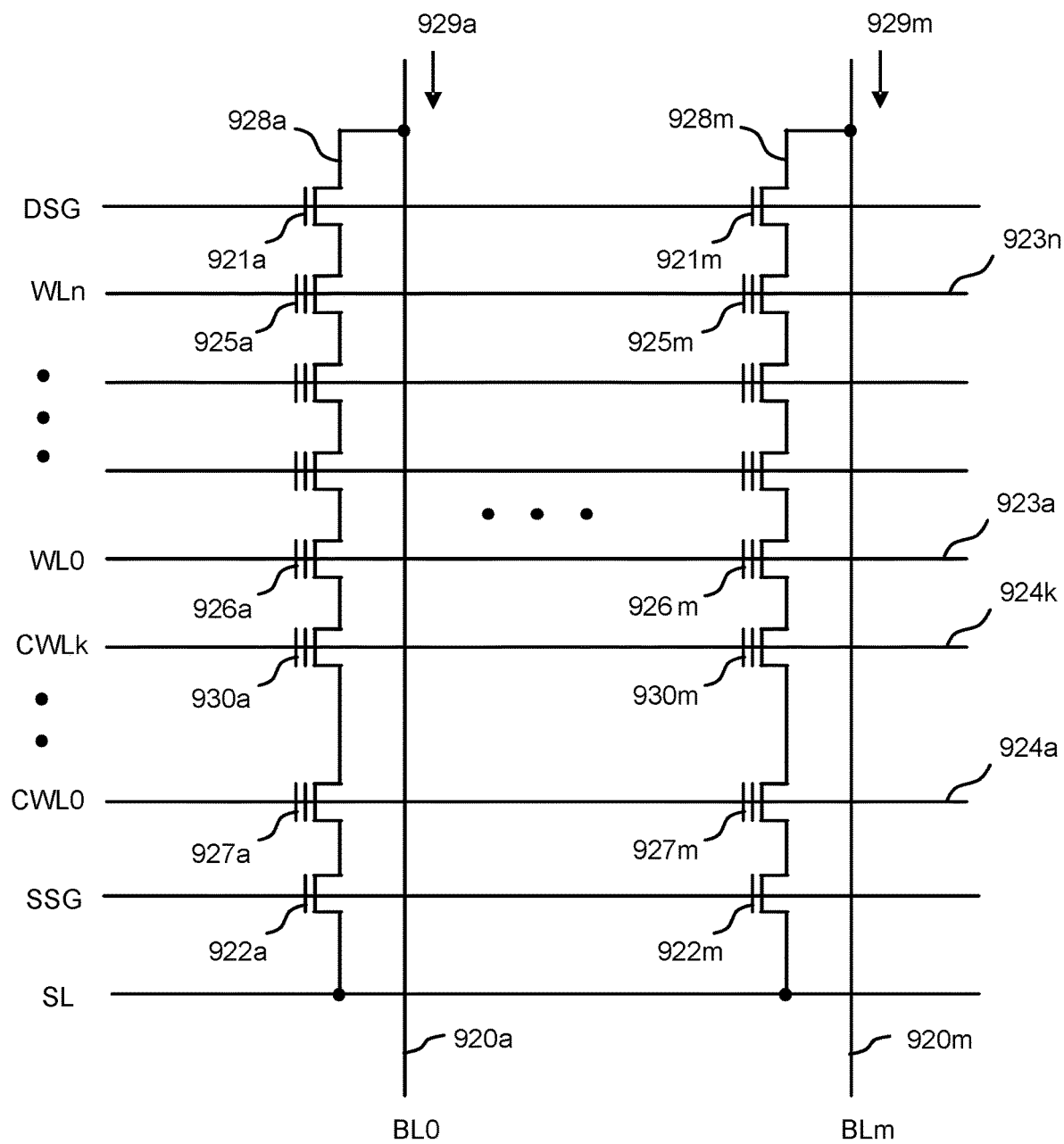

FIG. 19B shows another embodiment that utilizes the compensate word line in accordance with the invention. In this embodiment, the strings include multiple compensate word lines, CWL0 to CWLk, as shown (924*a*) to (924*k*). Each compensate word line can be used to compensate a certain number of the word lines (923*a*) to (923*n*). For example, it will be assumed that the strings have 128 word lines (923*a*) to (923*n*) and 4 compensate word lines (924*a*) to (924*k*). This allows each compensate word line to compensate the discharging current of 32 word lines. In another embodiment, the compensate word lines (924*a*) to (924*k*) can be sequentially programmed to compensate the discharging current during the program operations.

Figure 20:
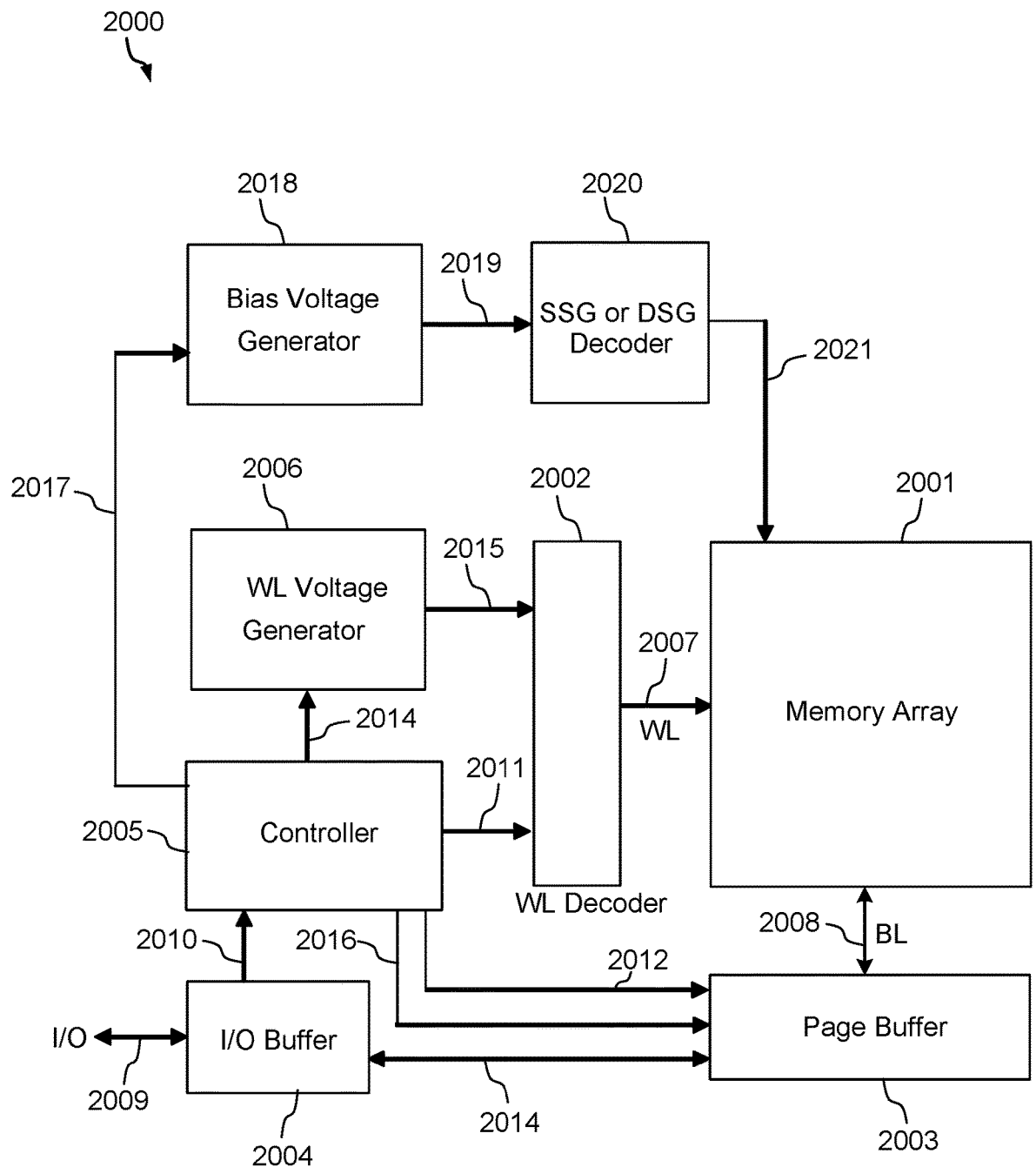
FIG. 20 shows an exemplary embodiment of a block diagram of a NAND flash memory chip constructed in accordance with the invention.

FIG. 20 shows an exemplary embodiment of a block diagram of a NAND flash memory chip (2000) constructed in accordance with the invention. The chip (2000) comprises a memory array (2001) that contains multiple NAND flash memory cell strings, as also shown in FIG. 4A. The cell strings are connected to multiple word lines (2007) and multiple bit lines (2008). The word lines (2007) and bit lines (2008) are connected to a word decoder (2002) and a page buffer block (2003), respectively. The page buffer block (2003) contains multiple page buffer circuits, as also shown in FIG. 2.

An I/O buffer (2004) receives addresses from the I/O bus (2009) and sends the addresses (2010) to a controller (2005). The controller (2005) comprises control logic, timer, address counter, state machine, and/or any other suitable hardware and/or firmware suitable to generate the signals described herein. The I/O buffer (2004) also transfers input data (2014) from the I/O bus (2009) to the page buffer (2003) during program operation, and output data (2014) from the page buffer (2003) to the I/O bus (2009) during read operation.

The controller (2005) sends the word line address (2011) to the word line decoder (2002) and the bit line address (2012) to the page buffer block (2003) to select the word line and bit line, respectively. The controller (2005) also send the control signals (2014) to a word line voltage generator (2006). In an embodiment, the word line voltage generator (2006) comprises a charge pump circuit to generate high voltages for program, erase, and read operations. The word line voltage generator (2006) also comprises a voltage regulator to generate the different word line voltages VR1 to VR7 shown in FIGS. 3A-B for the read operations according to the embodiments. The word line voltages (2015) are sent to the word line decoder (2002) and applied to the selected word line of the memory array (2001).

The controller (2005) also sends the control signals (2016) to the page buffer (2003) to control the pre-charging of the bit lines and the enabling/disabling of sense amplifiers and generating the latching signals, such as LAT0-6, as shown in FIGS. 3A-B, to latch the data. The controller (2005) also sends control signals (2017) to a bias voltage generator (2018). During read operation, the bias voltage generator (2018) is activated to generate a bias voltage (2019). The bias voltage (2019) is sent to a SSG or DSG decoder (2020), and then sent to the selected SSG or DSG (2021) to control the bit line discharging current, as shown in FIGS. 4G-H.

As illustrated in FIG. 20, a NAND flash memory device is provided that comprises strings of memory cells that are coupled to bit lines and word lines. The memory device also comprises a controller configured to perform operations of: precharging a plurality of the bit lines to a precharge voltage level; applying a sequence of word line voltages to a selected word line; initiating discharge of one or more bit lines associated with one or more cells, respectively, wherein discharge of a selected bit line is initiated when a cell associated with the bit line is turned on when a selected word line voltage is higher than a threshold voltage (Vt) of the associated cell; controlling discharging current of discharging bit lines to achieve identical discharge rates; waiting for a discharging time period for each bit line that is discharging; and latching bit line data at an end of each discharge time period. Thus, the memory chip (2000) is configured to generate all the control signals, word line and bit line voltages, and precharge signals to enable novel memory operations as described herein.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A method for reading a NAND flash memory, wherein the NAND flash memory comprises strings of memory cells that are coupled to bit lines and word lines, the method comprising:
   precharging a plurality of bit lines to a precharge voltage level;
   applying a sequence of word line voltages to a selected word line;
   initiating discharge of one or more bit lines associated with one or more cells, respectively, wherein discharge of a selected bit line is initiated when its associated cell is turned on when a selected word line voltage is higher than a threshold voltage (Vt) of the associated cell;
   controlling discharging current of discharging bit lines to achieve identical discharge rates;
   waiting for a discharging time period for each bit line that is discharging; and
   latching bit line data at an end of each discharge time period.

2. The method of claim 1, wherein an operation of applying comprises applying the sequence of word line voltages as a sequence of increasing voltage levels.

3. The method of claim 1, wherein an operation of applying comprises applying the sequence of word line voltages as sequence of decreasing voltage levels.

4. The method of claim 1, wherein an operation of applying comprises applying the sequence of word line voltages as a ramping voltage that ramps from a first word line voltage to a last word line voltage.

5. The method of claim 1, wherein each discharge time period is defined from a start time when a selected bit line begins to discharge to an end time when the selected bit line discharges to a trip voltage level.

6. The method of claim 5, wherein a difference between the precharge voltage level and the trip voltage level is divided by a selected discharge time period to determine a discharge rate for a particular bit line.

7. The method of claim 6, wherein the discharge rates for all bit lines are substantially the same.

8. The method of claim 1, further comprising adjusting discharge current for one or more bit lines to produce discharge rates that are substantially the same.

9. The method of claim 1, further comprising applying a bias voltage to a source select gate of a string to control the discharging current.

10. The method of claim 1, further comprising applying a bias voltage to a drain select gate of a string to control the discharging current.

11. The method of claim 1, further comprising applying a bias voltage to one or more cells of a string to control the discharging current.

12. The method of claim 1, further comprising programming a (Vt) of one or more of the cells to control the discharging current.

13. A NAND flash memory comprising:
   strings of memory cells that are coupled to bit lines and word lines; and
   a controller configured to perform operations of:
      precharging a plurality of the bit lines to a precharge voltage level;
      applying a sequence of word line voltages to a selected word line;
      initiating discharge of one or more bit lines associated with one or more cells, respectively, wherein discharge of a selected bit line is initiated when a cell associated with the bit line is turned on when a selected word line voltage is higher than a threshold voltage (Vt) of the associated cell;
      controlling discharging current of discharging bit lines to achieve identical discharge rates;
      waiting for a discharging time period for each bit line that is discharging; and
      latching bit line data at an end of each discharge time period.

14. The memory of claim 13, wherein the controller applies the sequence of word line voltages as a sequence of increasing voltage levels, and wherein each level is maintained for a selected time duration.

15. The memory of claim 13, wherein the controller applies the sequence of word line voltages as sequence of decreasing voltage levels.

16. The memory of claim 13, wherein the controller applies the sequence of word line voltages as a ramping voltage that ramps from a first word line voltage to a last word line voltage.

17. The memory of claim 13, wherein the controller applies a bias voltage to one of a source gate or drain select gate of a string to control the discharging current.

18. The memory of claim 13, wherein the controller applies a bias voltage to one or more cells of a string to control the discharging current.

19. The memory of claim 13, wherein the controller programs a (Vt) of one or more of the cells to control the discharging current.

20. A method for reading a NAND flash memory, wherein the NAND flash memory comprises strings of memory cells that are coupled to bit lines and word lines, the method comprising:
   precharging a plurality of bit lines to a precharge voltage level;
   applying a sequence of voltages on a selected word line to initiate discharging of one or more bit lines;
   controlling discharging current of discharging bit lines to achieve identical discharge rates; and
   latching bit line data of each discharging bit line at an end of a discharge time period.

* * * * *